US012276909B2

(12) United States Patent
Toukhy et al.

(10) Patent No.: US 12,276,909 B2
(45) Date of Patent: Apr. 15, 2025

(54) NOVOLAK/DNQ BASED, CHEMICALLY AMPLIFIED PHOTORESIST

(71) Applicant: Merck Patent GmbH, Darmstadt (DE)

(72) Inventors: Medhat A. Toukhy, Flemington, NJ (US); Weihong Liu, Branchburg, NJ (US); Takanori Kudo, Bedminster, NJ (US); Hung-Yang Chen, Somerset, NJ (US); Jian Yin, Bridgewater, NJ (US)

(73) Assignee: Merck Patent GmbH, Darmstadt (DE)

( * ) Notice: Subject to any disclaimer, the term of this patent is extended or adjusted under 35 U.S.C. 154(b) by 834 days.

(21) Appl. No.: 17/056,773

(22) PCT Filed: May 22, 2019

(86) PCT No.: PCT/EP2019/063216
§ 371 (c)(1),
(2) Date: Nov. 19, 2020

(87) PCT Pub. No.: WO2019/224248
PCT Pub. Date: Nov. 28, 2019

(65) Prior Publication Data
US 2021/0382390 A1    Dec. 9, 2021

Related U.S. Application Data

(60) Provisional application No. 62/675,939, filed on May 24, 2018.

(51) Int. Cl.
| | |
|---|---|
| *G03F 7/023* | (2006.01) |
| *C08G 59/14* | (2006.01) |
| *C09D 163/04* | (2006.01) |
| *G03F 7/022* | (2006.01) |
| *G03F 7/30* | (2006.01) |
| *G03F 7/38* | (2006.01) |

(52) U.S. Cl.
CPC ......... *G03F 7/023* (2013.01); *C08G 59/1477* (2013.01); *C09D 163/04* (2013.01); *G03F 7/0226* (2013.01); *G03F 7/0236* (2013.01); *G03F 7/30* (2013.01); *G03F 7/38* (2013.01)

(58) Field of Classification Search
CPC ...... G03F 7/0226; G03F 7/0236; G03F 7/023; G03F 7/38
See application file for complete search history.

(56) References Cited

U.S. PATENT DOCUMENTS

| | | |
|---|---|---|
| 4,015,986 A | 4/1977 | Paal et al. |
| 5,529,880 A | 6/1996 | Zampini et al. |
| 5,714,559 A | 2/1998 | Schacht et al. |
| 5,858,605 A | 1/1999 | Sinta et al. |
| 5,942,367 A * | 8/1999 | Watanabe ............ G03F 7/0045 430/326 |
| 6,051,370 A | 4/2000 | Kim |
| 6,461,886 B1 | 10/2002 | Uehara et al. |
| 6,475,694 B2 * | 11/2002 | Doi ....................... G03F 7/0236 430/192 |
| 6,485,895 B1 | 11/2002 | Choi et al. |
| 6,803,176 B2 | 10/2004 | Choi et al. |
| 6,861,208 B2 | 3/2005 | Benson et al. |

(Continued)

FOREIGN PATENT DOCUMENTS

| | | |
|---|---|---|
| CN | 1875323 A | 12/2006 |
| CN | 104781731 A | 7/2015 |

(Continued)

OTHER PUBLICATIONS

International Preliminary Report on Patentability and Written Opinion received for PCT Patent Application No. PCT/EP2019/063216, mailed on Dec. 3, 2020, 8 pages.
International Search Report and Written Opinion received for PCT Patent Application No. PCT/EP2019/063216 mailed on Sep. 12, 2019, 14 pages.
Bantu et al., "Design and Process of a New Duv ARCH3 Resist", SPIE, vol. 3049, Jul. 7, 1997, pp. 323-337.

(Continued)

Primary Examiner — John S. Chu
(74) Attorney, Agent, or Firm — EMD Performance Materials Corp.

(57) ABSTRACT

The present invention relates to resist compositions comprising a polymer component, a photoacid generator component (PAG), a photoactive diazonaphthoquinone component (PAC), a base component, a solvent component, and optionally, a heterocyclic thiol component. The polymer component is a Novolak derivative, comprising Novolak repeat units with free phenolic hydroxy moieties, and Novolak repeat units comprising phenolic hydroxy moieties protected with an acid cleavable acetal moiety. The acetal moiety is elected from a mono functional alkyl acetal moiety protecting a repeat unit comprising a Novolak phenolic hydroxy moiety, an acetal, comprising a moiety functionalized with a PAC moiety, protecting a repeat unit comprising a Novolak phenolic hydroxy moiety; a di-functional acetal comprising moiety, linking and protecting two repeat units comprising Novolak phenolic hydroxy moieties, forming a linking point in said polymer component between two different polymer chains in said polymer component, and a mixture of any of these three types of acid cleavable acetal moieties. The PAC component is selected from said acetal, comprising a moiety functionalized with a PAC moiety, protecting a repeat unit comprising a Novolak phenolic hydroxy moiety, a free PAC component, and a mixture of these two types of PAC components. The present invention also relates to the methods of using the present compositions in either in thick or thin film photoresist device manufacturing methodologies.

17 Claims, 5 Drawing Sheets

(56) References Cited

U.S. PATENT DOCUMENTS

| | | |
|---|---|---|
| 7,255,972 B2 | 8/2007 | Nishiwaki et al. |
| 8,715,918 B2 | 5/2014 | Toukhy et al. |
| 8,841,062 B2 | 9/2014 | Liu et al. |
| 9,765,175 B2 | 9/2017 | Imada et al. |
| 10,108,091 B2 | 10/2018 | Sato |
| 2003/0134223 A1 | 7/2003 | Katano et al. |
| 2004/0197696 A1 | 10/2004 | Eilbeck |
| 2007/0072109 A1 | 3/2007 | Makii et al. |
| 2008/0182204 A1 | 7/2008 | Calvert et al. |
| 2011/0008735 A1* | 1/2011 | Ohsawa ............ G03F 7/0397 430/326 |
| 2015/0301452 A1 | 10/2015 | Park et al. |
| 2016/0017083 A1 | 1/2016 | Imada et al. |
| 2016/0177020 A1 | 6/2016 | Imada et al. |
| 2016/0291468 A1 | 10/2016 | Sato |

FOREIGN PATENT DOCUMENTS

| | | |
|---|---|---|
| CN | 105190439 A | 12/2015 |
| CN | 105555820 A | 5/2016 |
| CN | 105849637 A | 8/2016 |
| EP | 0447868 A1 | 9/1991 |
| EP | 1614005 A2 | 1/2006 |
| EP | 1688793 A1 | 8/2006 |
| JP | H04-219757 A | 8/1992 |
| JP | H05-219757 A | 8/1993 |
| JP | 2001337456 A | 12/2001 |
| JP | 3638068 B2 * | 4/2005 |
| JP | 2008-046594 A | 2/2008 |
| WO | 2019/224248 A1 | 11/2019 |

OTHER PUBLICATIONS

Lee et al., "Chemically Amplified i-Line Positive Resist for Next-Generation Flat Panel Display", Proceedings of SPIE, vol. 10146, 2017, pp. 1-7.

Toukhy et al., "Chemically Amplified Resist Technology For i-Line Applications", SPIE, vol. 3333, 1998, pp. 1212-1217.

Yabu et al., "High-Resolution Technology for FPD Manufacturing", Journal of the Society for Information Display, 2015, pp. 246-252.

English translation of Chinese Office Action, Application No. 201980034950.7, issued Jul. 21, 2021.

* cited by examiner

In which D =H or a moiety selected from [structures] or [structures]

wherein at least one D in a given PAC is not H.

NOVOLAK/DNQ BASED, CHEMICALLY AMPLIFIED PHOTORESIST

This application is a national stage application, filed under 35 U.S.C. § 371, of International Patent Application No. PCT/EP2019/063216, filed on May 22, 2019, which claims the benefit of U.S. Provisional Patent Application No. 62/675,939, filed May 24, 2018, each of which applications is incorporated herein by reference in their entirety.

FIELD OF INVENTION

The field of the invention pertains to a positive radiation-sensitive aqueous base soluble photoresist composition used for making integrated circuit (IC), light emitting diode (LED) devices, and display devices.

BACKGROUND

Photoresist compositions are used in microlithographic processes for making miniaturized electronic components such as in the fabrication of computer chips, integrated circuits, light emitting diode (LED) devices and displays. Generally, in these processes, a film of a photoresist composition is first applied to a substrate material, such as silicon wafers used for making integrated circuits. The coated substrate is then baked to evaporate solvent in the photoresist composition and to fix the coating onto the substrate. The baked, coated surface of the substrate is next subjected to an image-wise exposure to imaging radiation.

This radiation exposure causes a chemical transformation in the exposed areas of the coated surface. Visible light, ultraviolet (UV) light, electron beam and X-ray radiant energy are imaging radiation types commonly used today in microlithographic processes. After this image-wise exposure, the coated substrate is treated with a developer solution to dissolve and remove either the radiation-exposed or the unexposed areas of the coated surface of the substrate.

There are two types of photoresist compositions, negative-working and positive-working. When positive-working photoresist compositions are exposed image-wise to radiation, the areas of the resist composition exposed to the radiation become more soluble to a developer solution (e.g. release of base solubilizing group or photo-decomposition of dissolution inhibitor), while the unexposed areas of the photoresist coating remain relatively insoluble to such a solution. Thus, treatment of an exposed positive-working resist with a developer causes removal of the exposed areas of the photoresist coating and the creation of a positive image in the coating, thereby uncovering a desired portion of the underlying substrate surface on which the photoresist composition was deposited.

The use of a positive-working, sensitive photoresist composition which is developable by aqueous base is known in the prior art. Most of such prior art pertains either to either chemically amplified photoresist based on either phenolic or (meth)acrylate resin, or non-chemically amplified photoresists based on Novolak/diazonaphthoquinone. In Novolak/diazonaphthoquinone photoresist a positive image is formed through the photodecomposition of the diazonaphthoquinone compound (PAC) which in resist areas exposed leads to a faster dissolution of the Novolak resin in aqueous base, these types of photoresists are employed at longer UV wavelengths such with i-line (365 nm), and were for many years workhorse photoresists in the manufacturing of integrated circuits (IC).

In chemically amplified positive photoresist a base soluble resin, usually a phenolic resin or (meth)acrylate resin, is released in areas of the resist exposed to radiation, rendering it aqueous base developable, by an acid catalyzed cleavage of protecting groups on these resins, originally masking the base solubilizing moieties. In these chemically amplified photoresists, the catalytic acid is formed by photo-decomposition of photo-acid generator (PAG) component. These types of resists are typically employed at shorter wavelengths in quest for higher resolution in the manufacture of IC's.

For thick film applications, conventional (diazonaphthoquinone) DNQ/Novolak resist platform produce sloped profiles, particularly at thicker films due to their high film absorption. Positive chemically amplified (CA) platforms, on the other hand can provide adequate performance over 5-10μ film thickness, however the polymer conventionally used for these resists, are much more expensive than conventional Novolak resins. Also, certain designs for positive chemically amplified resists which require a post exposure bake may have a deleteriously effect on IC device throughput. Cost and device throughput are also an issue for applications pertaining to the manufacture of displays, however, here the thickness requirements for resists in this application are lower (1 to 3 μm). The potential effect on device throughput issue occurs in certain chemically amplified resists in which the protecting group, masking the base solubilizing moiety, have a high activation energy acid for their cleavage, in order unmask the base solubilizing moiety. Thus although, these high activation energy groups are removable catalytically by acid, this removal requires a post exposure bake step, which is time consuming. Also, in high activation energy, positive chemically amplified resist, there is also an issue with sensitivity to airborne base contamination, associated with this design. This is since in order to have good resolution these resists have a high degree of non-linearity between the extent of cleavage of the high activation energy group and dissolution of an exposed resist film. Thus, even a small depletion of acid at the surface after exposure, will in the delay time between exposure and bake case a lower degree of deprotection of these groups at the surface which will manifest itself as an insoluble resist surface layer. This is post-exposure delay effect is called T-topping because of the resulting positive images formed have a large undesirable T-shape, which causes defects in manufacturing, and lower device yields.

NEEDS ADDRESSED AND PROBLEMS SOLVED BY CURRENT INVENTION

One objective of this invention is to provide a cost competitive, resist system based on a hybrid between conventional chemically amplified systems and a Novolak diazonaphthoquinone which may be employed either in relatively thin film (1 to 2 μm) applications in the manufacture of displays, but is also flexible enough to be used in thick film applications (3-10 μm).

This invention describes a novel resist which is a hybrid between a conventional Novolak/DNQ resist and a chemically amplified resist. Specifically, this hybrid is one in which Novolak polymer has its phenol functional groups partially blocked with an acetal group. This type of acetal polymer is produced by reacting both the Novolak and DNQ compound for instance with a mono-vinyl ether and/or di-vinylether (DVE) at low temperature. Additionally, in one variation of this novel hybrid resist system the acetal derived from a mono-vinyl ether protecting group may be functionalized with a DNQ moiety whose functionalization attachment point may either be through a non-acid sensitive linking group or through a second acid cleavable acetal moiety.

In some variations for thick film applications, these novel hybrids may incorporate low levels of DNQ down to ~4 wt. %. In these applications such variations ensure low absorption of UV light in the resist film giving, these hybrid systems, utility in low thickness application, such as in the manufacture in IC devices requiring thick films. Specifically, conventional DNQ resist typically contain 17-30% DNQ to obtain sufficient dissolution inhibition and contrast. Thus, standard Novolak/DNQ resist have an absorption per μm much higher than in the novel hybrid system described herein. Thus, while standard Novolak/DNQ undergo bleaching of the DNQ photoactive moiety (PAC), this bleaching is insufficient in thick film application, resulting in the PAC remaining unbleached to a large extent deeper into the thick film. This causes resist profiles to have sloped or scummed profiles, deleteriously affecting device yields. Also, in the novel hybrid resist system, described herein, the amount of acetal protection used is relatively low when using a divinyl ether protecting group approach (e.g. less than 7 moles % protection of the total phenol moieties in the Novolak is required. Thus, for thick film applications this new platform provides high inhibition system using much lower levels of DNQ with low absorption, and lower protection group % protection compared to conventional chemically amplified systems. Consequently, the thick film embodiment of this invention by providing resist images with straight wall profiles solves the problem of sloping profiles which occur in conventional Novolak/DNQ systems.

In display applications, requiring a thinner resist film, the novel hybrid resist systems described herein may be formulated with Novolaks having more monovinyl ether protection, and higher amounts of DNQ PAC, as absorbance is not as crucial. Advantageously, this approach provides for thin film photoresists which have high resolution, contrast, but which do not require a post exposure bake (PEB), increasing manufacturing throughput and reducing the possibility of deleterious post exposure delay effects such as formation of featuring having a large extent of T-topping. Although not bound by theory, a PEB may not be required, because the low activation energy acetal protecting groups, coupled with the thinner films in these applications, may help in assuring that the resist film in exposed areas, is fully deprotected during the exposure phase, removing the necessity of a such a bake. Also, since the acetal groups undergo deprotection during exposure, there is no time lag between generation of photo-acid from a photoacid generator (PAG) and reaction of this photo-acid to deprotect the acetal. Thus, this deprotection during exposure, may decrease the opportunity for advantageous airborne contaminant to consume photo acid at exposed resist surfaces, avoiding post-exposure delay effects in thin film resists such as severe T-topping of imaged resist features. This is an important problem to solve as severe T-topping of imaged resist features can device yield. Also, being able to forgo the PEB in the inventive thin film embodiments of this invention allows for solving the problem of increase device throughput by decreasing processing time.

Finally, in either the thick film or thin film variations of this novel hybrid resist system these are low cost resist platforms that are simple to prepare, directly, without polymer extraction or isolation after the reaction.

SUMMARY OF THE INVENTION

The present invention pertains to chemically amplified resist compositions comprising the following,
  a polymer component,
  a photoacid generator component (PAG);
  a base component,
  a photoactive diazonaphthoquinone compound (PAC) component;
  a base component,
  a solvent component, and optionally,
  a heterocyclic thiol component.

The polymer component is a Novolak derivative, comprising the following,
  Novolak repeat units with free phenolic hydroxy moieties, and
  Novolak repeat units comprising phenolic hydroxy moieties protected with an acid cleavable acetal moiety.

The acid cleavable acetal moiety is selected from the group consisting of the following,
  a monofunctional alkyl acetal moiety protecting a repeat unit comprising a Novolak phenolic hydroxy moiety;
  an acetal, comprising a moiety functionalized with a PAC moiety, protecting a repeat unit comprising a Novolak phenolic hydroxy moiety;
  a di-functional acetal comprising moiety, linking and protecting two repeat units comprising Novolak phenolic hydroxy moieties, forming a linking point in said polymer component between two different polymer chains in said polymer component, and;
  a mixture of any of these three types of acid cleavable acetal moieties.

The PAC component, is selected from the group consisting of the following
  said acetal comprising moiety functionalized with a PAC moiety protecting a repeat unit comprising a Novolak phenolic hydroxy moiety;
  a free PAC component,
  and a mixture of these two types of PAC components.

The invention also pertains to the method of coating said composition on a substrate and using said composition as photoresists.

DETAILED DESCRIPTION

Figure 1:
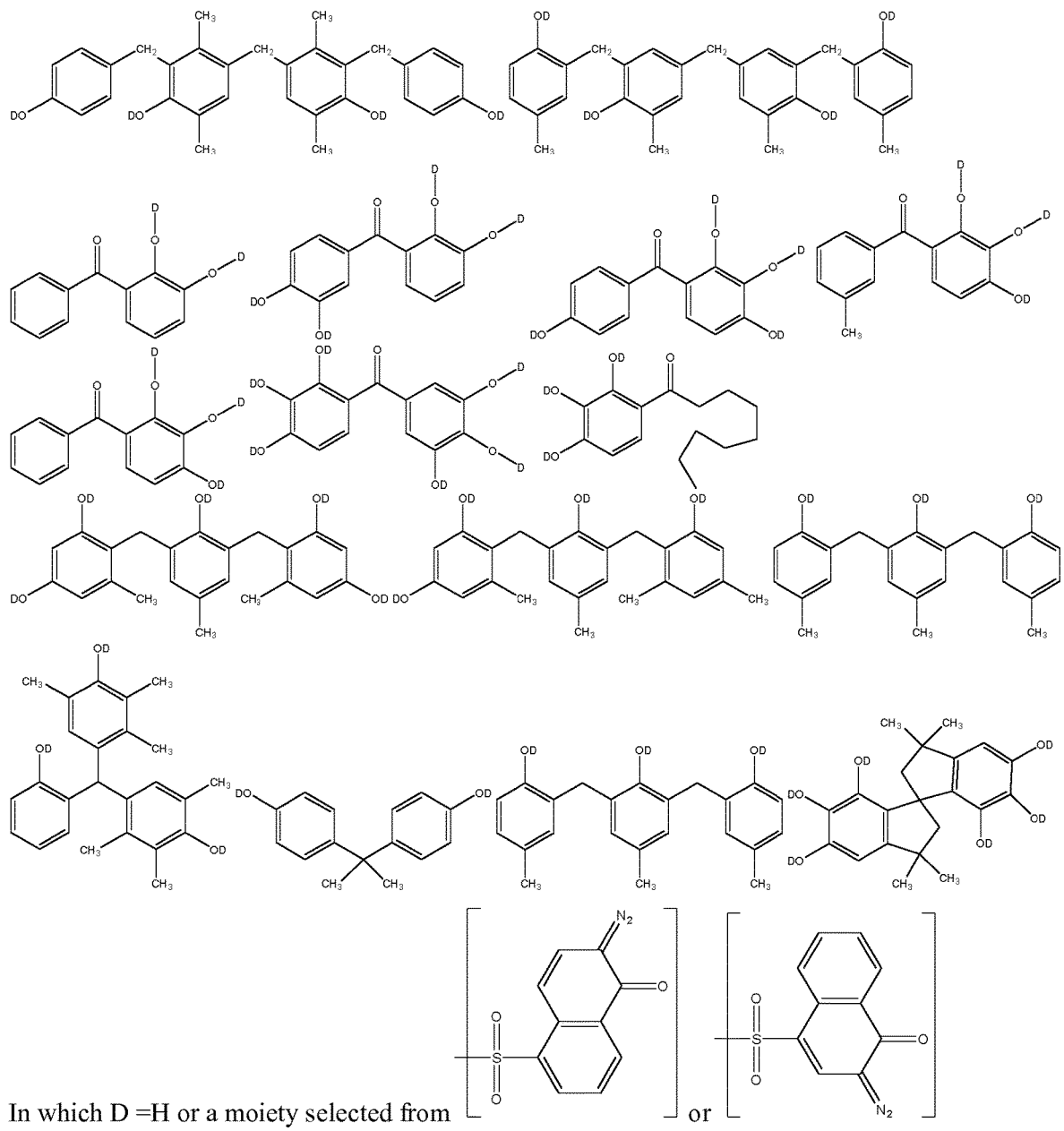
FIG. 1 Shows non-limiting examples of DNQ PAC compounds which may be used a free PAC component and/or be used to form an PACb moiety attached the polymer component on a phenolic moiety through an acetal comprising linking group.

It is to be understood that both the foregoing general description and the following detailed description are illustrative and explanatory, and are not restrictive of the subject matter, as claimed. In this application, the use of the singular includes the plural, the word "a" or "an" means "at least one", and the use of "or" means "and/or", unless specifically stated otherwise. Furthermore, the use of the term "including", as well as other forms such as "includes" and "included", is not limiting. Also, terms such as "element" or "component" encompass both elements and components comprising one unit and elements or components that comprise more than one unit, unless specifically stated otherwise. As used herein, the conjunction "and" is intended to be inclusive and the conjunction "or" is not intended to be exclusive unless otherwise indicated. For example, the phrase "or, alternatively" is intended to be exclusive. As used herein, the term "and/or" refers to any combination of the foregoing elements including using a single element.

The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated literature and similar materials defines a term in a manner that contradicts the definition of that term in this application, this application controls.

Herein, the term "linking point," when referring to any of the inventive polymers refers to a branching point to another polymer chain and/or a crosslinking point to another polymer chain, wherein the extent of branching and/or crosslinking is such that the resultant branched and/or crosslinked polymer still has a molecular weight sufficiently low so as to avoid reaching the gel point where the polymer would become insoluble in solvents such as spin-casting solvents.

Herein, unless otherwise indicated, alkyl refers to hydrocarbon groups which can be linear, branched (e.g. methyl, ethyl, propyl, isopropyl, tert-butyl and the like) or cyclic (e.g. cyclohexyl, cyclopropyl, cyclopentyl and the like) multicyclic (e.g. norbornyl, adamanty and the like). These alkyl moieties may be substituted or unsubstituted as described below. The term alkyl refers to such moieties with C-1 to C-20 carbons. It is understood that for structural reasons linear alkyls start with C-1, while branched alkyls and cyclic alkyls start with C-3 and multicyclic alkyls start with C-5. Moreover, it is further understood that moieties derived from alkyls described below such as alkyloxy, haloalkyloxy have the same carbon number ranges unless otherwise indicated. If the length of the alkyl group is specified as other than described above, the above described definition of alkyl still stands with respect to it encompassing all types of alkyl moieties as described above and that the structural consideration with regards to minimum number of carbon for a given type of alkyl group still apply.

Alkyloxy (a.k.a. Alkoxy) refers to an alkyl group as defined above on which is attached through an oxy (—O—) moiety (e.g. methoxy, ethoxy, propoxy, butoxy, 1,2-isopropoxy, cyclopentyloxy cyclohexyloxy and the like). These alkyloxy moieties may be substituted or unsubstituted as described below.

Halo or halide refers to a halogen, F, Cl, Br, I which is linked by one bond to an organic moiety.

Haloalkyl refers to a linear, cyclic or branched saturated alkyl group such as defined above in which at least one of the hydrogens has been replaced by a halide selected from the group consisting of F, Cl, Br, I or mixture of these if more than one halo moiety is present. Fluoroalkyls are a specific subgroup of these moieties.

Fluoroalkyl refers to a linear, cyclic or branched saturated alkyl group as defined above in which the hydrogens have been replaced by fluorine either partially or fully (e.g. trifluoromethyl, pefluoroethyl, 2,2,2-trifluoroethyl, prefluoroisopropyl, perfluorocyclohexyl and the like). These fluoroalkyl moieties, if not perfluorinated, may be substituted or unsubstituted as described below.

Fluoroalkyloxy refers to a fluoroalkyl group as defined above on which is attached through an oxy (—O—) moiety it may be completed fluorinated (a.k.a. perfluorinated) or alternatively partially fluorinated (e.g. trifluoromethyoxy, perfluoroethyloxy, 2,2,2-trifluoroethoxy, perfluorocyclohexyloxy and the like). These fluoroalkyl moieties, if not pefluorinated may, be substituted or unsubstituted as described below.

Herein when referring to an alkyl, alkyloxy, fluoroalkyl, fluoroalkyloxy moieties with a possible range of carbon atoms which starts with C-1 such as for instance "C-1 to C-20 alkyl," or "C-1 to C-20 fluoroalkyl," as non-limiting examples, this range encompasses linear alkyls, alkyloxy, fluoroalkyl and fluoroalkyloxy starting with C-1 but only designated branched alkyls, branched alkyloxy, cycloalkyl, cycloalkyloxy, branched fluoroalkyl, and cyclic fluoroalkyl starting with C-3.

Herein the term alkylene refers to hydrocarbon groups which can be a linear, branched or cyclic which has two or more attachment points (e.g. of two attachment points: methylene, ethylene, 1,2-isopropylene, a 1,4-cyclohexylene and the like; of three attachment points 1,1,1-substituted methane, 1,1,2-substituted ethane, 1,2,4-substituted cyclohexane and the like). Here again, when designating a possible range of carbons, such as C-1 to C-20, as a non-limiting example, this range encompasses linear alkylenes starting with C-1 but only designates branched alkylenes, or cycloalkylene starting with C-3. These alkylene moieties may be substituted or unsubstituted as described below.

The term mono and oligomeric alkyleneoxyalkylene encompasses both simple alkyleneoxyalkylene moiety such as ethyleneoxyethylene (—CH$_2$—CH$_2$—O—CH$_2$—CH$_2$—), propyleneoxypropylene (—CH$_2$—CH$_2$—CH$_2$—O—CH$_2$—CH$_2$—CH$_2$—), and the like, and also oligomeric materials such as tri(ethyleneoxyethylene) (—CH$_2$—CH$_2$—O—CH$_2$—CH$_2$—O—CH$_2$—CH$_2$—), tri(propyleneoxypropylen), (—CH$_2$—CH$_2$—CH$_2$—O—CH$_2$—CH$_2$—CH$_2$—OCH$_2$—CH$_2$—CH$_2$—), and the like.

Herein the term Aryl or aromatic groups refers to such groups which contain 6 to 24 carbon atoms including phenyl, tolyl, xylyl, naphthyl, anthracyl, biphenyls, bisphenyls, tris-phenyls and the like. These aryl groups may further be substituted with any of the appropriate substituents e.g. alkyl, alkoxy, acyl or aryl groups mentioned hereinabove.

The term Novolak if used herein without any other modifier of structure, refers to Novolak resins which are soluble in aqueous bases such as tetramethylammonium hydroxide and the like.

Herein the term arylene refers to a aromatic hydrocarbon moiety which has two or more attachment points (e.g. 2-5), this moiety may be a single benzene moiety (e.g. two attachment points 1,4-phenylene, 1,3-phenylene and 1,2-phenylene; three attachment points 1,2,4-substituted benzene, 1,3,5-substituted benzene and the like), a polycyclic aromatic moiety with two attachment points such derived from naphthalene, anthracene, pyrene and the like, or a multiple benzene rings in a chain which have two attachment point (e.g. biphenylene). In those instance, where the aromatic moiety is a fused aromatic ring, these may be called fused ring arylenes, and more specifically named, for instance, naphthalenylene, anthracenylene, pyrenylene, and the like. Fused ring arylenes may be substituted or unsubstituted as described below, additionally these fused ring arylenes may also contain a hydrocarbon substituent which has two attachment sites on the fused ring forming an additional aliphatic or unsaturated ring forming by attachment to the fused ring a ring having 5-10 carbon atoms.

Herein, the term "PAG," unless otherwise described, refers to a photoacid generator that can generate acid (a.k.a. photoacid) under deep UV or UV irradiation such as 200-300 nm, i-line, h-line, g-line and/or broadband irradiation. The acid may be a sulfonic acid, HCl, HBr, $HAsF_6$, and the like.

Herein, the term PAC, refers to a diazonaphthoquinone component wherein this moiety is further substituted with a sulfonyl moiety ($—SO_2—$) is attached to a phenolic compound through a sulfonate ester ($—SO_2—O—$) bound. The phenolic compound forming this sulfonate ester bound may be with a phenolic compound substituted with more than one phenolic OH moiety, and consequently, the PAC may be such a phenolic compound wherein more than one of the phenol OH form this sulfonate bond. Non-limiting examples of these free PAC materials are described in "Diazonapthoquinone-based Resist, Ralph Dammel, SPIE, Optical Engineering Press, Volume TT 11, Chapters 2 and 3.

Herein the term fused aromatic ring refers to a carbon based polycyclic aromatic compound comprising 2-8 carbon based aromatic rings fused together (e.g. naphthalene, anthracene, and the like) these fused aromatic ring which may have a single attachment point to an organic moiety as part of an aryl moiety such as a pendant fused aromatic ring aryl group on a photoacid generator (PAG) or have two attachment points as part of an arylene moiety, such as, for instance, as in spacer in a substituent attached to a PAG. In PAG's, such substituents, along with other substituent that can interact by resonance delocalization, impart greater absorbance at 365 nm and/or broadband radiation and lead to more effective at these wavelengths.

Herein the term "arene," encompasses aromatic hydrocarbon moieties comprising 1 ring or 2-8 carbon based aromatic rings fused together.

Herein the term "heteroarene," refers to an arene which contains 1 or more trivalent or divalent heteroatoms respectively in such a way as to retain its aromaticity. Examples of such hetero atoms are N, O, P, and S. As non-limiting examples, such heteroarenes may contain from 1 to 3 such hetero atoms.

Unless otherwise indicated in the text, the term "substituted" when referring to an aryl, alkyl, alkyloxy, fluoroalkyl, fluoroalkyloxy, fused aromatic ring, arene, heteroarene refers to one of these moieties which also contain with one or more substituents, selected from the group consisting of unsubstituted alkyl, substituted alkyl, unsubstituted aryl, alkyloxyaryl (alkyl-O-aryl-), dialkyloxyaryl ((alkyl-O-)$_2$-aryl), haloaryl, alkyloxy, alkylaryl, haloalkyl, halide, hydroxyl, cyano, nitro, acetyl, alkylcarbonyl, formyl, ethenyl ($CH_2$=CH—), phenylethenyl (Ph-CH=CH—), arylethenyl (Aryl-CH=CH—), and substituents comprising ethenylenearylene moieties (e.g. Ar(—CH=CH—Ar—)$_z$ where z is 1-3. Specific, non-limiting examples of substituted aryl and substituted aryl ethenyl substituent are as follows, wherein ∿∿ represents the point of attachment:

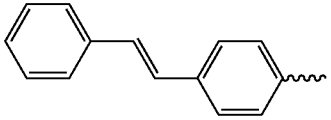

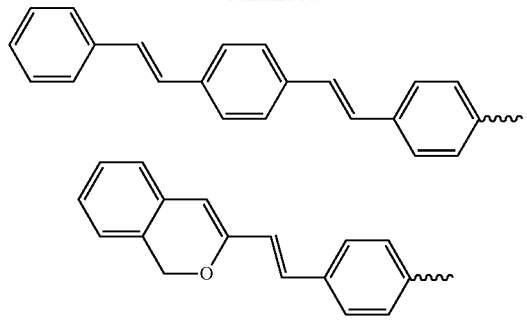

Otherwise, substituted aryl, and substituted ethenyls, where the substituent is selected from any of the above substituents. Similarly, the term "unsubstituted" refers to these same moieties, wherein no substituents apart from hydrogen is present.

The term "quencher system," refers to an assembly of basic components, such as amines, which in a resist formulation could act to capture an acid generated by a photoacid generator during exposure to i-line or broadband radiation.

The term "solid components," refers to components in a photoresist formulation which are not the solvent. Such components may be solids or liquids.

The phrase "a di-functional acetal comprising moiety, linking and protecting two repeat units comprising Novolak phenolic hydroxy moieties, forming a linking point in said polymer component between two different polymer chains in said polymer component," is meant to describe a di acetal junction between two Novolak polymer backbones that occurs when a difunctional acetal moiety is formed protecting two different phenolic hydroxy Novolak repeat units, as shown in the following structure, as a non-limiting example, wherein an organic di-functional spacer moiety "Spacer," links the two acetals moieties which comprise the di-functional acetal moiety linking two Novolak polymer chains, in this instance the moieties ∿∿ A and ∿∿ B designates attachment of this di-functional acetal moiety which links and protects a Novolak phenolic hydroxy moiety to a first Novolak polymer chain A to a second Novolak polymer chain B:

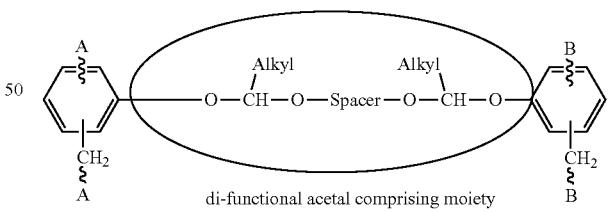

di-functional acetal comprising moiety

The phrase "an acetal, comprising a moiety functionalized with a PAC moiety, protecting a repeat unit comprising a Novolak phenolic hydroxy moiety; is meant to describe a mono acetal moiety which protect a hydroxy phenolic Novolak repeat unit in the following structures which is shown as a non-limiting example, wherein a linking moiety such as an direct valence bond, or an organic spacer group, links the acetal moiety to a photoactive diazonaphthoquinone compound, in this instance the moieties ∿∿ A designates the Novolak polymer chain which contains the repeat unit comprising the Novolak phenolic hydroxy moiety which is protected by this acetal comprising a moiety functionalized with a PAC moiety.

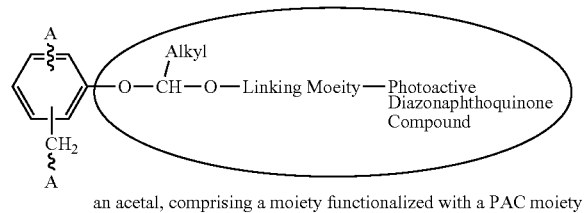

an acetal, comprising a moiety functionalized with a PAC moiety

General Embodiment of Inventive Resist Composition

The general embodiment of the present inventive resist compositions pertains to chemically amplified resist compositions comprising the following,
a polymer component,
a photoacid generator component (PAG);
a base component,
a photoactive diazonaphthoquinone compound (PAC) component;
a base component,
a solvent component, and optionally,
a heterocyclic thiol component.

In the above general embodiment of this inventive composition, the polymer component is a Novolak derivative, comprising the following,
Novolak repeat units with free phenolic hydroxy moieties, and
Novolak repeat units comprising phenolic hydroxy moieties protected with an acid cleavable acetal moiety.

In the above general embodiment of this inventive composition, the acid cleavable acetal moiety is selected from the group consisting of the following,
a monofunctional alkyl acetal moiety protecting a repeat unit comprising a Novolak phenolic hydroxy moiety;
an acetal, comprising a moiety functionalized with a PAC moiety, protecting a repeat unit comprising a Novolak phenolic hydroxy moiety;
a di-functional acetal comprising moiety, linking and protecting two repeat units comprising Novolak phenolic hydroxy moieties, forming a linking point in said polymer component between two different polymer chains in said polymer component, and;
a mixture of any of these three types of acid cleavable acetal moieties.

In the above general embodiment of this inventive composition, the PAC component, is selected from the group consisting of the following,
said acetal comprising moiety functionalized with a PAC moiety protecting a repeat unit comprising a Novolak phenolic hydroxy moiety;
a free PAC component,
and a mixture of these two types of PAC components.

In different aspects of our inventive compositions, as described herein, the PAC component may be either be used as a free PAC compound, and/or may be a PACb moiety attached (grafted) to a phenolic moiety in a Novolak repeat unit through an acetal comprising linking group in the polymer component of this inventive compositions. In either instance this PAC component may be derived from a 1,2-diazonaphthouqinone-5-sulfonate moiety or a 1,2-diazonaphthoquinone-4-sulfonate moiety. FIG. 1 shows non-limiting examples of different DNQ PAC's, which may be used as free PAC component or alternatively be attached to the polymer component as a PACb moiety to the polymer component. In FIG. 1, the moiety D is H or a moiety selected from VIIIa and VIIIb, wherein in each compound depicted in this FIG. at least one D is either a moiety of structure VIIIa or VIIIb. As described herein the attachment to the DNQ-PAC to a polymer component through an acetal comprising moiety may be either through an ether bond, an acetal bond or a carbon-carbon bond.

In one embodiment of this invention the PACb moiety attached to the polymer component may be derived from DNQ PAC materials which originally contain at least one free phenol functional group, which becomes the attachment point for an acetal linking group to a phenolic repeat unit of the polymer component. As non-limiting examples the DNQ PAC's depicted in FIG. 1 may be used provided that at least one D moiety is H and at least one D moiety is a moiety selected from structures A or B. In one non-limiting example a PACb may be attached to the polymer through the reaction of a free phenol with a DNQ PAC to form an ether or acetal link with a acetal comprising linking moiety with the polymer. Alternatively, the acetal comprising linkage of a DNQ PAC in FIG. 1 to a polymer component may be a carbon-carbon bond with an aromatic ring in these DNQ PAC.

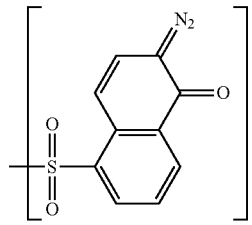

(VIIIa)

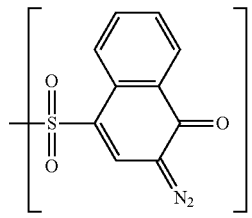

(VIIIb)

Polymer Component: Monofunctional Alkyl Acetal Protected Novolak Resins

In one embodiment of the novel composition said polymer component is one comprising repeat units having structures (I), and (II) (a.k.a. repeat unit with mono functional alkyl acetal), wherein Ra, and Rc are independently a C-1 to C-4 alkyl; Rb and Rd are, independently, a —X-Phenol, wherein X is —O—, —C(CH$_3$)$_2$—, —(C=O)— or —SO$_2$—, and na and nc, independently, are 0 to 3, nb and nd, independently, are 0 or 1, and the sum of na and nb or nd and nc, respectively, do not exceed 3. Further still in embodiment, said polymer is one where Re and Rf are independently selected from a C-1 to C-4 alkyl. Also, in this embodiment said PAC component is comprised of a free PAC.

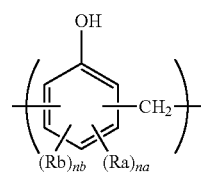

(I)

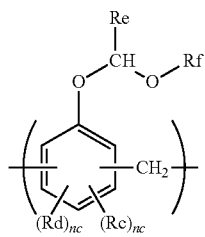

(II)

In another aspect of the above embodiment wherein the polymer component comprises repeat units of structures (I), and (II), the repeat unit having structure (I) is present from about 60 mole % to about 98 mole %; the repeat unit having structure (II) is present up to about 40 mole %.

In another aspect of the above embodiment wherein the polymer component comprises repeat units of structures (I), and (II), the repeat unit having structure (I) is present from about 70 mole % to about 98 mole %.

In another aspect of the above embodiment wherein the polymer component comprises repeat units of structures (I), and (II), the repeat unit having structure (I) is present from about 70 mole % to about 80 mole %.

In still another aspect of this embodiment of the above polymer, the repeat unit having structure (II) is present up to about 20 mole %.

In yet another aspect of this polymer embodiment, nb and nd both equal 0. In yet another embodiment of this above polymer na and nc both equal 1.

In yet another embodiment of this above polymer, Re is methyl.

In yet another embodiment of this above polymer, Rf is ethyl.

In yet another embodiment of this above polymer, Ra is methyl.

In yet another embodiment of this above polymer, Rc is ethyl.

As a non-limiting example Scheme 1 shows how an acetal protected Novolak resin could be formed by the reaction of a Novolak with an alkyl vinyl ether (e.g. ethyl vinyl ether) in the presence of an acid catalyst. Optionally, this may be done in the absence of an acid catalyst.

Scheme 1

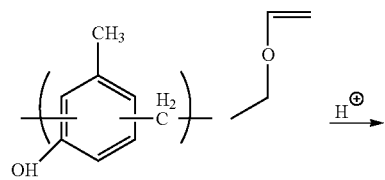

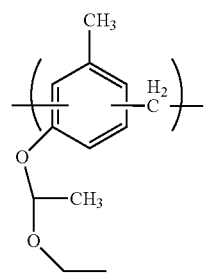

Polymer Component: Novolak Resins Linked by Di-Functional Acetal Comprising Moieties Another aspect of said inventive composition is one wherein, said polymer component is one comprises repeat units having structures (I), (III), and (IV), wherein the repeat units having a structures (III) and (IV) are attached together through the positions designated by ⁓⁓⁓, forming a di-functional acetal comprising moiety, forming a linking point in said polymer component between two different polymer chains in said polymer component. In this aspect, Ra, Rg and Rk are independently a C-1 to C-4 alkyl; Rb, Rh, and Rl are independently a —X-Phenol, wherein X is —O—, —C(CH$_3$)$_2$—, —(C=O)— or —SO$_2$—. Furthermore, in this aspect, na, ng, and nk independently, are 0 to 3; nb, nh, and nl, independently are 0 or 1, the sum of na and nb, the sum of ng and nh, and the sum of nk and nl, respectively, do not exceed 3. Furthermore, in this aspect, Ri and Rm are independently selected from a C-1 to C-4 alkyl, and further; Xa is an alkylene, an -alkyleneoxyalkylene-moiety, or an -alkylene(-O-alkylene)$_{x'}$-moiety wherein x' is 2 to 6. Also, in this aspect said composition is one wherein, said PAC component is comprised of a free PAC component.

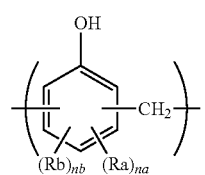

(I)

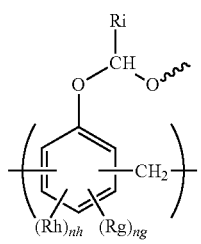

(II)

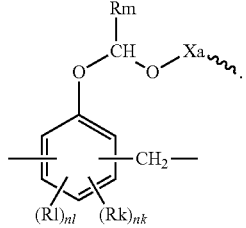

(IV)

Another aspect of said above polymer component comprising repeat units having structures (I), (III), and (IV), is one wherein, the repeat unit having structure (I) is present from about 60 mole % to about 98 mole %.

Another aspect of said above polymer component comprising repeat units having structures (I), (III), and (IV), is one wherein, the repeat unit having structure (I) is present from about 70 mole % to about 98 mole %.

Another aspect of said above polymer component comprising repeat units having structures (I), (III), and (IV), is one wherein, the repeat unit having structure (I) is present from about 70 mole % to about 80 mole %.

Another aspect of said above polymer component comprising repeat units having structures (I), (III), and (IV), is one wherein the linking point between two polymer chains of the polymer components, formed by the repeat units of structure (III) and structure (IV) is present up to about 25 mole % of the polymer component's repeat units. Preferably, in this aspect, the repeat unit having structure (I) is present from about 60 mole % to about 98 mole %, and said di-functional acetal comprising moiety, which contains repeat units having structures (III) and (IV), is one wherein the mole % of the sum of repeat units of structure (III) and (IV), does not exceed about 25 mole % of the polymer component's total repeat units. More preferably, in this aspect; the repeat unit having structure (I) is present from about 70 mole % to about 98 mole %, and said di-functional acetal comprising moiety, which contains repeat units having structures (III) and (IV), is one wherein the mole % of the sum of repeat units of structure (III) and (IV), does not exceed about 25 mole % of the polymer component's total repeat units.

Another aspect of said above polymer component comprising repeat units having structures (I), (III), and (IV), is one wherein the linking point between two polymer chains of the polymer components, formed by the repeat units of structure (III) and structure (IV) is present up to about 10 mole % of the polymer component's repeat units.

Another aspect of said above polymer component comprising repeat units having structures (I), (III), and (IV), is one wherein nb, nh and nl are 0.

Another aspect of said above polymer component comprising repeat units having structures (I), (III), and (IV), is one wherein na, ng, and nk are 1.

In another aspect of the above embodiment with repeat units having structures (I), (III), and (IV), it is one wherein and Ra and Rg and Rk are methyl.

Another aspect of said above polymer component comprising repeat units having structures (I), (III), and (IV), is one wherein Ri is methyl.

Another aspect of said above polymer component comprising repeat units having structures (I), (III), and (IV), is one wherein Rm is methyl.

Another aspect of said above polymer component comprising repeat units having structures (I), (III), and (IV), is one wherein Xa is an alkylene moiety.

Another aspect of said above polymer component comprising repeat units having structures (I), (III), and (IV), is one wherein Xa is an -alkyleneoxyalkylene- moiety, or an -alkylene(-O-alkylene)$_{x'}$- moiety, wherein x' is 2 to 6.

In another aspect of any of the above inventive embodiments wherein the component polymer is comprised of repeat units (I), (III), and (IV), Xa is an alkylenexoxyalkylene moiety. In one aspect of this embodiment the alkylene is selected from ethylene, propylene and butylene.

In another aspect of any of the above inventive embodiments wherein the component polymer is comprised of repeat units (I), (III), and (IV), Xa is an -alkylene(-O-alkylene)$_{x'}$- moiety, wherein x' is 2 to 6. In one aspect of this embodiment the alkylene is selected from ethylene, propylene and butylene.

In another aspect of any of the above inventive embodiments wherein the component polymer is comprised of repeat units (I), (III), and (IV), Xa is an alkylene moiety selected from the group consisting of ethylene, propylene, butylene, a moiety of structure (VII), and a moiety of structure (VIIa).

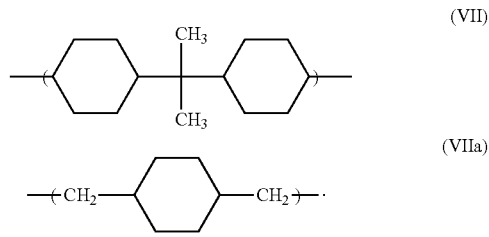

In another aspect of any of the above inventive embodiments wherein the component polymer is comprised of repeat units of structures (I), (III), and (IV), Xa is a moiety having structure (VII) or a moiety having structure (VIIa).

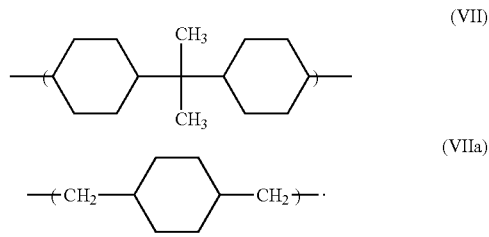

In another aspect of any of the above inventive embodiments wherein the component polymer is comprised of repeat units (I), (III), and (IV), Xa is a moiety having structure (VIIa).

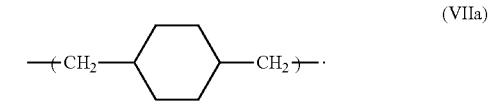

In another aspect of any of the above inventive embodiments wherein the component polymer is comprised of repeat units (I), (III), and (IV), Xa is an -alkylene(-O-alkylene)$_{x'}$- moiety, wherein x' is 2 to 6, and in one aspect of this embodiment the alkylene groups within this moiety are selected from ethylene, propylene and butylene.

In another aspect of any of the above inventive embodiments wherein the component polymer is comprised of repeat units (I), (III), and (IV), Xa is an -alkylene-O-alkylene- moiety, and in one aspect of this the alkylene groups within this moiety are selected from ethylene, propylene and butylene.

In another aspect of any of the above inventive embodiments wherein the component polymer is comprised of repeat units (I), (III), and (IV), Xa is —(CH$_2$—CH$_2$—O—CH$_2$—CH$_2$)—.

For the above described polymer components comprising the repeat units of structure (I), (III) and (IV), when the linking moiety Xa is an alkylene group, Scheme 2 shows as a non-limiting example how such a linking moiety may be introduced between two polymer chains linking them by the reaction of Novolak phenol moiety with a divinyl ether (e.g. divinyl ether of 1,4-hexanediol). Optionally, this reaction may also be done in the presence of an acid catalyst.

Scheme 2

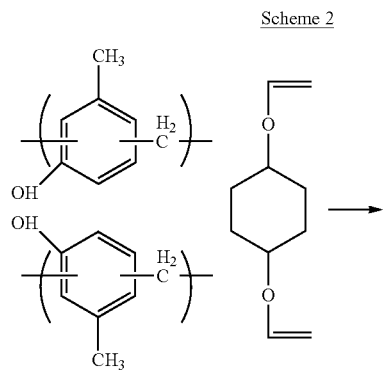

Scheme 3

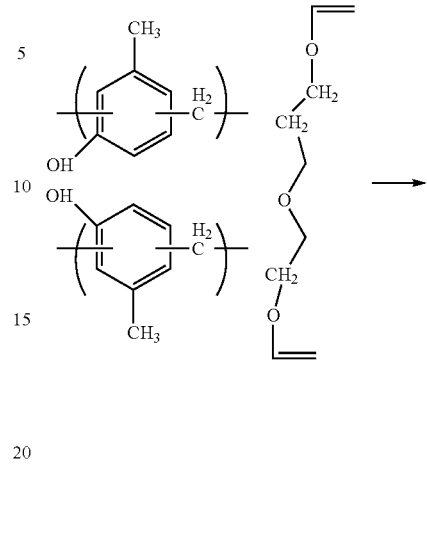

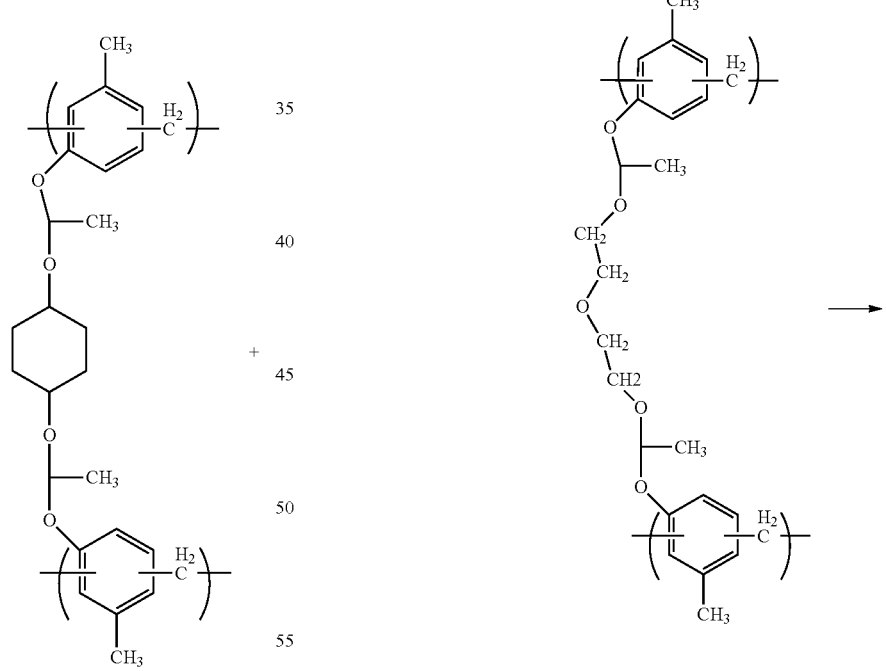

For the above described polymer components comprising the repeat units of structure (I), (III) and (IV), when the linking moiety Xa is an alkylene-O-alkylene, Scheme 3 shows as a non-limiting example how such a linking moiety may be introduced between two polymer chains linking them by the reaction of Novolak phenol moiety with a divinyl ether (e.g. divinyl ether of diethylene glycol). Optionally this may be done in the presence of an acid catalyst.

For the above described polymer components comprising the repeat units of structure (I), (III) and (IV), when the linking moiety Xa is an alkylene-O-alkylene, Scheme 4 shows as a non-limiting example how such a linking moiety may be introduced between two polymer chains linking them by the reaction of Novolak phenol moiety with a vinyl ether (e.g. ethyl vinyl ether), a glycol (e.g. diethylene glycol), in the presence of an acid catalyst. Optionally, this may be done in the absence of an acid catalyst.

Scheme 4

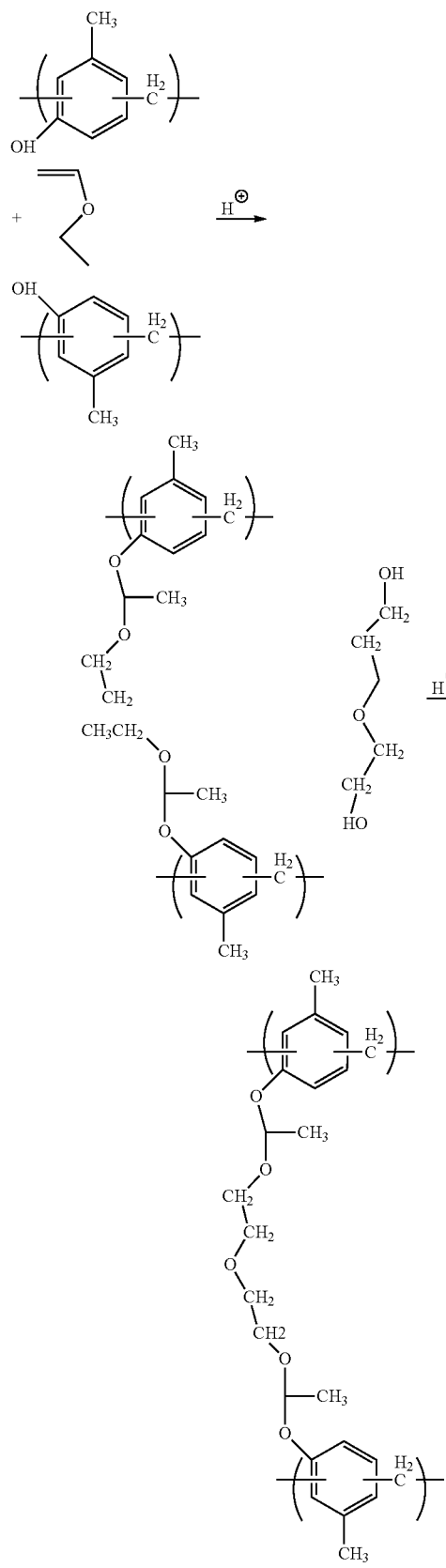

In another embodiment of the inventive composition the polymer component has a composition comprising repeat units having structures (I), (III), and (V), wherein the repeat units having structures (III) and (V) are attached together through the positions designated by, forming a di-functional acetal comprising moiety, forming a linking point in said polymer ⁓⁓⁓ , component between two different polymer chains in said polymer component. Further, in this aspect of this inventive composition, in the polymer component, Ra, Rg and Rn are independently a C-1 to C-4 alkyl; Rb, Rh, and Ro are independently a —X-Phenol, wherein X is —O—, —C(CH$_3$)$_2$—, —(C=O)— or —SO$_2$—, and na, ng, and nn independently, are 0 to 3; nb, nh, and no, independently are 0 or 1, and further the sum of na and nb, the sum of ng and nh, and further still, the sum of nn, and no, respectively, do not exceed 3; Ri and Rm2 independently are selected from a C-1 to C-4 alkyl; Xb is —O—, —C(CH$_3$)$_2$—, —(C=O)— or —SO$_2$—; Xc is an alkylene, an -alkyleneoxyalkylene- moiety, or an -alkylene(-O-alkylene)$_{x'}$- moiety wherein x' is 2 to 6. Preferably, in this embodiment the PAC component in the resist composition is comprised of a free PAC component.

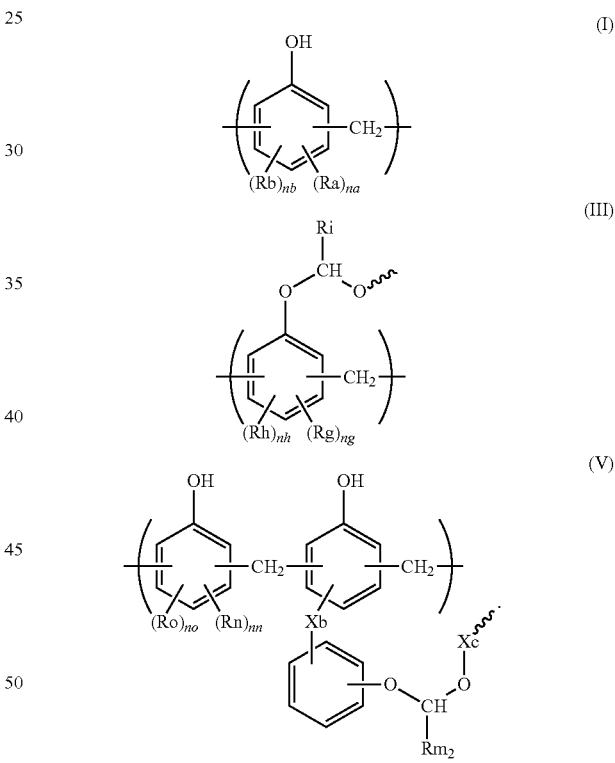

In another aspect of said above polymer component comprising repeat units having structures (I), (III), and (V), it is one wherein, the repeat unit having structure (I) is present from about 70 mole % to about 98 mole %.

In another aspect of said above polymer component comprising repeat units having structures (I), (III), and (V), it is one wherein, the repeat unit having structure (I) is present from about 70 mole % to about 80 mole %.

Another aspect of said above polymer component comprising repeat units having structures (I), (III), and (V), is one wherein the linking point between two polymer chains of the polymer components, formed by the repeat units of structure (III) and structure (V) is present up to about 25 mole % of the polymer component's repeat units. Preferably, in this aspect, the repeat unit having structure (I) is present from about 70 mole % to about 98 mole %, and said di-functional acetal comprising moiety, which contains repeat units having structures (III) and (V), is one wherein the mole % of the sum of repeat units of structure (III) and (V), does not exceed about 25 mole % of the polymer component's total repeat units.

Another aspect of said above polymer component comprising repeat units having structures (I), (III), and (V), is one wherein the linking point between two polymer chains of the polymer components, formed by the repeat units of structure (III) and structure (V) is present up to about 10 mole % of the polymer component's repeat units. Preferably, in this aspect, the sum of the mole % of repeat unit having structures (III) and (V), does not exceed 10% of the mole % of repeat unit of structure (I).

In another aspect of any of the above inventive embodiments wherein the component polymer is comprised of repeat units (I), (III), and (V), it is one wherein nb, nh and no are 0.

Another aspect of said above polymer component comprising repeat units having structures (I), (III), and (V), is one wherein na, ng, are 1, and nn is 0.

In another aspect of the above embodiment with repeat units having structures (I), (III), and (V), it is one wherein and Ra and Rg are methyl.

Another aspect of said above polymer component comprising repeat units having structures (I), (III), and (V), is one wherein Ri and Rm2 are both methyl.

Another aspect of said above polymer component comprising repeat units having structures (I), (III), and (V), is one wherein Xc is an alkylene moiety.

Another aspect of said above polymer component comprising repeat units having structures (I), (III), and (V), is one wherein Xc is an -alkyleneoxyalkylene- moiety, or an -alkylene(-O-alkylene)$_{x'}$- moiety wherein x' is 2 to 6.

In another aspect of any of the above inventive embodiments wherein the component polymer is comprised of repeat units (I), (III), and (V), Xb is —O—.

In another aspect of any of the above inventive embodiments wherein the component polymer is comprised of repeat units (I), (III), and (V), Xb is —C(CH$_3$)$_2$—.

In another aspect of any of the above inventive embodiments wherein the component polymer is comprised of repeat units (I), (III), and (V), Xb is —(C=O)—.

In another aspect of any of the above inventive embodiments wherein the component polymer is comprised of repeat units (I), (III), and (V), Xb is —SO$_2$—.

In another aspect of any of the above inventive embodiments wherein the component polymer is comprised of repeat units (I), (III), and (V), Xc is an alkylene moiety.

In another aspect of any of the above inventive embodiments wherein the component polymer is comprised of repeat units (I), (III), and (V), Xc is an alkylenexoxyalkylene moiety.

In another aspect of any of the above inventive embodiments wherein the component polymer is comprised of repeat units (I), (III), and (V), Xc is an alkylene moiety selected from the group consisting of ethylene, propylene, butylene, a moiety of structure (VII), and a moiety of structure (VIIa).

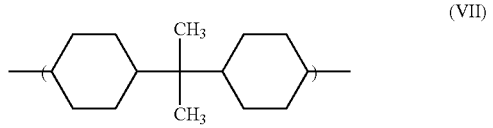

(VII)

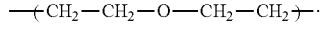

(VIIa)

In another aspect of any of the above inventive embodiments wherein the component polymer is comprised of repeat units of structures (I), (III), and (V), Xc is a moiety having structure (VII) or a moiety having structure (VIIa).

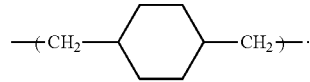

(VII)

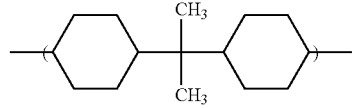

(VIIa)

In another aspect of any of the above inventive embodiments wherein the component polymer is comprised of repeat units (I), (III), and (V), Xc is a moiety having structure (VIIa).

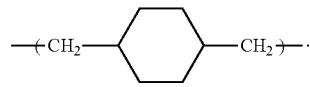

(VIIa)

In another aspect of any of the above inventive embodiments wherein the component polymer is comprised of repeat units (I), (III), and (V), Xc is an -alkylene(-O-alkylene)$_{x'}$- moiety, wherein x' is 2 to 6, and in one aspect of this embodiment the alkylene groups within this moiety are selected from ethylene, propylene and butylene.

In another aspect of any of the above inventive embodiments wherein the component polymer is comprised of repeat units (I), (III), and (V), Xc is an -alkylene-O-alkylene- moiety, and in one aspect of this the alkylene groups within this moiety are selected from ethylene, propylene and butylene.

In another aspect of any of the above inventive embodiments wherein the component polymer is comprised of repeat units (I), (III), and (V), Xc is an -alkyleneoxyalkylene- moiety of structure (VIIb).

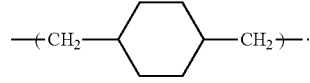

(VIIb)

For the above described polymer components comprising the repeat units of structure (I), (III) and (V), when the different embodiment of the linking moiety Xc, may be introduced in a manner analogous to what has been described for the corresponding embodiment of Xa in Schemes 2 to 4.

Polymer Component: Novolak Resins Functionalized with an Acetal Comprising Linking Group Attached to a PAC Moiety (PACb).

In another aspect of this inventive composition said polymer component is one comprising repeat units having structures (I), (II), and (VI), wherein Ra, Rc and Rp are independently a C-1 to C-4 alkyl; Rb, Rd, and Rq are independently a —X-Phenol, wherein X is —O—, —C(CH$_3$)$_2$—, —(C=O)— or —SO$_2$—, and na, nc, and np, independently, are 0 to 3; nb, nd, and nq, independently are 0 or 1, and the sum of na and nb, the sum of nc and nd, and the sum of np and nq, respectively, do not exceed 3; Re, Rf, and Rr are independently selected from a C-1 to C-4 alkyl, PACb is a PAC component in the repeat unit having structure (VI) attached through a linking group Xd, wherein Xd is selected from the group consisting of the following;
  a direct valence bond,
  an alkylene moiety,
  an alkyleneoxy moiety, wherein the alkylene end is attached to the acetal oxygen moiety of the repeat unit of structure (VI), and the oxy end of the alkyleneoxy moiety is attached to the PACb moiety, and
  a moiety comprising an acetal selected from the group consisting of the following; an alkyleneacetal moiety (-alkyleneO—CH(CH$_3$)—O—), an alkyleneoxyalkyleneacetal moiety (-alkylene-O-alkyleneO—CH(CH$_3$)—O—), and an alkylene(oligooxyalkylene)acetal, (-alkylene(-O-alkylene)$_x$-O—CH(CH$_3$)—O—), wherein x is 2 to 6, and further wherein, in each of said acetal comprising moiety, the alkylene end of this moiety is attached to the acetal oxygen moiety of the repeat unit of structure (VI), and the acetal portion of said moiety comprising an acetal is attached to the PACb moiety.

In embodiments of the inventive compositions described herein, wherein it comprises the PACb moiety, this moiety may be derived from a 1,2-diazonaphthoquinone-5-sulfonate moiety or a 1,2-diazonaphthoquinone-4-sulfonate moiety.

FIG. 1 shows non-limiting examples of these types of DNQ PAC's, which may be used as to form a PACb component; wherein, in this FIG., the moiety D is H or a moiety selected from VIIIa and VIIIb, wherein in each compound depicted in this Figure at least one D is either a moiety of structure VIIIa or VIIIb. In the DNQ PAC's depicted in FIG. 1, in one aspect of this embodiment the PACb has an attachment position in (VI) which was formed, originally from a from a free phenolic OH (a.k.a. D=H) wherein the formation of the linking Xd resulted from a precursor which formed an acetal functionality or ether functionality with this free phenolic position, in a PAC compound in FIG. 1. In other embodiments, the DNQ-PAC's depicted in FIG. 1 may be attached to the Novolak repeat unit of structure (VI) through an Xd moiety which forms a carbon-carbon bond with an aromatic moiety in these DNQ-PACs.

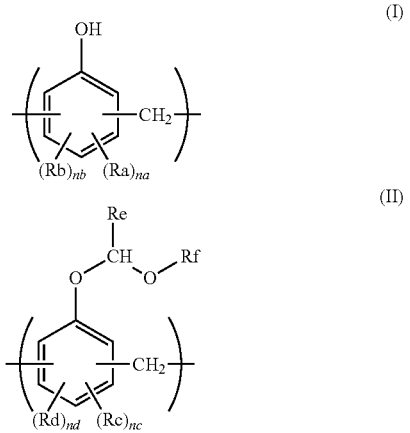
(I)

(II)

-continued

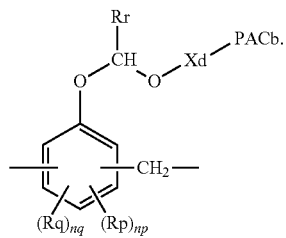
(IV)

In another aspect of any of the above inventive embodiments wherein the component polymer is comprised of repeat units of structures (I), (II), and (VI), the repeat unit having structure (I) is present from about 60 mole % to about 98 mole %;

In another aspect of any of the above inventive embodiments wherein the component polymer is comprised of repeat units of structures (I), (II), and (VI), %; the repeat unit having structure (II) is present up to about 40 mole %;

In another aspect of any of the above inventive embodiments wherein the component polymer is comprised of repeat units of structures (I), (II), and (VI), %; the repeat unit having structure (VI) do not exceed about 45 mole % of the repeat units in said polymer component.

In another aspect of any of the above inventive embodiments wherein the component polymer is comprised of repeat units of structures (I), (II), and (VI), the repeat unit having structure (I) is present from about 60 mole % to about 98 mole %; the repeat unit having structure (II) is present from greater than 0 mole % to about 40 mole %; and the repeat unit having structure (II) and repeat unit having structure (VI) do not exceed about 45 mole % of the repeat units in said polymer component.

In another aspect of any of the above inventive embodiments wherein the component polymer is comprised of repeat units of structures (I), (II), and (VI), the repeat unit having structure (I) is present from about 70 mole % to about 98 mole %.

In another aspect of any of the above inventive embodiments wherein the component polymer is comprised of repeat units of structures (I), (II), and (VI), the repeat unit having structure (I) is present from about 70 mole % to about 80 mole %.

In another aspect of any of the above inventive embodiment, wherein the polymer component is comprised of repeat units of structures (I), (II), and (VI), the repeat unit of structure (II) is present up to about 20 mole %.

In another aspect of any of the above inventive embodiment, wherein the polymer component is comprised of repeat units of structures (I), (II), and (VI), the repeat unit of structure (VI) is present up to about 10 mole %.

In another aspect of any of the above inventive embodiment, wherein the component polymer is comprised of repeat units of structures (I), (II), and (VI), it is one wherein the nb, nd and nq are 0.

In another aspect of any of the above inventive embodiment, wherein the component polymer is comprised of repeat units of structures (I), (II), and (VI), Ra, Rg, Rk and Rp are methyl.

In another aspect of any of the above inventive embodiment, wherein the component polymer is comprised of repeat units of structures (I), (II), and (VI), na, ng, nk and np are 1.

In another aspect of any of the above inventive embodiment, wherein the component polymer is comprised of repeat units of structures (I), (II), and (VI), Ri, Rm and Rr are methyl In another aspect of any of the above inventive embodiment, wherein the component polymer is comprised of repeat units of structures (I), (II), and (VI), Xd is an alkyleneacetal moiety (-alkyleneO—CH(CH₃)—O—).

In another aspect of any of the above inventive embodiment, wherein the component polymer is comprised of repeat units of structures (I), (II), and (VI), and Xd is an alkyleneacetal moiety (-alkyleneO—CH(CH₃)—O—), the alkylene portion of the alkyleneacetal moiety, is selected from the group consisting of ethylene, propylene, a moiety having structure (VII) and a moiety having structure (VIIa).

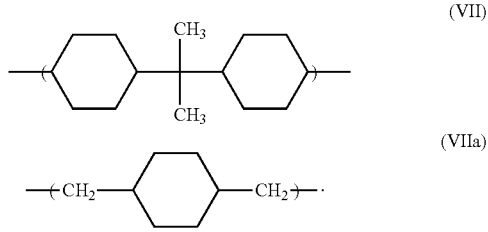

In another aspect of any of the above inventive embodiment, wherein the component polymer is comprised of repeat units of structures (I), (II), and (VI), and Xd is an alkyleneacetal moiety (-alkyleneO—CH(CH₃)—O—), the alkylene portion of the alkyleneacetal moiety, is a moiety having structure (VII).

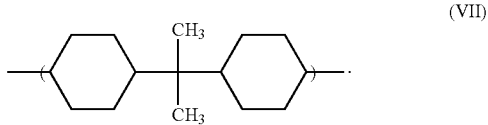

In another aspect of any of the above inventive embodiment, wherein the component polymer is comprised of repeat units of structures (I), (II), and (VI), and Xd is an alkyleneacetal moiety (-alkyleneO—CH(CH₃)—O—), the alkylene portion of the alkyleneacetal moiety, is a moiety having structure (VIIa)

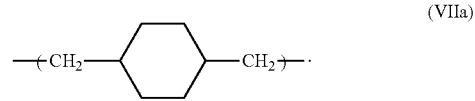

In another aspect of any of the above inventive embodiment, wherein the component polymer is comprised of repeat units of structures (I), (II), and (VI), Xd is an alkyleneoxyalkyleneacetal moiety (-alkylene-O-alkyleneO—CH(CH₃)—O—).

In another aspect of any of the above inventive embodiment, wherein the component polymer is comprised of repeat units of structures (I), (II), and (VI), the alkyleneoxyalkyleneacetal moiety (-alkylene-O-alkyleneO—CH(CH₃)—O—), is a moiety wherein the alkylene portions are selected independently from a C-2 to C-8 alkylene moiety.

In another aspect of any of the above inventive embodiment, wherein the component polymer is comprised of repeat units of structures (I), (II), and (VI), the alkyleneoxyalkyleneacetal moiety (-alkylene-O-alkyleneO—CH(CH₃)—O—), is a moiety wherein the alkylene portions are selected independently from a C-2 to C-4 alkylene moiety.

In another aspect of any of the above inventive embodiment, wherein the component polymer is comprised of repeat units of structures (I), (II), and (VI), the alkyleneoxyalkyleneacetal moiety (-alkylene-O-alkyleneO—CH(CH₃)—O—), is a moiety having structure (VIIc) wherein ac is an integer from 2 to 4.

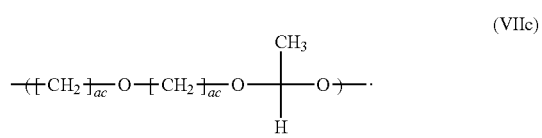

In another aspect of any of the above inventive embodiment, wherein the component polymer is comprised of repeat units of structures (I), (II), and (VI), the alkyleneoxyalkyleneacetal moiety (-alkylene-O-alkyleneO—CH(CH₃)—O—), is a moiety having structure (VIId).

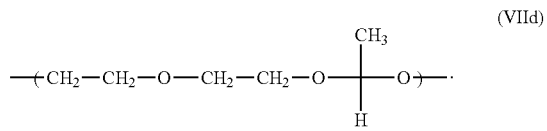

For the above described polymer components comprising the repeat units of structure (I), (II) and (VI), in said repeat unit of structure (VI), as non-limiting examples when Xd is an alkyleneacetal moiety (alkyleneO—CH(CH₃)—O—), linking moieties attaching PACb it may result by reacting a Novolak resin and a divinyl ether (e.g. divinyl ether of 1,4-cyclohexanediol or diethylene glycol) in the presence of a PAC compound having at least one free phenol functionality (Schemes 5 and 6). Optionally, these reactions may be done in the presence of an acid catalyst.

Another possible non-limiting example of a pathway for embodiment wherein the Xd linking moiety is an alkyleneacetal moiety (-alkyleneO—CH(CH₃)—O—), linking moieties is shown in Schemes 7 and 8, wherein a Novolak is reacted with a glycol compound (e.g. ethylene glycol or diethylene glycol), a mono functional vinyl ether (e.g. ethyl vinyl ether) and an acid catalyst. Optionally, these reaction may be done in the absence of an acid catalyst.

Another possible non-limiting example of a pathway for embodiment wherein the Xd linking moiety is a direct valence bond Xd liking moiety is shown in Scheme 9 wherein a trans acetal reaction occurs between a Novolak resin in the presence of an acid with an alkyl vinyl ether (e.g. ethyl vinyl ether) and a PAC with has at least one free phenol functionality. Optionally, this reaction may be done in the absence of an acid catalyst.

As a further non-limiting example, Scheme 10, shows how an alkyleneoxy, Xd linking moiety may result by an acetal formation reaction under acidic conditions between a vinyloxyalkyleneoxy PAC derivative and a Novolak polymer. Optionally, this reaction may be done in the absence of an acid catalyst.

Similarly, Scheme 11, shows how an alkylene, Xd linking moiety may result by an acetal formation under acidic conditions between a vinyloxylalkylene PAC derivative and a Novolak polymer. Optionally, this reaction may be done in the absence of an acid catalyst
Scheme 5
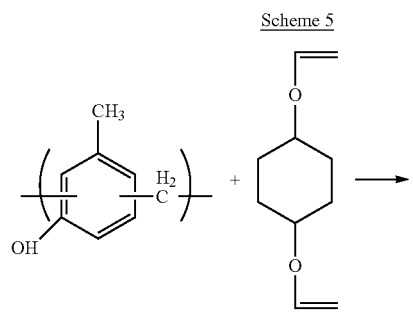
Scheme 6
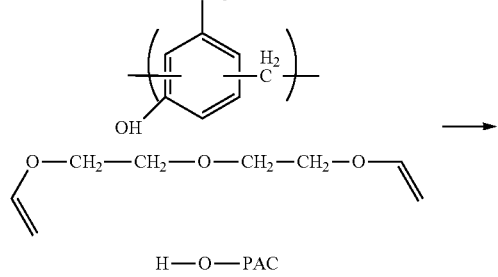
-continued
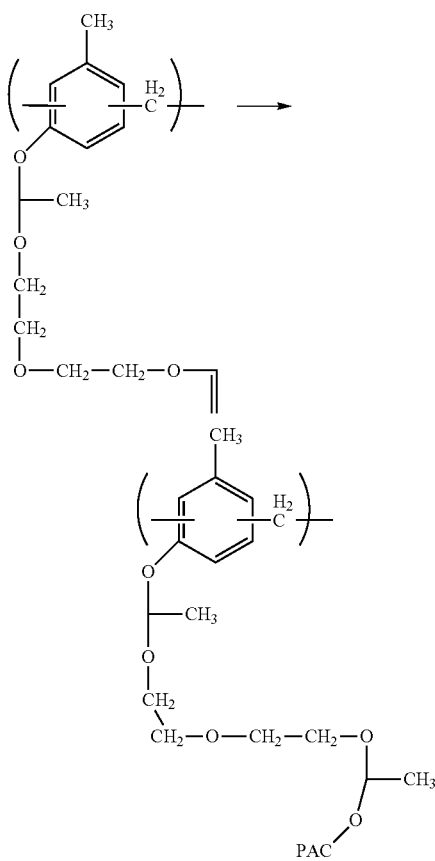
Scheme 7
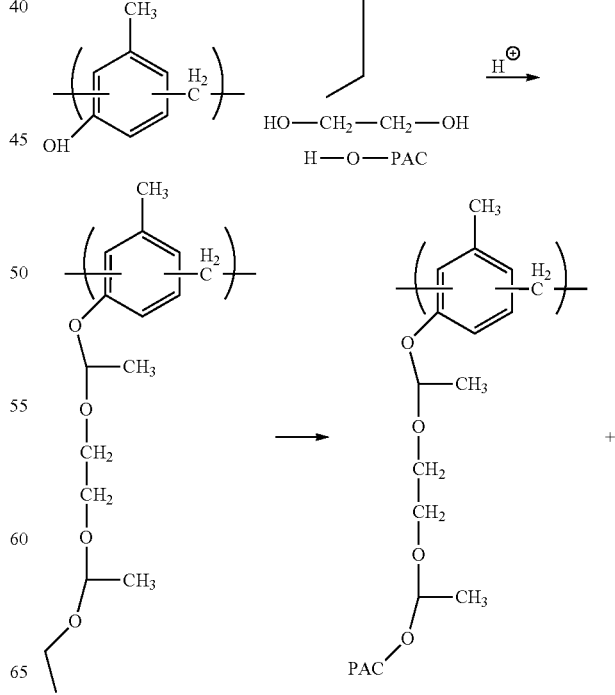

27
-continued

Scheme 8

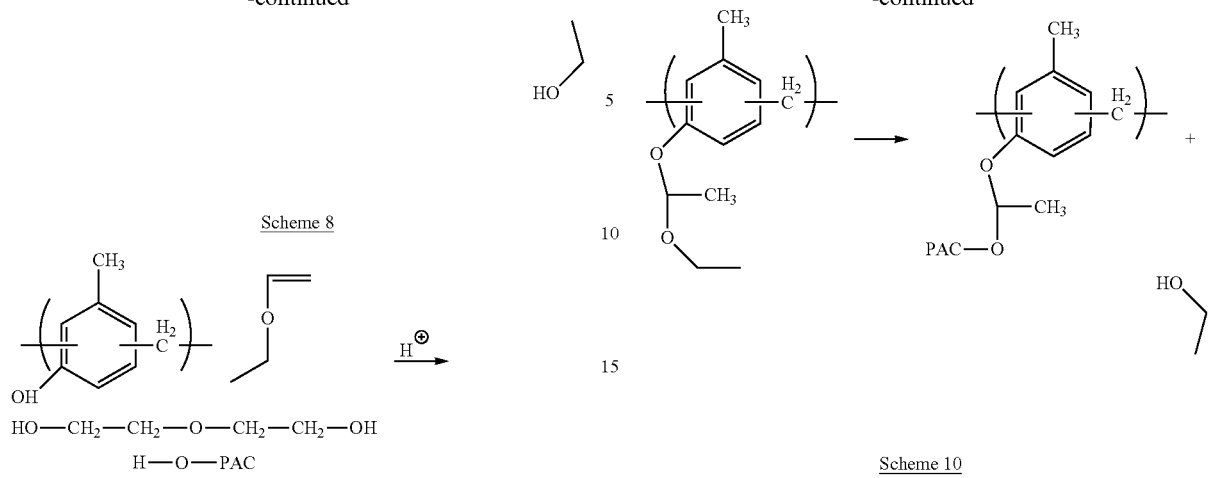

Scheme 9

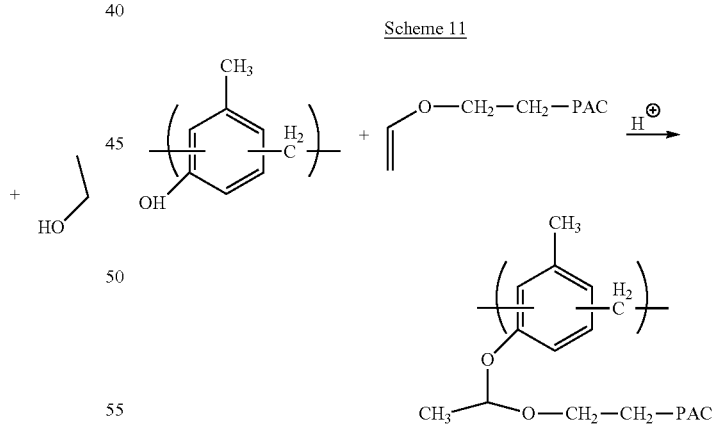

28
-continued

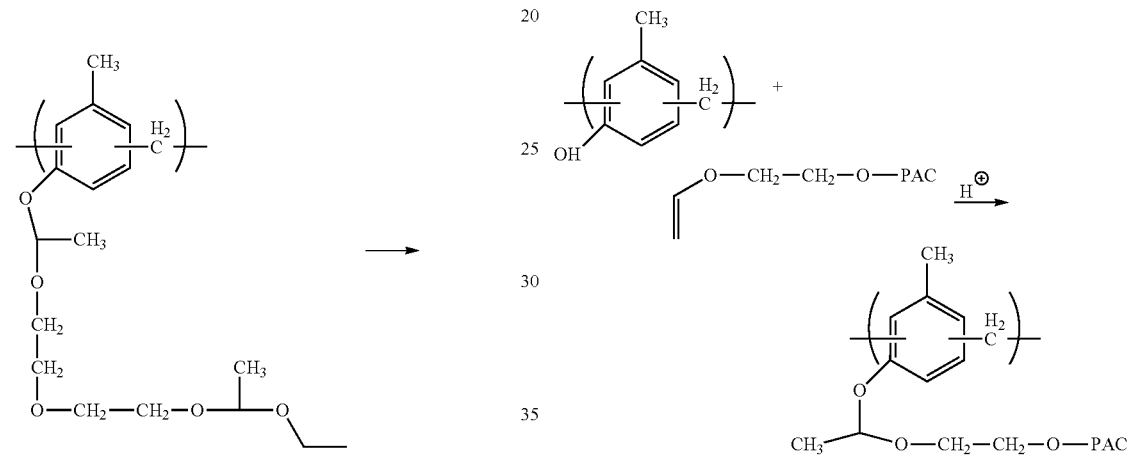

Scheme 10

Scheme 11

Polymer Component: Novolak Resins with a Di-Functional Acetal Comprising Moiety, Linking and Protecting Two Repeat Units Comprising a Novolak Phenolic Hydroxy Moiety and Functionalized with an Acetal Comprising Linking Group Attached to a PAC Moiety (PACb).

In another aspect of this inventive composition the polymer component may be one which is both an acetal linked Novolak resin and is also functionalized with an acetal comprising linking group attached to a PAC moiety (PACb). In these embodiments the acetal linked Novolak resin and its functionalization with an acetal comprising linking group attached to a PAC moiety (PACb) may be accomplished as has been previously described (e.g. Schemes 2 to 11).

Specifically, in another aspect of this inventive composition the polymer component is one comprising repeat units having structures (I), (III), (IV) and (VI), wherein the repeat units having structures (III) and (IV) are attached together through the positions designated by, forming a di-functional acetal comprising moiety, forming a linking point in said polymer component between two different polymer chains in said polymer component. Also, in this aspect Ra, Rg, Rk and Rp are independently a C-1 to C-4 alkyl and Rb, Rh, Rl and Rq are independently a —X-Phenol, wherein X is —O—, —C(CH$_3$)$_2$—, —(C=O)— or —SO$_2$—, and na, ng, nk and np independently, are 0 to 3, and nb, nh, nl and nq, are independently 0 or 1. Furthermore, in this aspect the sum of na and nb, the sum of nh and ng, the sum of nl and nk, and the sum of np and nq respectively, do not exceed 3. Furthermore, in this aspect, Ri and Rm are independently selected from a C-1 to C-4 alkyl, Xa is an alkylene, an -alkyleneoxyalkylene- moiety, or an -alkylene (-O-alkylene)$_{x'}$- moiety wherein x' is 2 to 6. Also, in this aspect, the moiety PACb, in repeat unit of structure (VI), is a PAC component in the repeat unit having structure (VI) attached through a linking group Xd, wherein Xd is selected from the group consisting of the following;
 a direct valence bond,
 an alkylene moiety,
 an alkyleneoxy moiety, wherein the alkylene end is attached to the acetal oxygen moiety of the repeat unit of structure (VI), and the oxy end of the alkyleneoxy moiety is attached to the PACb moiety, and
 a moiety comprising an acetal selected from the group consisting of the following;
  an alkyleneacetal moiety (-alkyleneO—CH(CH$_3$)—O—),
  an alkyleneoxyalkyleneacetal moiety (-alkylene-O-alkyleneO—CH(CH$_3$)—O—), and
  an alkylene(oligooxyalkylene)acetal, (-alkylene(-O-alkylene)$_x$-O—CH(CH$_3$)—O—),
  wherein x is 2 to 6, and further wherein, in each of said acetal comprising moiety, the alkylene end of this moiety is attached to the acetal oxygen moiety of the repeat unit of structure (VI), and the acetal portion of said moiety comprising an acetal is attached to the PACb moiety.

In other embodiments of the above inventive composition described above, wherein it comprises the PACb moiety may be derived from a 1,2-diazonaphthouqinone-5-sulfonate moiety or a 1,2-diazonaphthoquinone-4-sulfonate moiety. FIG. 1 shows non-limiting examples of these types of DNQ PAC's, which may be used as to form a PACb component; wherein, in this FIG. the moiety D is H or a moiety selected from VIIIa and VIIIb, wherein in each compound depicted in this FIG. at least one D is either a moiety of structure VIIIa or VIIIb. In the DNQ PAC's depicted in FIG. 1. In one aspect of this embodiment the PACb has an attachment position in (VI) which was formed, originally from a from a free phenolic OH (a.k.a. D=H). in a PAC compound in FIG. 1. In other embodiments, the DNQ-PAC's depicted in FIG. 1 may be attached to the Novolak repeat unit of structure (VI) through an Xd moiety which forms a carbon-carbon bond with an aromatic moiety in these DNQ-PACs.

In another aspect of any of the above inventive embodiments wherein the component polymer is comprised of repeat units, (I), (III), (IV) and (VI); the repeat unit having structure (I) is present from about 60 mole % to about 98 mole %.

In another aspect of any of the above inventive embodiments wherein the component polymer is comprised of repeat units, (I), (III), (IV) and (VI); the linking point between two polymer chains of the polymer components, formed by the repeat units of structure (III) and structure (IV) is present up to about 25 mole % of the polymer component's repeat units. In another aspect of any of the above inventive embodiments wherein the component polymer is comprised of repeat units, (I), (III), (IV) and (VI); the repeat unit having structure (VI) is present up to about 20 mole %. Preferably, in this aspect, the repeat unit having structure (I) is present from about 60 mole % to about 98 mole %, and the linking point between two polymer chains of the polymer components, formed by the repeat units of structure (III) and structure (IV) is present up to about 25 mole % of the polymer component's repeat units and the repeat unit having structure (VI) is present up to about 20 mole %.

In another aspect of any of the above inventive embodiments wherein the component polymer is comprised of repeat units, (I), (III), (IV) and (VI), the linking point between two polymer chains of the polymer components, formed by the repeat units of structure (III) and structure (IV) is present up to about 10 mole % of the polymer component's repeat units. Preferably, in this aspect, the sum of mole % of repeat units having structures (III) and (IV), does not exceed 10 mole % of the repeat units in said polymer component.

In another aspect of any of the above inventive embodiments wherein the component polymer is comprised of repeat units, (I), (III), (IV) and (VI), it is one wherein, the repeat unit having structure (I) is present from about 70 mole % to about 98 mole %.

In another aspect of any of the above inventive embodiments, wherein the component polymer is comprised of repeat units, (I), (III), (IV) and (VI), it is one wherein the repeat unit of structure (VI) is present up to about 10 mole %.

In another aspect of any of the above inventive embodiments, wherein the component polymer is comprised of repeat units, (I), (III), (IV) and (VI), it is one wherein nb, nh, nl and nq are 0.

In another aspect of any of the above inventive embodiments, wherein the component polymer is comprised of repeat units, (I), (III), (IV) and (VI), Ra, Rg, Rk and Rp are methyl.

In another aspect of any of the above inventive embodiments, wherein the component polymer is comprised of repeat units, (I), (III), (IV) and (VI), na, ng, nk and np are 1.

In another aspect of any of the above inventive embodiments, wherein the component polymer is comprised of repeat units, (I), (III), (IV) and (VI), Ri, Rm and Rr are methyl.

In another aspect of any of the above inventive embodiment, wherein the component polymer is comprised of repeat units of structures (I), (III), (IV) and (VI), Xd is an alkyleneacetal moiety (-alkyleneO—CH(CH$_3$)—O—).

In another aspect of any of the above inventive embodiment, wherein the component polymer is comprised of repeat units of structures (I), (III), (IV) and (VI), and Xd is an alkyleneacetal moiety (-alkyleneO—CH(CH$_3$)—O—), the alkylene portion of the alkyleneacetal moiety, is selected from the group consisting of ethylene, propylene, a moiety having structure (VII) and a moiety having structure (VIIa).

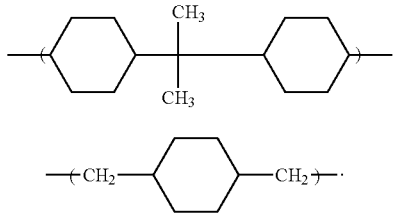

(VII)

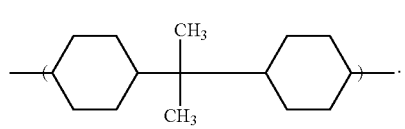

(VIIa)

In another aspect of any of the above inventive embodiment, wherein the component polymer is comprised of repeat units of structures (I), (III), (IV) and (VI), and Xd is an alkyleneacetal moiety (-alkyleneO—CH(CH$_3$)—O—), the alkylene portion of the alkyleneacetal moiety, is a moiety having structure (VII).

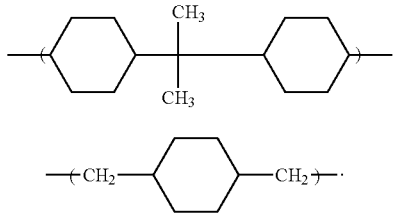

(VII)

In another aspect of any of the above inventive embodiment, wherein the component polymer is comprised of repeat units of structures (I), (III), (IV) and (VI), and Xd is an alkyleneacetal moiety (-alkyleneO—CH(CH$_3$)—O—), the alkylene portion of the alkyleneacetal moiety, is a moiety having structure (VIIa)

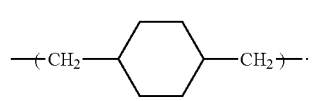

(VIIa)

In another aspect of any of the above inventive embodiment, wherein the component polymer is comprised of repeat units of structures (I), (III), (IV) and (VI), Xd is an alkyleneoxyalkyleneacetal moiety (-alkylene-O-alkyleneO—CH(CH$_3$)—O—).

In another aspect of any of the above inventive embodiment, wherein the component polymer is comprised of repeat units of structures (I), (III), (IV) and (VI), the alkyleneoxyalkyleneacetal moiety (-alkylene-O-alkyleneO—CH(CH$_3$)—O—), is a moiety wherein the alkylene portions are selected independently from a C-2 to C-8 alkylene moiety.

In another aspect of any of the above inventive embodiment, wherein the component polymer is comprised of repeat units of structures (I), (III), (IV) and (VI), the alkyleneoxyalkyleneacetal moiety (-alkylene-O-alkyleneO—CH(CH$_3$)—O—), is a moiety wherein the alkylene portions are selected independently from a C-2 to C-4 alkylene moiety.

In another aspect of any of the above inventive embodiment, wherein the component polymer is comprised of repeat units of structures (I), (III), (IV) and (VI), the alkyleneoxyalkyleneacetal moiety (-alkylene-O-alkyleneO—CH(CH$_3$)—O—), is a moiety having structure (VIIc) wherein ac is an integer from 2 to 4.

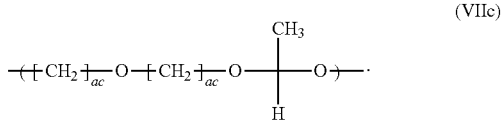

(VIIc)

In another aspect of any of the above inventive embodiment, wherein the component polymer is comprised of repeat units of structures (I), (III), (IV) and (VI), the alkyleneoxyalkyleneacetal moiety (-alkylene-O-alkyleneO—CH(CH$_3$)—O—), is a moiety having structure (VIIc).

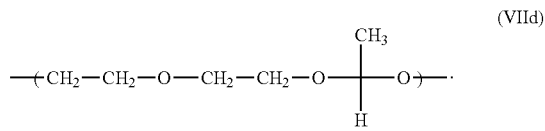

(VIId)

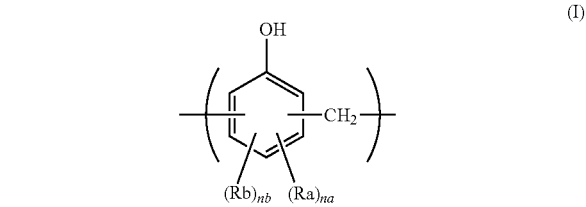

(I)

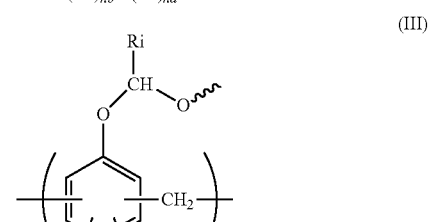

(III)

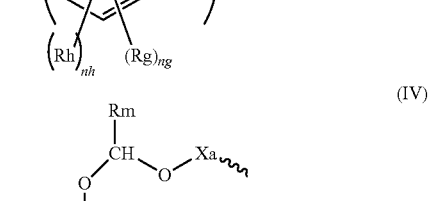

(IV)

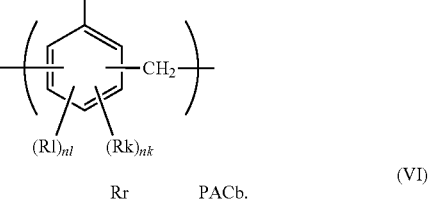

(VI)

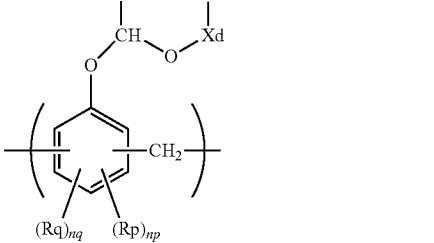

In another aspect of this inventive composition said polymer component is one comprising repeat units of structures (I), (III), (V) and (VI), wherein the repeat units having structures (III) and (V) are attached together through the positions designated ~~~, by forming a di-functional acetal comprising moiety, forming a linking point in said polymer component between two different polymer chains in said polymer component. Further, in this embodiment the polymer is one wherein, Ra, Rg, Rn and Rp are independently a C-1 to C-4 alkyl. Further, in this embodiment the polymer is one wherein, Rb, Rh, Ro and Rq are independently a —X-Phenol, wherein X is —O—, —C(CH$_3$)$_2$—, —(C=O)—, or —SO$_2$—. Further, in this embodiment the polymer is one wherein, na, ng, nn and np independently, are 0 to 3, nb, nh, no and nq, independently are 0 or 1, and the sum of na and nb, the sum of nn and no, the sum of nl and nk, and the sum of np and nq respectively, do not exceed 3. Further, in this embodiment the polymer is one wherein, Ri is a C-1 to C-4 alkyl, Xb is —O—, —C(CH$_3$)$_2$—, —(C=O)— or —SO$_2$—.

Further, in this embodiment the polymer is one wherein, Xc is an alkylene, an -alkyleneoxyalkylene- moiety, or an -alkylene(-O-alkylene)$_{x'}$- moiety wherein x' is 2 to 6.

Further, in this embodiment, PACb is a PAC component in the repeat unit having structure (VI) attached through a linking group Xd, wherein Xd is selected from the group consisting of the following;

a direct valence bond,
an alkylene moiety,
an alkyleneoxy moiety, wherein the alkylene end is attached to the acetal oxygen moiety of the repeat unit of structure (VI), and the oxy end of the alkyleneoxy moiety is attached to the PACb moiety, and
a moiety comprising an acetal selected from the group consisting of the following;
  an alkyleneacetal moiety (-alkyleneO—CH(CH$_3$)—O—),
  an alkyleneoxyalkyleneacetal moiety (-alkylene-O-alkyleneO—CH(CH$_3$)—O—), and
  an alkylene(oligooxyalkylene)acetal, (-alkylene(-O-alkylene)$_x$-O—CH(CH$_3$)—O—),
  wherein x is 2 to 6, and further wherein, in each of said acetal comprising moiety, the alkylene end of this moiety is attached to the acetal oxygen moiety of the repeat unit of structure (VI), and the acetal portion of said moiety comprising an acetal is attached to the PACb moiety.

In other embodiments of the above inventive composition described above, wherein it comprises the PACb moiety may be derived from a 1,2-diazonaphthouqinone-5-sulfonate moiety or a 1,2-diazonaphthoquinone-4-sulfonate moiety. FIG. 1 shows non-limiting examples of these types of DNQ PAC's, which may be used as to form a PACb component; wherein, in this FIG., the moiety D is H or a moiety selected from VIIIa and VIIIb, wherein in each compound depicted in this FIG., at least one D is either a moiety of structure VIIIa or VIIIb. In the DNQ PAC's depicted in FIG. 1, to be used as a PACb it needs to be covalently attached to the position in (VI) through the moiety Xd. In one embodiment this attachment may originate from a from a free phenolic OH (a.k.a. D=H) originally present in a PAC in FIG. 1 wherein such a free OH moiety was originally present. Thus, in this aspect, for attachment to the repeat unit of structure (VI), the PAC should be one in which not only is at least one D selected from a moiety of structure VIIIa or VIIIb, but also at least one D needs to have been originally H forming at least one OH moiety which was used to form the attachment point to a repeat unit of structure (VI).

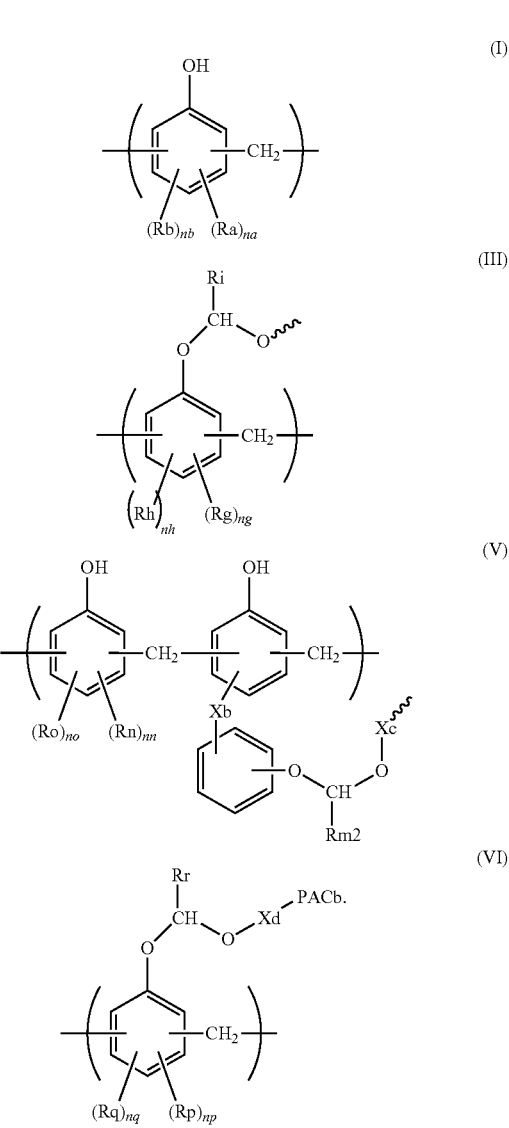

In another aspect of the above embodiment of said inventive composition, wherein said polymer component is one comprising repeat units of structures (I), (III), (V) and (VI), the repeat unit having structure (I) is present from about 60 mole % to about 98 mole %.

In another aspect of the above embodiment of said inventive composition, wherein said polymer component is one comprising repeat units of structures (I), (III), (V) and (VI), the linking point between two polymer chains of the polymer components, formed by the repeat units of structure (III) and structure (V) is present up to about 25 mole % of the polymer component's repeat units.

In another aspect of the above embodiment of said inventive composition, wherein said polymer component is one comprising repeat units of structures (I), (III), (V) and (VI), the repeat unit having structure (VI) is present up to about 20 mole %. Preferably, in this aspect the repeat unit having structure (I) is present from about 60 mole % to about 98 mole %, and further the linking point between two polymer chains of the polymer components, formed by the repeat units of structure (III) and structure (V) is present up to about 25 mole % of the polymer component's repeat units and further the repeat unit having structure (VI) is present up to about 20 mole %.

In another aspect of the above embodiment of said inventive composition, wherein said polymer component is one comprising repeat units of structures (I), (III), (V) and (VI), said polymer is one wherein the repeat unit having structure (I) is present from about 70 mole % to about 98 mole %.

In another aspect of the above embodiment of said inventive composition, wherein said polymer component is one comprising repeat units of structures (I), (III), (V) and (VI), said polymer is one wherein the repeat unit having structure (I) is present from about 70 mole % to about 80 mole %.

In another aspect of any of the above embodiment of said inventive composition, wherein said polymer component is one comprising repeat units of structures (I), (III), (V) and (VI), this polymer is one wherein, the repeat unit of structure (VI) is present up to about 10 mole %.

In another aspect of any of the above embodiment of said inventive composition, wherein said polymer component is one comprising repeat units of structures (I), (III), (V) and (VI), this polymer is one wherein, sum of the mole % of repeat unit having structures (III) and (V), does not exceed 10% of the mole % of the repeat units in said polymer component, preferably does not exceed 10% of the mole % of repeat unit of structure (I).

In another aspect of any of the above embodiment of said inventive composition, wherein said polymer component is one comprising repeat units of structures (I), (III), (V) and (VI), this polymer is one wherein, nb, nh, no and nq are 0.

In another aspect of any of the above embodiment of said inventive composition, wherein said polymer component is one comprising repeat units of structures (I), (III), (V) and (VI), Ra, Rg, Rk and Rp are methyl.

In another aspect of any of the above embodiment of said inventive composition, wherein said polymer component is one comprising repeat units of structures (I), (III), (V) and (VI), wherein na, ng, nk and np are 1.

In another aspect of any of the above embodiment of said inventive composition, wherein said polymer component is one comprising repeat units of structures (I), (III), (V) and (VI), Ri, Rm and Rr are methyl In another aspect of any of the above embodiment of said inventive composition, wherein said polymer component is one comprising repeat units of structures (I), (III), (V) and (VI), Xd is an alkyleneacetal moiety (alkyleneO—CH(CH$_3$)—O—).

In another aspect of any of the above inventive embodiment, wherein the component polymer is comprised of repeat units of structures (I), (III), (V) and (VI), Xd is an alkyleneacetal moiety (-alkyleneO—CH(CH$_3$)—O—).

In another aspect of any of the above inventive embodiment, wherein the component polymer is comprised of repeat units of structures (I), (III), (V) and (VI), and Xd is an alkyleneacetal moiety (-alkyleneO—CH(CH$_3$)—O—), the alkylene portion of the alkyleneacetal moiety, is selected from the group consisting of ethylene, propylene, a moiety having structure (VII) and a moiety having structure (VIIa).

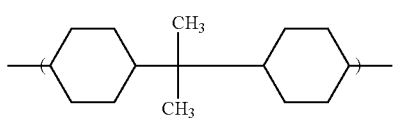

(VII)

(VIIa)

In another aspect of any of the above inventive embodiment, wherein the component polymer is comprised of repeat units of structures (I), (III), (V) and (VI), and Xd is an alkyleneacetal moiety (-alkyleneO—CH(CH$_3$)—O—), the alkylene portion of the alkyleneacetal moiety, is a moiety having structure (VII).

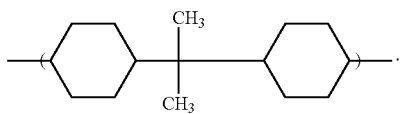

(VII)

In another aspect of any of the above inventive embodiment, wherein the component polymer is comprised of repeat units of structures (I), (III), (V) and (VI), and Xd is an alkyleneacetal moiety (-alkyleneO—CH(CH$_3$)—O—), the alkylene portion of the alkyleneacetal moiety, is a moiety having structure (VIIa)

(VIIa)

In another aspect of any of the above inventive embodiment, wherein the component polymer is comprised of repeat units of structures (I), (III), (V) and (VI), Xd is an alkyleneoxyalkyleneacetal moiety (-alkylene-O-alkyleneO—CH(CH$_3$)—O—).

In another aspect of any of the above inventive embodiment, wherein the component polymer is comprised of repeat units of structures (I), (III), (V) and (VI), the alkyleneoxyalkyleneacetal moiety (-alkylene-O-alkyleneO—CH(CH$_3$)—O—), is a moiety wherein the alkylene portions are selected independently from a C-2 to C-8 alkylene moiety.

In another aspect of any of the above inventive embodiment, wherein the component polymer is comprised of repeat units of structures (I), (III), (V) and (VI), the alkyleneoxyalkyleneacetal moiety (-alkylene-O-alkyleneO—CH(CH$_3$)—O—), is a moiety wherein the alkylene portions are selected independently from a C-2 to C-4 alkylene moiety.

In another aspect of any of the above inventive embodiment, wherein the component polymer is comprised of repeat units of structures (I), (III), (V) and (VI), the alkyleneoxyalkyleneacetal moiety (-alkylene-O-alkyleneO—CH(CH$_3$)—O—), is a moiety having structure (VIIc) wherein ac is an integer from 2 to 4.

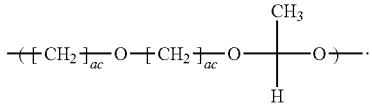

(VIIc)

In another aspect of any of the above inventive embodiment, wherein the component polymer is comprised of repeat units of structures (I), (III), (V) and (VI), the alkyleneoxyalkyleneacetal moiety (-alkylene-O-alkyleneO—CH(CH₃)—O—), is a moiety having structure (VIIc).

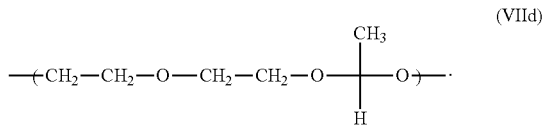
(VIId)

Novolak Resins Functionalized Both with a Mono-Functional Acetal Moiety and an Acetal Comprising Linking Group Attached to a PAC Moiety (PACb).

In another aspect of this inventive composition in any of the above embodiments wherein said polymer component is a polymer comprising repeat units repeat units having structures (I), and (II), said polymers may further comprise a repeat unit of structure (VI), wherein Rp is a C-1 to C-4 alkyl, Rq is a —X-Phenol, wherein X is —O—, —C(CH₃)₂—, —(C═O)— or —SO₂—, and np is 0 to 3; nq, is 0 or 1, and the sum of np and nq, does not exceed 3. In another embodiment of this aspect of the invention, the repeat unit of structure (VI) is present up to about 20 mole % of the repeat units in said polymer component. In another aspect of this embodiment, the repeat unit of structure (VI) is present up to about 10 mole %.

In another aspect of any of the above inventive embodiments, wherein the component polymer is comprised of a repeat unit of structure (VI), it is one wherein this repeat unit is present up to about 10 mole %.

In another aspect of any of the above inventive embodiments, wherein the component polymer is comprised of a repeat unit of structure (VI), it is one wherein nq is 0.

In another aspect of any of the above inventive embodiments, wherein the component polymer is comprised of a repeat unit of structure (VI), it is one wherein Rp is methyl.

In another aspect of any of the above inventive embodiments, wherein the component polymer is comprised of a repeat unit of structure (VI), it is one wherein np is 1.

In another aspect of any of the above inventive embodiments, wherein the component polymer is comprised of a repeat unit of structure (VI), it is one wherein Rr is methyl.

In another aspect of any of the above inventive embodiments, wherein the component polymer is comprised of a repeat unit of structure (VI), it is one wherein Xd is an alkyleneacetal moiety (-alkyleneO—CH(CH₃)—O—).

In another aspect of any of the above inventive embodiments, wherein the component polymer is comprised of a repeat unit of structure (VI), it is one wherein Xd is an alkyleneacetal moiety (-alkyleneO—CH(CH₃)—O—), the alkylene portion of the alkyleneacetal moiety, is selected from the group consisting of ethylene, propylene, a moiety having structure (VII) and a moiety having structure (VIIa).

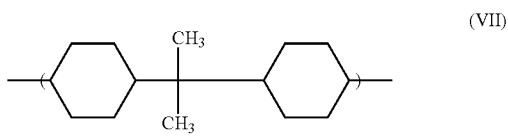
(VII)

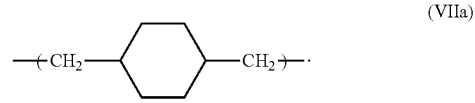
(VIIa)

In another aspect of any of the above inventive embodiments, wherein the component polymer is comprised of a repeat unit of structure (VI), it is one wherein Xd is an alkyleneacetal moiety (-alkyleneO—CH(CH₃)—O—), the alkylene portion of the alkyleneacetal moiety, is a moiety having structure (VII).

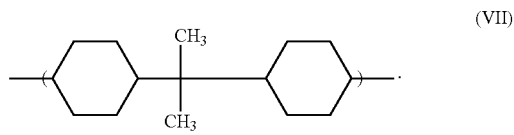
(VII)

In another aspect of any of the above inventive embodiments, wherein the component polymer is comprised of a repeat unit of structure (VI), it is one wherein Xd is an alkyleneacetal moiety (-alkyleneO—CH(CH₃)—O—), the alkylene portion of the alkyleneacetal moiety, is a moiety having structure (VIIa)

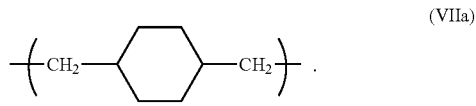
(VIIa)

In another aspect of any of the above inventive embodiments, wherein the component polymer is comprised of a repeat unit of structure (VI), it is one wherein Xd is an alkyleneoxyalkyleneacetal moiety (-alkylene-O-alkyleneO—CH(CH₃)—O—).

In another aspect of any of the above inventive embodiments, wherein the component polymer is comprised of a repeat unit of structure (VI), it is one wherein the alkyleneoxyalkyleneacetal moiety (-alkylene-O-alkyleneO—CH(CH₃)—O—), is a moiety wherein the alkylene portions are selected independently from a C-2 to C-8 alkylene moiety.

In another aspect of any of the above inventive embodiments, wherein the component polymer is comprised of a repeat unit of structure (VI), it is one wherein the alkyleneoxyalkyleneacetal moiety (-alkylene-O-alkyleneO—CH(CH₃)—O—), is a moiety wherein the alkylene portions are selected independently from a C-2 to C-4 alkylene moiety.

In another aspect of any of the above inventive embodiments, wherein the component polymer is comprised of a repeat unit of structure (VI), it is one wherein the alkyleneoxyalkyleneacetal moiety (-alkylene-O-alkyleneO—CH(CH₃)—O—), is a moiety having structure (VIIc) wherein ac is an integer from 2 to 4.

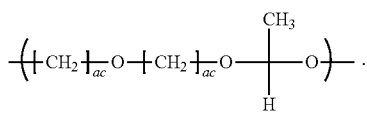

In another aspect of any of the above inventive embodiments, wherein the component polymer is comprised of a repeat unit of structure (VI), it is one wherein the alkyleneoxyalkyleneacetal moiety (-alkylene-O-alkyleneO—CH(CH₃)—O—), is a moiety having structure (VIId).

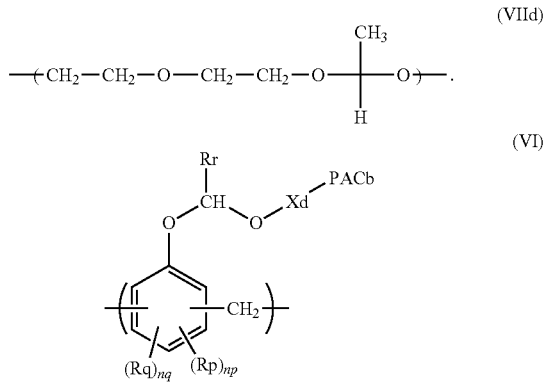

(VIId)

(VI)

Novolak Resins Linked by Di-Functional Acetal Comprising Moieties Also Comprising Mono-Functional Alkyl Acetal Moieties In another aspect of this inventive composition in any of the above embodiments wherein said polymer component is either a polymer comprising repeat units having structures (I), (III), and (IV), a polymer comprising repeat units having structures (I), (III), (IV) and (VI), or a polymer comprising repeat units having structures (I), (III), (V) and (VI), said polymers may further comprise a repeat unit of structure (II). In these embodiments, repeat unit of structure (II) is one wherein Rc is C-1 to C-4 alkyl; Rd, is a —X-Phenol, wherein X is —O—, —C(CH$_3$)$_2$—, —(C=O)— or —SO$_2$— and nc, is 0 to 3; nd, is 0 or 1, and the sum of nc and nd, does not exceed 3. Further, in these embodiments the repeat unit of structure (II) may have Re, and Rf, and Rr from a C-1 to C-4 alkyl. In another aspect of these above embodiments, the additional repeat unit of structure (II) is present up to about 40 mole %. In another aspect of these above embodiments, the repeat unit having structure (II) has nd=0. In yet another aspect of these above embodiments, the repeat unit having structure (II) is present up to about 20 mole %. In yet another embodiment of this embodiment nc equals 1. In yet another embodiment of this above polymer, Re is methyl. In yet another embodiment of this above polymer, Rf is ethyl. In yet another embodiment of this above polymer, Rc is ethyl.

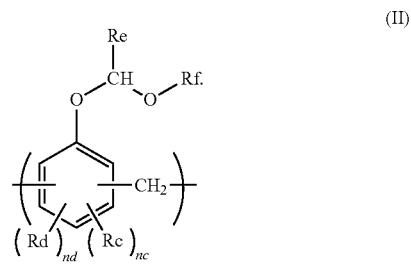

(II)

In another embodiment of this inventive composition, any of the above embodiment of the composition which have polymer component comprising a repeat unit of structure (VI), having an attached PACb, photoactive moiety, may have compositions which additionally a free photoactive compound (PAC), which is a separate PAC compound not attached to the polymer component.

In a specific embodiment of this inventive composition described above, the polymer components are selected either from ones comprising repeat units of structure (I), (III), and (IV), or ones comprising repeat units of structures (I), (III), (IV) and (VI), wherein, in the repeat units of structure (IV), the moiety Xa is an alkylene, an -alkyleneoxyalkylene- moiety. In another embodiment of this aspect of the invention the moiety Xa is the alkylene moiety ethylene. In still another embodiment, Xa is the alkylene moiety of structure (VII). In yet another embodiment, the moiety Xa is the alkylene moiety of structure (VIIa).

In another embodiment of this aspect of the invention the moiety Xa is an alkylene, an -alkyleneoxyalkylene- moiety, an -alkylene(-O-alkylene)$_{x'}$- moiety wherein x' is 2 to 6.

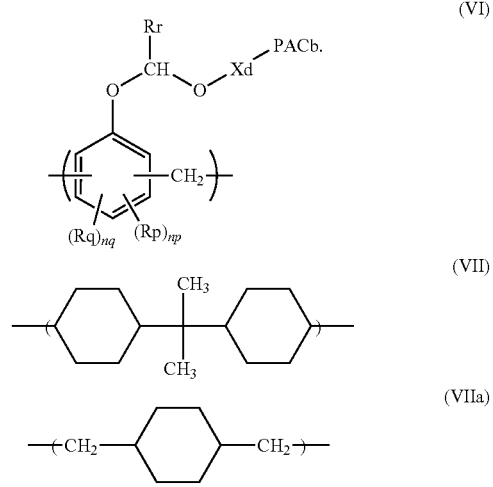

(VI)

(VII)

(VIIa)

In another embodiment of this inventive composition described above the polymer components are selected either from ones comprising repeat units of structure (I), (III), and (IV), or ones comprising repeat units of structures (I), (III), (IV) and (VI), wherein, in the repeat units of structure (IV), the moiety Xa is an -alkyleneoxyalkylene- moiety. Also, in this aspect said composition is one wherein, said PAC component is comprised of a free PAC component. In another embodiment of this aspect of the invention the linking moiety Xa is and -alkyleneoxyalkylene -moiety of structure (VIIb).

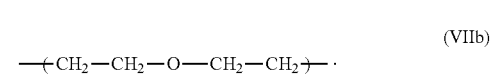

(VIIb)

In another specific aspect of this inventive composition in any of the above embodiments wherein said polymer component is a polymer comprising repeat units repeat units having structures (I), (II), (III), and (IV), wherein the repeat units having structures (III) and (IV) are attached together through the positions designated by ∿∿∿, forming a di-functional acetal comprising moiety, forming a linking point in said polymer component between two different polymer chains in said polymer component. In this aspect, Ra, Rg and Rk are independently a C-1 to C-4 alkyl; Rb, Rh, and Rl are independently a —X-Phenol, wherein X is —O—, —C(CH$_3$)$_2$—, —(C=O)— or —SO$_2$—. Furthermore, in this aspect, na, ng, and nk independently, are 0 to 3; nb, nh, and nl, independently are 0 or 1, the sum of na and nb, the sum of ng and nh, and the sum of nk and nl, respectively, do not exceed 3. Furthermore, in this aspect, Ri and Rm are independently selected from a C-1 to C-4 alkyl, and further; Xa is an alkylene, an -alkyleneoxyalkylene- moiety, or an -alkylene(-O-alkylene)$_{x'}$- moiety wherein x' is 2 to 6. Also, in this aspect said composition is one wherein, said PAC component is comprised of a free PAC component. In these embodiments, repeat unit of structure (II) is one wherein Rc is C-1 to C-4 alkyl; Rd, is a —X-Phenol, wherein X is —O—, —C(CH$_3$)$_2$—, —(C=O)— or —SO$_2$— and nc, is 0 to 3; nd, is 0 or 1, and the sum of nc and nd, does not exceed 3. Further, of these above embodiments, the repeat unit of structure (II) may have Re, and Rf, and Rr from a C-1 to C-4 alkyl. In another aspect of these above embodiments, nb, nd, nh and nl may all be 0. In another aspect of these above embodiments, na, nc, ng and nk may all be 1. In yet another aspect of these above embodiments, Ra, Rc, Rg and Rk may all be methyl.

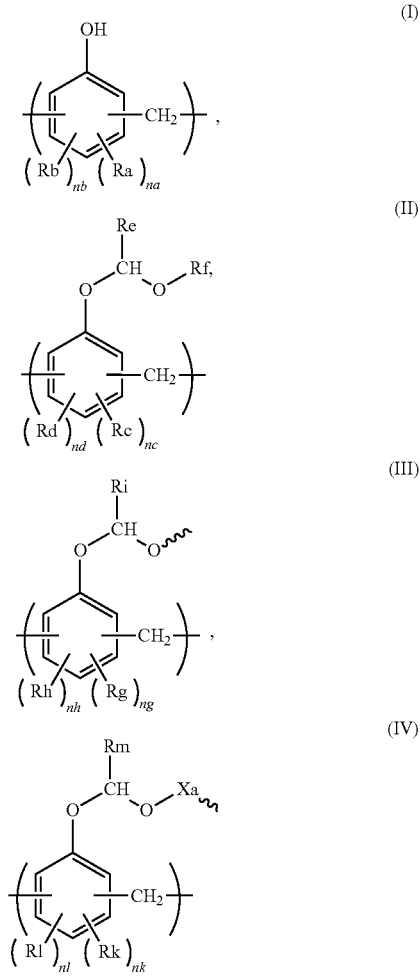

Another aspect of said above polymer component comprising repeat units having structures (I), (II), (III), and (IV), the repeat unit of structure (II) may be present up to about 40 mole %. In yet another aspect of these above embodiments, the repeat unit having structure (II) is present up to about 20 mole %.

Another aspect of said above polymer component comprising repeat units having structures (I), (II), (III), and (IV), is one wherein, the repeat unit having structure (I) is present from about 60 mole % to about 98 mole %.

Another aspect of said above polymer component comprising repeat units having structures (I), (II), (III), and (IV), is one wherein, the repeat unit having structure (I) is present from about 70 mole % to about 98 mole %.

Another aspect of said above polymer component comprising repeat units having structures (I), (II), (III), and (IV), is one wherein, the repeat unit having structure (I) is present from about 70 mole % to about 80 mole %.

Another aspect of said above polymer component comprising repeat units having structures (I), (II), (III), and (IV), is one wherein the linking point between two polymer chains of the polymer components, formed by the repeat units of structure (III) and structure (IV) is present up to about 25 mole % of the polymer component's repeat units.

Another aspect of said above polymer component comprising repeat units having structures (I), (II), (III), and (IV), is one wherein the linking point between two polymer chains of the polymer components, formed by the repeat units of structure (III) and structure (IV) is present up to about 10 mole % of the polymer component's repeat units.

Another aspect of said above polymer component comprising repeat units having structures (I), (II), (III), and (IV), is one wherein nb, nd, nh and nl are 0.

Another aspect of said above polymer component comprising repeat units having structures (I), (II), (III), and (IV), is one wherein na, nc, ng, and nk are 1.

In another aspect of the above embodiment with repeat units having structures (I), (III), and (IV), it is one wherein and Ra, Rc, and Rg and Rk are methyl.

Another aspect of said above polymer component comprising repeat units having structures (I), (II), (III), and (IV), is one wherein Ri is methyl.

Another aspect of said above polymer component comprising repeat units having structures (I), (II), (III), and (IV), is one wherein Rm is methyl.

Another aspect of said above polymer component comprising repeat units having structures (I), (II), (III), and (IV), is one wherein Xa is an alkylene moiety.

Another aspect of said above polymer component comprising repeat units having structures (I), (II), (III), and (IV), is one wherein Xa is an -alkyleneoxyalkylene- moiety, or an -alkylene(-O-alkylene)$_{x'}$- moiety wherein x' is 2 to 6.

In another aspect of any of the above inventive embodiments wherein the component polymer is comprised of repeat units of structures (I), (II), (III), and (IV), Xa is an alkylenexoxyalkylene moiety.

In another aspect of any of the above inventive embodiments wherein the component polymer is comprised of repeat units of structures (I), (II), (III), and (IV), Xa is an alkylene moiety selected from the group consisting of ethylene, propylene, butylene, a moiety of structure (VII), and a moiety of structure (VIIa).

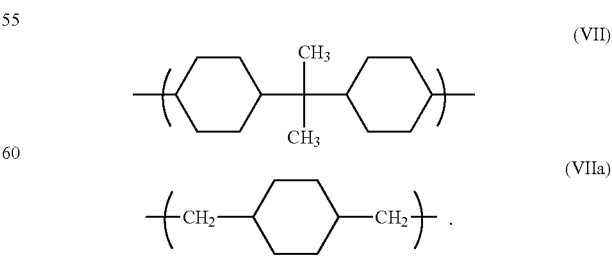

In another aspect of any of the above inventive embodiments wherein the component polymer is comprised of repeat units of structures (I), (II), (III), and (IV), Xa is a moiety having structure (VII) or a moiety having structure (VIIa).

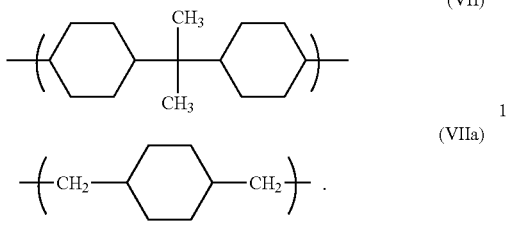

(VII)

(VIIa)

In another aspect of any of the above inventive embodiments wherein the component polymer is comprised of repeat units of structures (I), (II), (III), and (IV), Xa is a moiety having structure (VIIa).

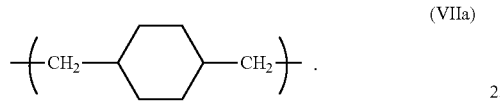

(VIIa)

In another aspect of any of the above inventive embodiments wherein the component polymer is comprised of repeat units of structures (I), (II), (III), and (IV), the linking moiety Xa in the repeat units of structure (IV) is an -alkyleneoxyalkylene- of structure (VIIb).

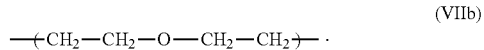

(VIIb)

In another aspect of any of the above inventive embodiments wherein the component polymer is comprised of repeat units of structures (I), (II), (III), and (IV), Xa is —(CH$_2$—CH$_2$—O—CH$_2$—CH$_2$)—.

Attached PAC (PACb) Component

In another more specific embodiment of this inventive composition described above, for the embodiments in which the polymer component comprises a repeat unit of structure (VI), these embodiments are ones wherein Xd is selected from the group consisting of the following;
  a direct valence bond,
  an alkylene moiety,
  an alkyleneoxy moiety, wherein the alkylene end is attached to the acetal oxygen moiety of the repeat unit of structure (VI), and the oxy end of the alkyleneoxy moiety is attached to the PACb moiety, and
  a moiety comprising an acetal selected from the group consisting of the following;
    an alkyleneacetal moiety (-alkyleneO—CH(CH$_3$)—O—),
    an alkyleneoxyalkyleneacetal moiety (-alkylene-O-alkyleneO—CH(CH$_3$)—O—), and
    an alkylene(oligooxyalkylene)acetal, (-alkylene(-O-alkylene)$_x$-O—CH(CH$_3$)—O—),
      wherein x is 2 to 6, and further wherein, in each of said acetal comprising moiety, the alkylene end of this moiety is attached to the acetal oxygen moiety of the repeat unit of structure (VI), and the acetal portion of said moiety comprising an acetal is attached to the PACb moiety, and further wherein; in these embodiments said PACb moieties are selected from a single compound or a mixture of compounds having structure (VIII), wherein D$_1$, D$_2$, and D$_3$ are individually selected from H or a moiety having structure (VIIIa), and further wherein at least one of D$_1$, D$_2$, or D$_3$ is a moiety having structure (VIIIa), wherein ⁓⁓⁓ designates the attachment point each PACb moiety to an individual repeat unit of structure (VI).

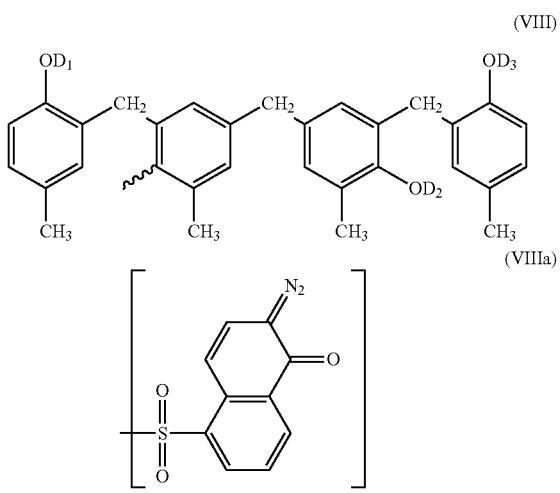

(VIII)

(VIIIa)

In another embodiment of this inventive composition described above, for the embodiments in which the polymer component comprises a repeat unit of structure (VI), the polymer components comprising a repeat unit of structure (VI), is one wherein, Xd is selected from the group consisting of the following;
  a direct valence bond,
  an alkylene moiety,
  an alkyleneoxy moiety, wherein the alkylene end is attached to the acetal oxygen moiety of the repeat unit of structure (VI), and the oxy end of the alkyleneoxy moiety is attached to the PACb moiety, and
  a moiety comprising an acetal selected from the group consisting of the following;
    an alkyleneacetal moiety (-alkyleneO—CH(CH$_3$)—O—),
    an alkyleneoxyalkyleneacetal moiety (-alkylene-O-alkyleneO—CH(CH$_3$)—O—), and
    an alkylene(oligooxyalkylene)acetal, (-alkylene(-O-alkylene)$_x$-O—CH(CH$_3$)—O—),
      wherein x is 2 to 6, and further wherein, in each of said acetal comprising moiety, the alkylene end of this moiety is attached to the acetal oxygen moiety of the repeat unit of structure (VI), and the acetal portion of said moiety comprising an acetal is attached to the PACb moiety, and further wherein PACb moieties are selected from a single moiety or a mixture of moieties having structure (VIII), wherein D$_1$, D$_2$, and D$_3$ are individually selected from H or a moiety having structure (VIIIb), and further wherein at least one of D$_1$, D$_2$, or D$_3$ is a moiety having structure (VIIIb), wherein ⁓⁓⁓ designates the attachment point each PACb moiety to an individual repeat unit of structure (VI).

(VIII)

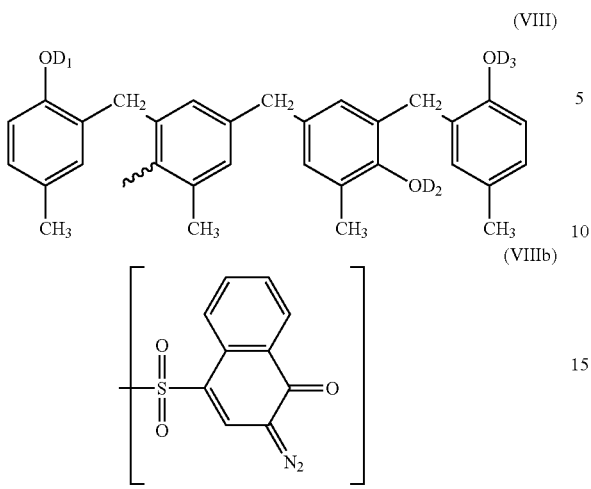

(VIIIb)

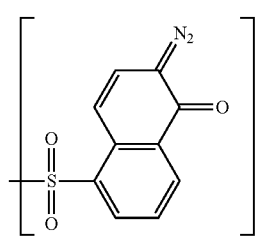

In another embodiment of this inventive composition described above, for the embodiments in which the polymer component comprises a repeat unit of structure (VI), the polymer components comprising a repeat unit of structure (VI), is one wherein, Xd is selected the group consisting of the following;
a direct valence bond,
an alkylene moiety,
an alkyleneoxy moiety, wherein the alkylene end is attached to the acetal oxygen moiety of the repeat unit of structure (VI), and the oxy end of the alkyleneoxy moiety is attached to the PACb moiety, and
a moiety comprising an acetal selected from the group consisting of the following;
an alkyleneacetal moiety (-alkyleneO—CH(CH$_3$)—O—),
an alkyleneoxyalkyleneacetal moiety (-alkylene-O-alkyleneO—CH(CH$_3$)—O—), and
an alkylene(oligooxyalkylene)acetal, (-alkylene(-O-alkylene)$_x$-O—CH(CH$_3$)—O—),
wherein x is 2 to 6, and further wherein, in each of said acetal comprising moiety, the alkylene end of this moiety is attached to the acetal oxygen moiety of the repeat unit of structure (VI), and the acetal portion of said moiety comprising an acetal is attached to the PACb moiety, and further wherein the PACb moieties are selected from a single moiety or a mixture of moieties having structure (VIIIc), wherein D$_{1a}$, D$_{2a}$, and D$_{3a}$ are individually selected from H or a moiety having structure (VIIIa), and further wherein at least one of D$_{1a}$, D$_{2a}$, or D$_{3a}$ is a moiety having structure (VIIIa), wherein ⌇⌇⌇ designates the attachment point each PACb moiety to an individual repeat unit of structure (VI).

(VIIIc)

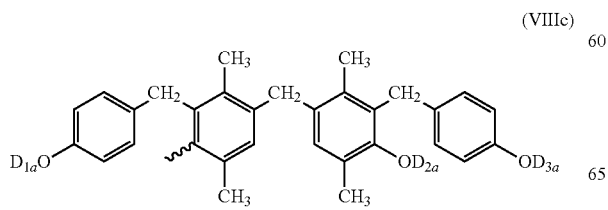

(VIIIa)

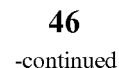

In another embodiment of this inventive composition described above, for the embodiments in which the polymer component comprises a repeat unit of structure (VI), the polymer components comprising a repeat unit of structure (VI), is one wherein, Xd is selected from the group consisting of the following;
a direct valence bond,
an alkylene moiety,
an alkyleneoxy moiety, wherein the alkylene end is attached to the acetal oxygen moiety of the repeat unit of structure (VI), and the oxy end of the alkyleneoxy moiety is attached to the PACb moiety, and
a moiety comprising an acetal selected from the group consisting of the following;
an alkyleneacetal moiety (-alkyleneO—CH(CH$_3$)—O—),
an alkyleneoxyalkyleneacetal moiety (-alkylene-O-alkyleneO—CH(CH$_3$)—O—), and
an alkylene(oligooxyalkylene)acetal, (-alkylene(-O-alkylene)$_x$-O—CH(CH$_3$)—O—),
wherein x is 2 to 6, and further wherein, in each of said acetal comprising moiety, the alkylene end of this moiety is attached to the acetal oxygen moiety of the repeat unit of structure (VI), and the acetal portion of said moiety comprising an acetal is attached to the PACb moiety,
and further wherein, said PACb moieties are selected from a single moiety or a mixture of moieties having structure (VIIIc), wherein D$_{1a}$, D$_{2a}$, and D$_{3a}$ are individually selected from H or a moiety having structure (VIIIb), and further wherein at least one of D$_{1a}$, D$_{2a}$, or D$_{3a}$ is a moiety having structure (VIIIb), wherein ⌇⌇⌇ designates the attachment point each PACb moiety to an individual repeat unit of structure (VI).

(VIIIc)

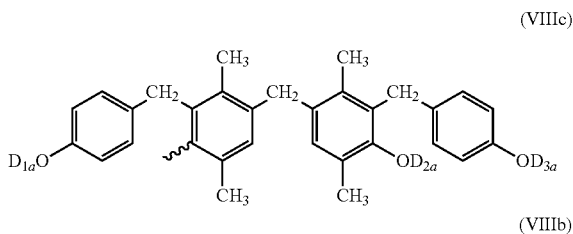

(VIIIb)

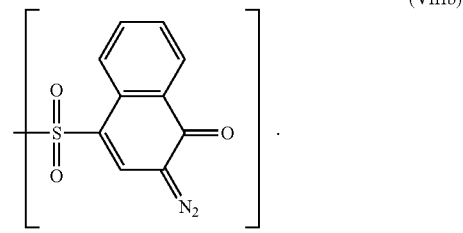

.

In another embodiment of this inventive composition described above, for the embodiments in which the polymer component comprises a repeat unit of structure (VI), the polymer components comprising a repeat unit of structure (VI), is one wherein, Xd is selected from the group consisting of the following;
- a direct valence bond,
- an alkylene moiety,
- an alkyleneoxy moiety, wherein the alkylene end is attached to the acetal oxygen moiety of the repeat unit of structure (VI), and the oxy end of the alkyleneoxy moiety is attached to the PACb moiety, and
- a moiety comprising an acetal selected from the group consisting of the following;
  - an alkyleneacetal moiety (-alkyleneO—CH(CH$_3$)—O—),
  - an alkyleneoxyalkyleneacetal moiety (-alkylene-O-alkyleneO—CH(CH$_3$)—O—), and
  - an alkylene(oligooxyalkylene)acetal, (-alkylene(-O-alkylene)$_x$-O—CH(CH$_3$)—O—),
  - wherein x is 2 to 6, and further wherein, in each of said acetal comprising moiety, the alkylene end of this moiety is attached to the acetal oxygen moiety of the repeat unit of structure (VI), and the acetal portion of said moiety comprising an acetal is attached to the PACb moiety, and further wherein the PACb moieties are selected from a single moiety or a mixture of moieties having structure (VIIId), wherein D$_{1b}$, D$_{2b}$, and D$_{3b}$ are individually selected from H or a moiety having structure (VIIIa), and further wherein at least one of D$_{1b}$, D$_{2b}$, or D$_{3b}$ is a moiety having structure (VIIIa), wherein ⁓⁓⁓ designates the attachment point each PACb moiety to an individual repeat unit of structure (VI).

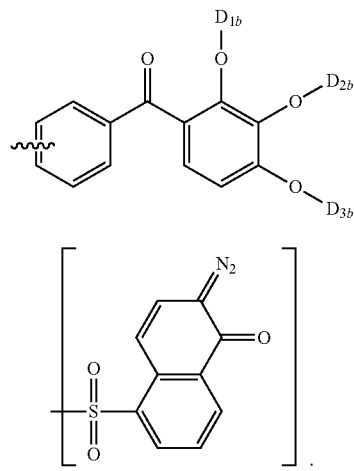

(VIIId)

(VIIIa)

In another embodiment of this inventive composition described above, for the embodiments in which the polymer component comprises a repeat unit of structure (VI), the polymer components comprising a repeat unit of structure (VI), is one wherein, Xd is selected from the group consisting of the following;
- a direct valence bond,
- an alkylene moiety,
- an alkyleneoxy moiety, wherein the alkylene end is attached to the acetal oxygen moiety of the repeat unit of structure (VI), and the oxy end of the alkyleneoxy moiety is attached to the PACb moiety, and
- a moiety comprising an acetal selected from the group consisting of the following;
  - an alkyleneacetal moiety (-alkyleneO—CH(CH$_3$)—O—),
  - an alkyleneoxyalkyleneacetal moiety (-alkylene-O-alkyleneO—CH(CH$_3$)—O—), and
  - an alkylene(oligooxyalkylene)acetal, (-alkylene(-O-alkylene)$_x$-O—CH(CH$_3$)—O—),
  - wherein x is 2 to 6, and further wherein, in each of said acetal comprising moiety, the alkylene end of this moiety is attached to the acetal oxygen moiety of the repeat unit of structure (VI), and the acetal portion of said moiety comprising an acetal is attached to the PACb moiety, and further wherein PACb moieties are selected from a single moiety or a mixture of moieties having structure (VIIId), wherein D$_{1b}$, D$_{2b}$, and D$_{3b}$ are individually selected from H or a moiety having structure (VIIIb), and further wherein at least one of D$_{1b}$, D$_{2b}$, or D$_{3b}$ is a moiety having structure (VIIIb), wherein ⁓⁓⁓ designates the attachment point each PACb moiety to an individual repeat unit of structure (VI).

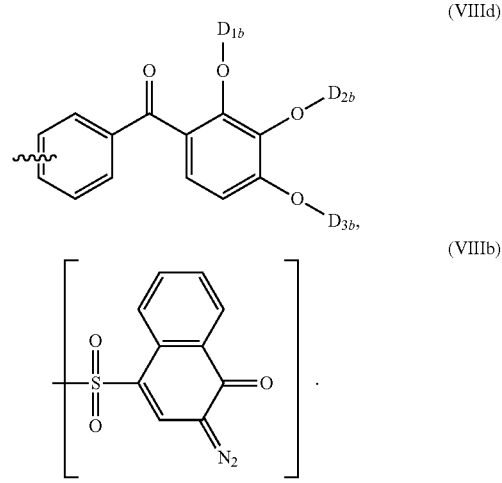

(VIIId)

(VIIIb)

PAG Component

In another embodiment of this invention composition it is any of the above described composition wherein said PAG component is either selected from the group consisting of aromatic imide N-oxysulfonate derivatives of an organic sulfonic acid, an aromatic sulfonium salts of an organic sulfonic acid and trihalotriazine derivatives, or a mixture of PAG's selected from this group.

For example, more specifically, said PAG component may be one which generates, upon 365 nm and/or broadband irradiation, a photoacid such as a sulfonic acid, such as alkylsulfonic acid, aryl sulfonic acid or fluoroalkylsulfonic acid, perfluorosulfonic acid, inorganic acid such as HAsF$_6$, HSbF$_6$, HPF6, or acid derived from tetra(perfluorophenyl) borates, H(perf-Ph)$_4$B, or similar tetra(perfluoroaryl)borates, H(perf-Aryl)$_4$B. Non limiting examples of such PAG's are such photoacid generator include a variety of photoacid generators, such as onium salts, dicarboximidyl sulfonate esters, oxime sulfonate esters, diazo(sulfonyl methyl) compounds, disulfonyl methylene hydrazine compounds, nitrobenzyl sulfonate esters, biimidazole compounds, diazomethane derivatives, glyoxime derivatives, (3-ketosulfone derivatives, disulfone derivatives, sulfonic acid ester derivatives, imidoyl sulfonate derivatives, compounds, diazonaphthoquinone sulfonate esters or combinations thereof. Such photoacid generators may inherently be sensitive to 365 nm and/or broadband radiation by appropriate substitution as known in the art. More specifically, these may, for instance, as non-limiting examples, be substituted or unsubstituted triarylsulfonium salt of an organic sulfonic acids, wherein in the triarylsulfonium moiety or its corresponding acid anion contains at least one aryl moiety which has a conjugated aryl, wherein the conjugated aryl moiety is either selected from a phenyl ring with at least one substituent selected from the aryloxy, alkyloxy, nitro, cyano, acetyl, aryl, alkenyl, alkyloxyaryl (alkyl-O-aryl-), dialkyloxyaryl ((alkyl-O-)$_2$-aryl), or wherein the conjugated aryl moiety, alternatively, is a substituted or unsubstituted fused aromatic ring moiety comprising 2 to 4 rings. Such substituents may be attached through a difunctional moiety capable of undergoing a resonance delocalization, such as arylene, including arylenes derived from a fused aromatic, or for example ethenylene (—C=C—) moieties. ethenyl (CH$_2$=CH—), phenylethenyl (Ph-CH=CH—), arylethenyl (Aryl-CH=CH—), and substituents comprising ethenylenearylene moieties (e.g. Ar(—CH=CH—Ar—)$_z$ where z is 1-3.

Specific, non-limiting examples of substituted aryl and substituted aryl ethenyl substituent are as follows, wherein ⁓⁓⁓ represents the point of attachment:

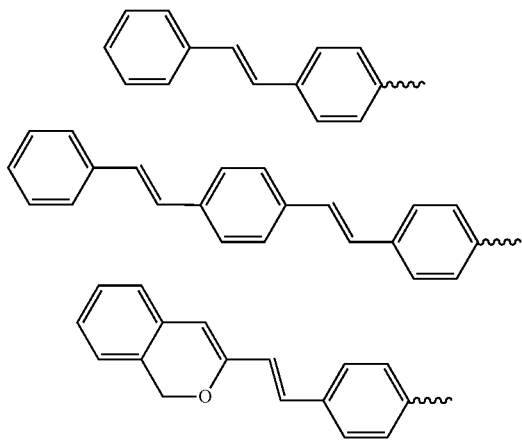

Figure 2:
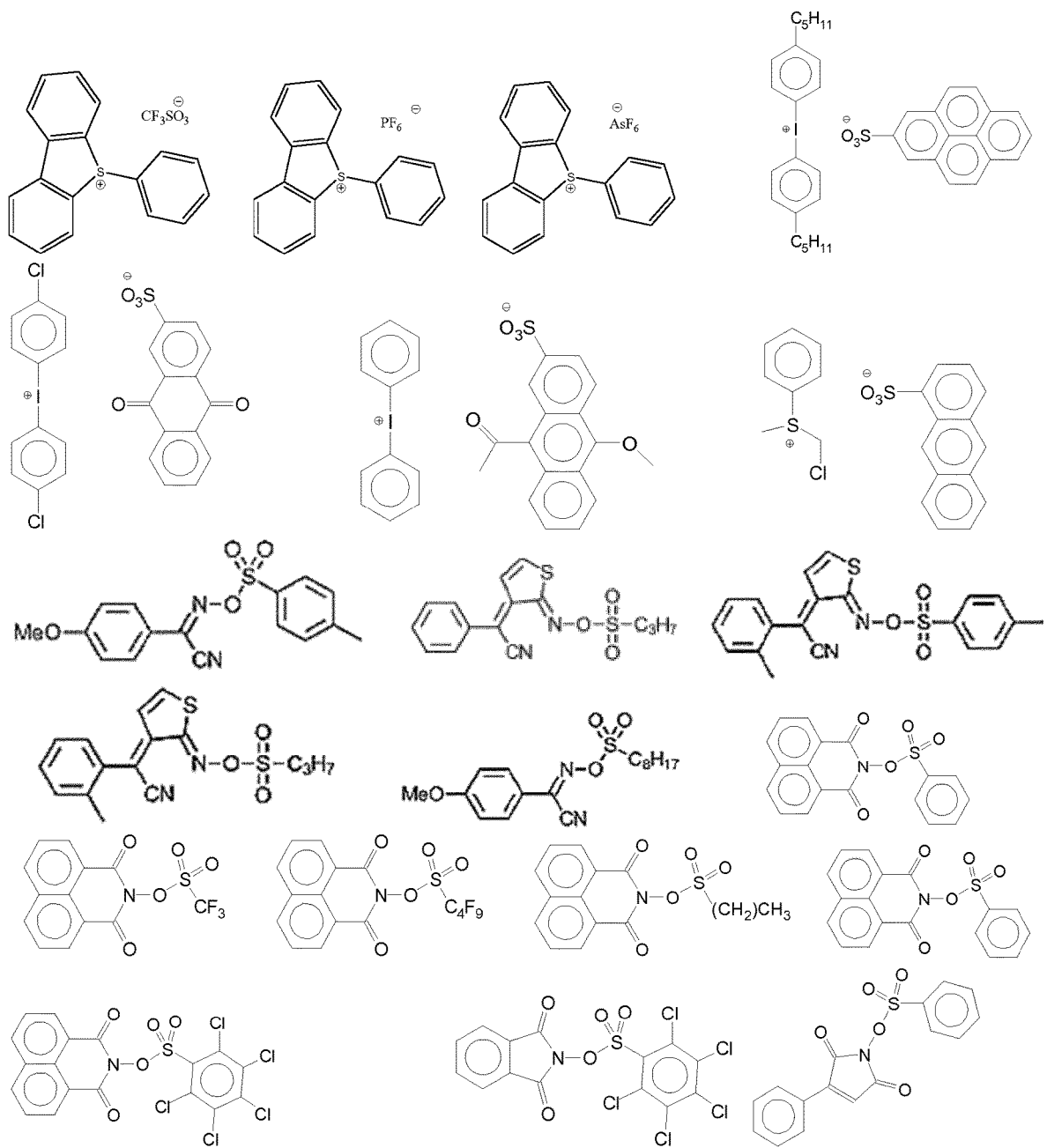
FIG. 2 Shows non-limiting examples of photoacid generators which generate sulfonic, and other strong acids.

Other examples of common PAG's sensitive to 365 nm and/or broadband radiation are substituted or unsubstituted 1,3-dioxo-1H-benzo[de]isoquinolin-2(3H)-yl ester organic sulfonic acids. FIG. 2 shows non-limiting examples of the above described PAG's. These PAG's may also have substituents as described above.

In another aspect of this novel composition said PAG component may be one wherein the photoacid generator itself, is not directly sensitive to i-line or broadband radiation, but which has been sensitized to this radiation with photosensitizers that extend the effective wavelength and/or energy range. Such photosensitizers may be, without limitation, substituted and unsubstituted anthracenes, substituted and unsubstituted phenothiazines, substituted and unsubstituted perylenes, substituted and unsubstituted pyrenes, and aromatic carbonyl compounds, such as benzophenone and thioxanthone, fluorene, carbazole, indole, benzocarbazole, acridone chlorpromazine, equivalents thereof or combinations of any of the foregoing.

In other embodiment of this invention, said PAG component may be a trihalomethyl derivative, and it may be one which contains 1 to 3 trihalomethyl substituents. In another embodiment of this aspect of the invention, the trihalomethyl derivative is an arene or substituted arene comprising from 1 to 3 trihalomethyl substituents. In another aspect of this embodiment said trihalomethyl derivative may be one which contains 1 to 3 trihalomethyl substituents which are attached to said arene or substituted arene moiety through a sulfone spacer (—SO$_2$—).

Figure 3:
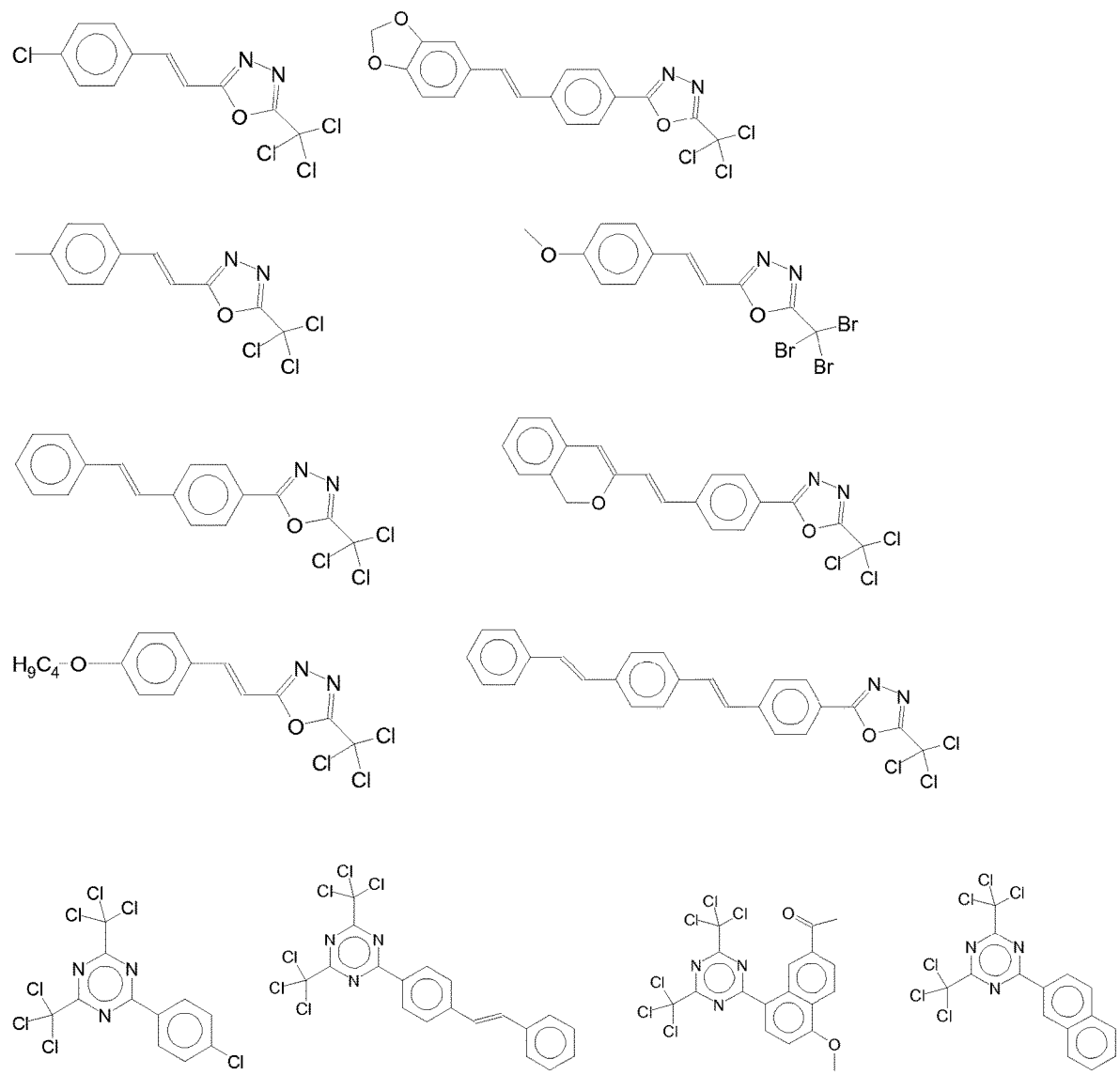
FIG. 3 Shows non-limiting examples of photoacid generators which generate either HCl HBr.

FIG. 3 shows non-limiting examples of i-line (broadband) trihalo photoacid generators which generate either HCl or HBr.

In another embodiment of this invention, wherein said PAG component is a trihalomethyl it may be one of a heteroarene or substituted heteroarene comprising 1 to 3 trihalomethyl moieties.

another embodiment of this invention, wherein said PAG component is a trihalomethyl, it may be a derivative of an heteroarene or substituted heteroarene comprising from 1 to 3 trihalomethyl substituents which are attached to said heteroarene or substituted heteroarene through a sulfone spacer (—SO$_2$—).

In another embodiment of this invention composition it is any of the above described composition wherein said PAG component is either selected from the group consisting of compounds having structures (IXa), structures (IXb) and structures (IXc), or a mixture of compounds selected from this group; wherein $R_{1p}$ is a fluoroalkyl moiety, and $R_{2p}$ is H, an alkyl, an oxyalkyl, a thioalkyl, or an aryl moiety; wherein $R_{3p}$ is a fluoroalkyl, an alkyl or an aryl moiety, and $R_{4p}$ is H, an alkyl, an oxyalkyl, a thioalkyl, or an aryl moiety; and further wherein X is Cl or Br, $R_{5p}$ is an aryl, or an alkyl moiety, and n is 0 or 1;

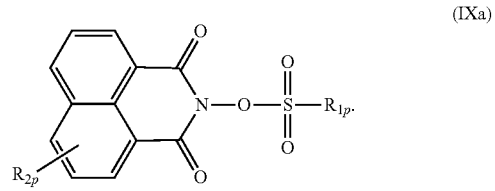
(IXa)

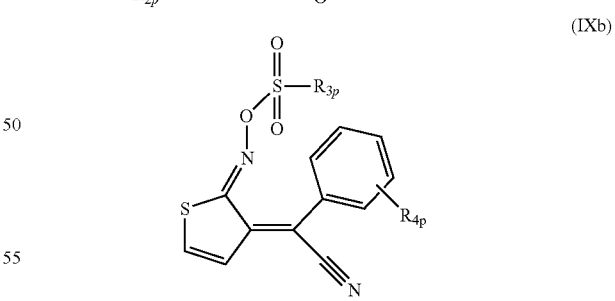
(IXb)

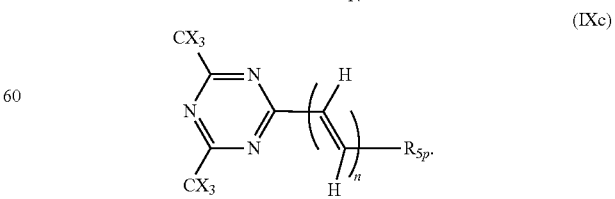
(IXc)

In another embodiment of the inventive composition said PAG component may be a trihalomethyl derivative, having structure (IXd), wherein $R_{6p}$ is a substituted or unsubstituted alkenyl or substituted or unsubstituted aryl group, or a substituted or unsubstituted fused aromatic ring moiety comprising 2 to 4 rings and Y is oxygen or nitrogen and X is Cl or Br.

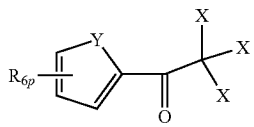

(IXd)

In another embodiment of the inventive composition said PAG component may be a trihalomethyl derivative, may be an oxazole or substituted oxazone having structure (IXe), wherein $R_{7p}$ is a substituted or unsubstituted alkenyl or substituted or unsubstituted aryl group, and X is Cl or Br.

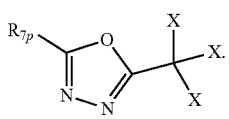

(IXe)

In another embodiment of the inventive composition said PAG component may be a trihalomethyl derivative, derivative of a substituted triazine comprising 1 or 2 trihalomethyl moieties.

In another embodiment of the inventive composition said PAG component may be a trihalomethyl derivative, it may be a trihalo methyl derivative having structure (IXf), wherein X is Br or Cl and $R_{8p}$ is a unsubstituted or substituted alkenyl, an unsubstituted aryl or a substituted aryl moiety, or a substituted or unsubstituted fused aromatic ring moiety comprising 2 to 4 rings.

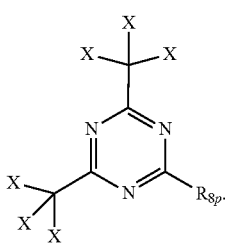

(IXf)

In another embodiment of the inventive composition said PAG component may be a trihalomethyl derivative, it may be a derivative having structure (IXg), and $R_{9p}$ is a unsubstituted or substituted alkenyl or an unsubstituted aryl or substituted aryl moiety.

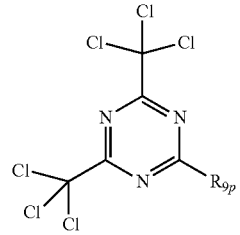

(IXg)

Free PAC Component

In other embodiments of the above inventive composition described above, wherein it comprises a free PAC component, this PAC component may be derived from a 1,2-diazonaphthoquinone-5-sulfonate compound or a 1,2-diazonaphthoquinone-4-sulfonate compound. FIG. 1 shows non-limiting examples of these types of DNQ PAC's, which may be used as free PAC component; wherein, in this FIG., the moiety D is H or a moiety selected from VIIIa and VIIIb, wherein in each compound depicted in this FIG. at least one D is either a moiety of structure VIIIa or VIIIb.

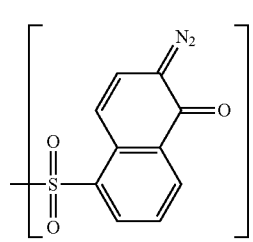

(VIIIa)

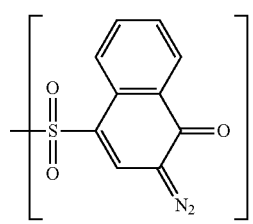

(VIIIb)

In other embodiments of the above inventive composition described above, wherein it comprises a free PAC component, this PAC component is either a single PAC compound or a mixture of PAC compounds having structure (X), wherein $D_{1c}$, $D_{2c}$, $D_{3c}$, and $D_{4c}$ are individually selected from H or a moiety having structure (VIIIa), and further wherein at least one of $D_{1c}$, $D_{2c}$, $D_{3C}$ or $D_{4C}$ is a moiety having structure (VIIIa).

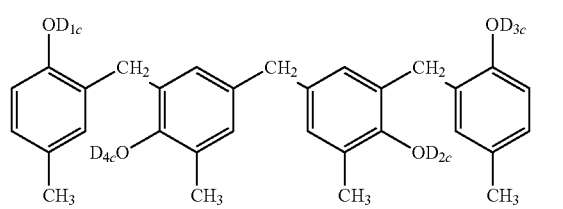

(X)

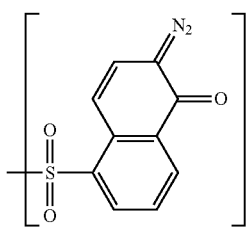

(VIIIa)

In other embodiments of the above inventive composition described above, wherein it comprises a free PAC component, this PAC component is either a single PAC compound or a mixture of PAC compounds having structure (X), wherein $D_{1c}$, $D_{2c}$, $D_{3c}$ and $D_{4c}$ are individually selected from H or a moiety having structure (VIIIb), and further wherein at least one of $D_{1c}$, $D_{2c}$, $D_{3C}$ or $D_{4C}$ is a moiety having structure (VIIIb).

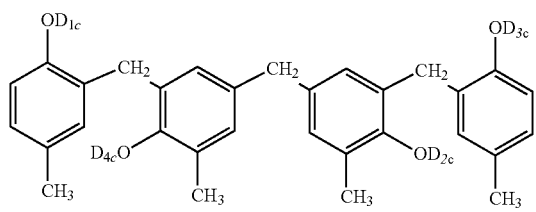

(X)

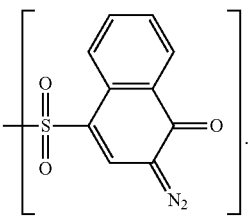

(VIIIb)

In other embodiments of the above inventive composition described above, wherein it comprises a free PAC component, this PAC component is either a single PAC compound or a mixture of PAC compounds having structure (Xa), wherein $D_{1d}$, $D_{2d}$, $D_{3d}$, and $D_{4d}$ are individually selected from H or a moiety having structure (VIIIa), and further wherein at least one of $D_{1d}$, $D_{2d}$, $D_{3d}$ or $D_{4d}$ is a moiety having structure (VIIIa).

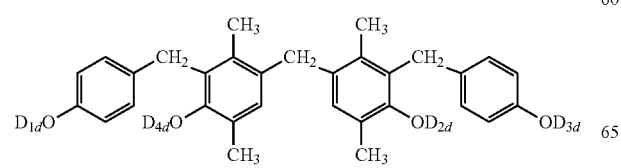

(Xa)

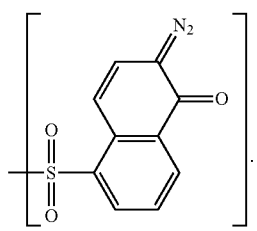

(VIIIa)

In other embodiments of the above inventive composition described above, wherein it comprises a free PAC component, this PAC component is either a single PAC compound or a mixture of PAC compounds having structure (Xa), wherein $D_{1d}$, $D_{2d}$, $D_{3d}$, and $D_{4d}$ are individually selected from H or a moiety having structure (VIIIb), and further wherein at least one of $D_{1d}$, $D_{2d}$, $D_{3d}$ or $D_{4d}$ is a moiety having structure (VIIIb).

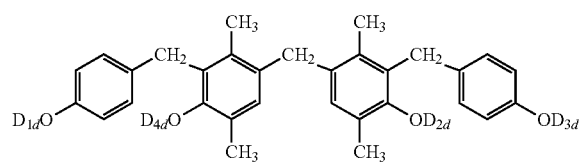

(Xa)

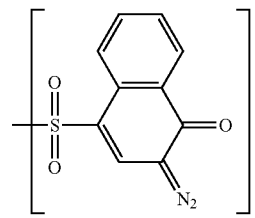

(VIIIb)

In other embodiments of the above inventive composition described above, wherein it comprises a free PAC component, this PAC component is either a single PAC compound or a mixture of PAC compounds having structure (Xb), wherein $D_{1e}$, $D_{2e}$, and $D_{3e}$ are individually selected from H or a moiety having structure (VIIIa), and further wherein at least one of $D_{1e}$, $D_{2e}$, or $D_{3e}$ is a moiety having structure (VIIIa).

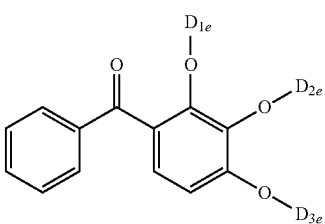

(Xb)

-continued

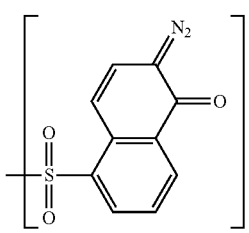
(VIIIa)

In other embodiments of the above inventive composition described above, wherein it comprises a free PAC component, this PAC component is either a single PAC compound or a mixture of PAC compounds having structure (Xb), wherein $D_{1e}$, $D_{2e}$, and $D_{3e}$ are individually selected from H or a moiety having structure (VIIIb), and further wherein at least one of $D_{1e}$, $D_{2e}$, or $D_{3e}$ is a moiety having structure (VIIIb).

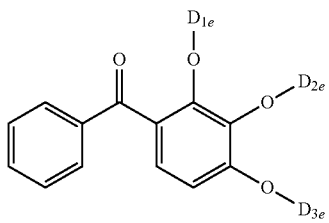
(Xb)

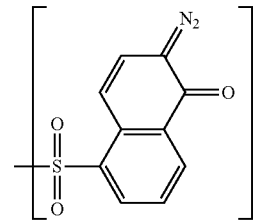
(VIIIb)

Embodiments with Specific Combinations of PAC Component and Polymer Component

In one aspect of the above inventive compositions, the polymer component, is any of the polymer components, as described above, in which the repeat unit of structure (II), as described above, is present with the further limitation this repeat unit is present from about 10 mole % to about 40 mole % of the repeat units in the polymer component, and that the repeat unit of structure (I), as described above, is also present from about 90 mole % to about 60 mole %. In another aspect of these embodiments, additionally, to the repeat units of structures (I) and (II), as described above, the polymer component, additionally may also be comprised of repeat units of structures (III) and (IV), as described above, which forms a linking point between two polymer chains of the polymer component. In another aspect of this embodiment the PAC component is only present as a free PAC. In yet another embodiment of this aspect, the free PAC component is one wherein the wt. ratio of the polymer component to said free PAC component is from about 95/5 to about 70/30. In yet another aspect of this embodiment this wt. ratio is from about 90/10 to about 80/20. In yet another aspect of this embodiment the PAC component is one having structure (Xb), as described above, wherein $D_{1e}$, $D_{2e}$, and $D_{3e}$ are individually selected from H or a moiety having structure (VIIIa), and further wherein at least one of $D_{1e}$, $D_{2e}$, or $D_{3e}$ is a moiety having structure (VIIIa), as described above.

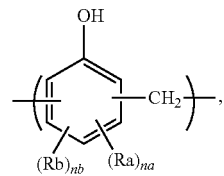
(I)

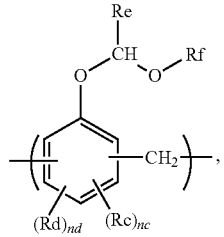
(II)

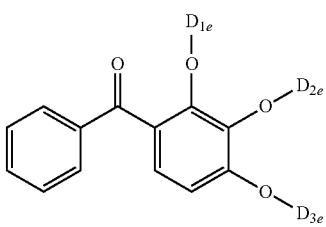
(Xb)

(VIIIa)

In one aspect of the above inventive compositions, the polymer component, is any of the polymer components, as described above, in which the repeat unit of structure (II) is present with the further limitation that this repeat unit is present from about 10 mole % to about 40 mole % of the repeat units, and also comprises from about 90 mole % to about 60 mole % of repeat unit of structure (I), as described above.

In another aspect of these embodiments, the polymer is comprised of repeat units having structures (I), (II), (III) and (IV), wherein the repeat units of structures (III) and (IV), are attached together through the positions designated by ~~~, forming a di-functional acetal comprising moiety, forming a linking point in said polymer component between two different polymer chains in said polymer component. In another aspect of this embodiment, the sum of the repeat units of structures (III) and (IV) are present from about 1 mole % to about 4 mole % of the polymer repeat units. In another aspect of this embodiment the PAC component is only present as a free PAC. In yet another embodiment of this aspect, the PAC component is one wherein the wt. ratio of the polymer component to said free PAC component is from about 95/5 to about 70/30. In another aspect of this embodiment this wt. ratio is from about 90/10 to about 80/20. In yet another aspect of this embodiment the PAC component is one having structure (Xb), as described above, wherein $D_{1e}$, $D_{2e}$, and $D_{3e}$ are individually selected from H or a moiety having structure (VIIIa), and further wherein at least one of $D_{1e}$, $D_{2e}$, or $D_{3e}$ is a moiety having structure (VIIIa), as described above. In one particular aspect of this embodiment Xa is an alkyleneoxyalkylene moiety having structure (VIIb). In another particular aspect of this embodiment, Xa is an alkylene moiety having structure (VII). In another particular aspect of this embodiment, Xa is an alkylene moiety having structure (VIIa). In another particular aspect of this embodiment, Xd is an alkyleneacetal moiety (-alkyleneO—CH(CH$_3$)—O—).

In another particular aspect of this embodiment, wherein Xd is an alkyleneacetal moiety (-alkyleneO—CH(CH$_3$)—O—), the alkylene portion of the alkyleneacetal moiety, is selected from the group consisting of ethylene, propylene, a moiety having structure (VII) and a moiety having structure (VIIa).

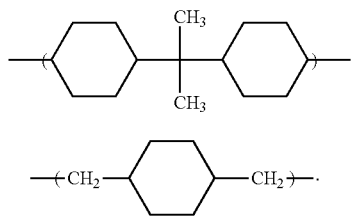

(VII)

(VIIa)

In another particular aspect of this embodiment, wherein Xd is an alkyleneacetal moiety (-alkyleneO—CH(CH$_3$)—O—), the alkylene portion of the alkyleneacetal moiety, is a moiety having structure (VII).

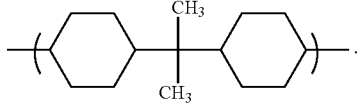

(VII)

In another particular aspect of this embodiment, wherein Xd is an alkyleneacetal moiety (-alkyleneO—CH(CH$_3$)—O—), the alkylene portion of the alkyleneacetal moiety, is a moiety having structure (VIIa)

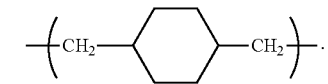

(VIIa)

In another particular aspect of this embodiment, Xd is an alkyleneoxyalkyleneacetal moiety (-alkylene-O-alkyleneO—CH(CH$_3$)—O—).

In another particular aspect of this embodiment, the alkyleneoxyalkyleneacetal moiety (-alkylene-O-alkyleneO—CH(CH$_3$)—O—), is a moiety wherein the alkylene portions are selected independently from a C-2 to C-8 alkylene moiety.

In another particular aspect of this embodiment, the alkyleneoxyalkyleneacetal moiety (-alkylene-O-alkyleneO—CH(CH$_3$)—O—), is a moiety wherein the alkylene portions are selected independently from a C-2 to C-4 alkylene moiety.

In another particular aspect of this embodiment, the alkyleneoxyalkyleneacetal moiety (-alkylene-O-alkyleneO—CH(CH$_3$)—O—), is a moiety having structure (VIIc) wherein ac is an integer from 2 to 4.

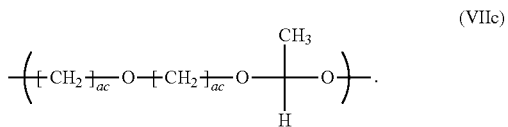

(VIIc)

In another particular aspect of this embodiment, the alkyleneoxyalkyleneacetal moiety (-alkylene-O-alkyleneO—CH(CH$_3$)—O—), is a moiety having structure (VIIc).

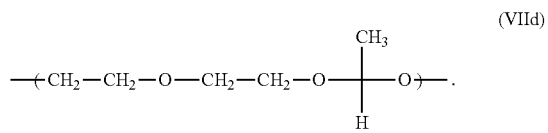

(VIId)

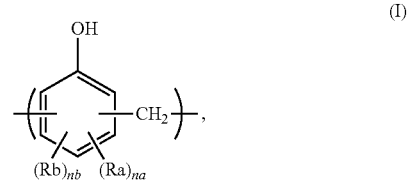

(I)

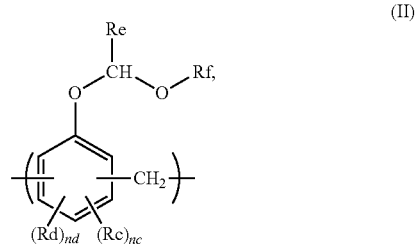

(II)

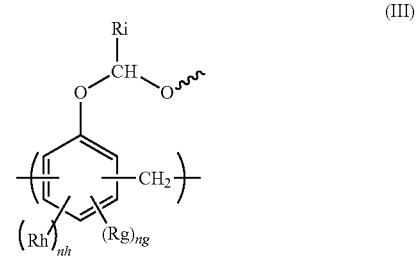

(III)

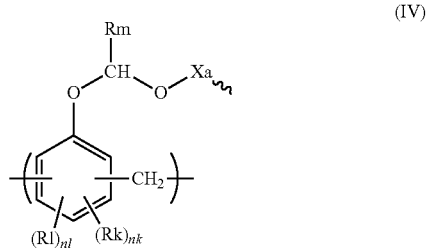

(IV)

-continued

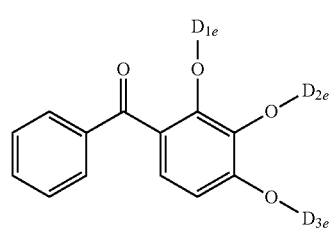 (Xb)

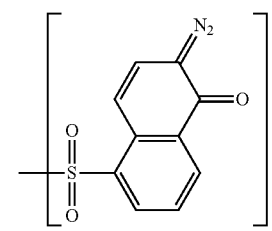 (VIIIa)

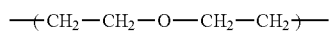 (VIIb)

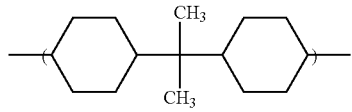 (VII)

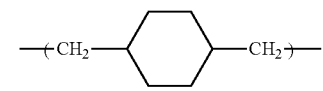 (VIIa)

In another aspect of these embodiments, the polymer is comprised of repeat units having structures (I), (II), (III) (IV) and (VI), as described above, wherein the repeat units of structures (III) and (IV), are attached together through the positions designated by ∿∿∿, forming a di-functional acetal comprising moiety, forming a linking point in said polymer component between two different polymer chains in said polymer component and the polymer also contains a repeat unit of structure (VI), and further wherein the PAC component is attached to repeat unit VI, as the moiety PACb, and no additional free PAC component is present in the composition. Additionally, in this aspect of the invention, the PACb moiety is one, of structure (VIIId), as described above, wherein $D_{1b}$, $D_{2b}$, and $Db_3$ are individually selected from H or a moiety having structure (VIIIa), and further wherein at least one of $D_{1b}$, $D_{2b}$, or $D_{3b}$ is a moiety having structure (VIIIa), and Xd is selected from the group consisting of the following;
  a direct valence bond,
  an alkylene moiety,
  an alkyleneoxy moiety, wherein the alkylene end is attached to the acetal oxygen moiety of the repeat unit of structure (VI), and the oxy end of the alkyleneoxy moiety is attached to the PACb moiety, and
  a moiety comprising an acetal selected from the group consisting of the following;
    an alkyleneacetal moiety (-alkyleneO—CH(CH$_3$)—O—),
    an alkyleneoxyalkyleneacetal moiety (-alkylene-O-alkyleneO—CH(CH$_3$)—O—), and
    an alkylene(oligooxyalkylene)acetal, (-alkylene(-O-alkylene)$_x$-O—CH(CH$_3$)—O—),
  wherein x is 2 to 6, and further wherein, in each of said acetal comprising moiety, the alkylene end of this moiety is attached to the acetal oxygen moiety of the repeat unit of structure (VI), and the acetal portion of said moiety comprising an acetal is attached to the PACb moiety.

The more specific embodiment of this particular PACb, as previously described, are also applicable to this more specific embodiment of the composition. In another aspect of this embodiment the mole % ranges for the different repeat in the polymer component are as follows: For the repeat unit of structure (I), from about 70 mole % to about 98 mole %; for the repeat unit of structure (VI) it is present up to about 10 mole %, for the repeat unit of structures (IV) and repeat unit of structure (III), these two form a linking point between two polymer chains of the polymer components, which is present from about 1 mole % to about 4 mole % of the polymer components repeat units. In one particular aspect of this embodiment Xa is an alkyleneoxyalkylene moiety having structure (VIIb). In another particular aspect of this embodiment Xa is an alkylene moiety having structure (VII). In another particular aspect of this embodiment Xa is an alkylene moiety having structure (VIIa).

In another particular aspect of this embodiment Xd is a direct valence bond. In another particular aspect of this embodiment Xd is alkyleneacetal moiety (-alkyleneO—CH(CH$_3$)—O—).

In another particular aspect of this embodiment, wherein Xd is an alkyleneacetal moiety (-alkyleneO—CH(CH$_3$)—O—), the alkylene portion of the alkyleneacetal moiety, is selected from the group consisting of ethylene, propylene, a moiety having structure (VII) and a moiety having structure (VIIa).

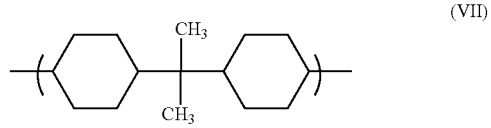 (VII)

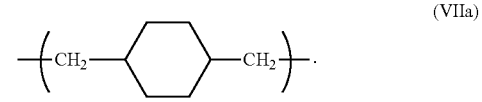 (VIIa)

In another particular aspect of this embodiment, wherein Xd is an alkyleneacetal moiety (-alkyleneO—CH(CH$_3$)—O—), the alkylene portion of the alkyleneacetal moiety, is a moiety having structure (VII).

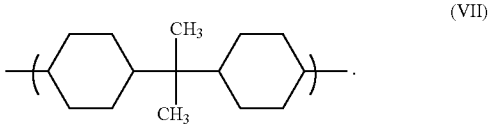 (VII)

In another particular aspect of this embodiment, wherein Xd is an alkyleneacetal moiety (-alkyleneO—CH(CH$_3$)—O—), the alkylene portion of the alkyleneacetal moiety, is a moiety having structure (VIIa)

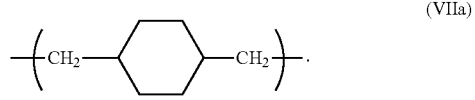 (VIIa)

In another particular aspect of this embodiment, Xd is an alkyleneoxyalkyleneacetal moiety (-alkylene-O-alkyleneO—CH(CH$_3$)—O—).

In another particular aspect of this embodiment, the alkyleneoxyalkyleneacetal moiety (-alkylene-O-alkyleneO—CH(CH$_3$)—O—), is a moiety wherein the alkylene portions are selected independently from a C-2 to C-8 alkylene moiety.

In another particular aspect of this embodiment, the alkyleneoxyalkyleneacetal moiety (-alkylene-O-alkyleneO—CH(CH$_3$)—O—), is a moiety wherein the alkylene portions are selected independently from a C-2 to C-4 alkylene moiety.

In another particular aspect of this embodiment, the alkyleneoxyalkyleneacetal moiety (-alkylene-O-alkyleneO—CH(CH$_3$)—O—), is a moiety having structure (VIIc) wherein ac is an integer from 2 to 4.

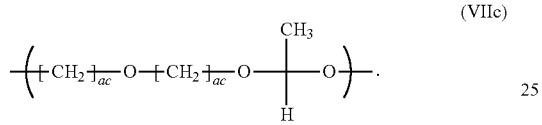
(VIIc)

In another particular aspect of this embodiment, the alkyleneoxyalkyleneacetal moiety (-alkylene-O-alkyleneO—CH(CH$_3$)—O—), is a moiety having structure (VIIc).

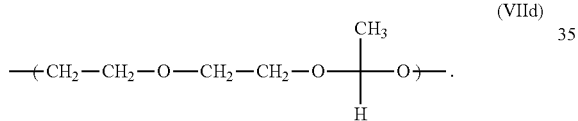
(VIId)

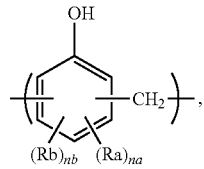
(I)

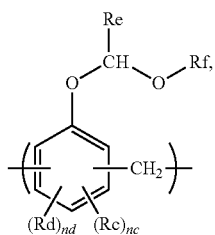
(II)

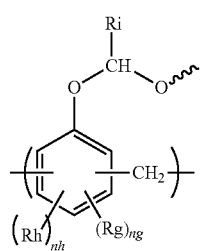
(III)

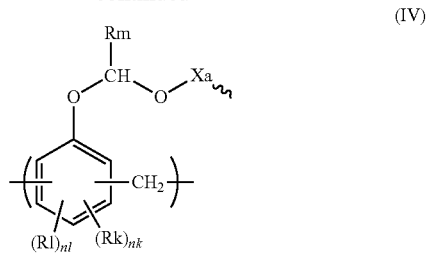
(IV)

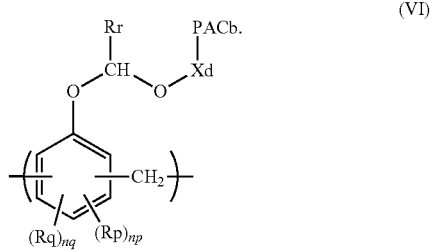
(VI)

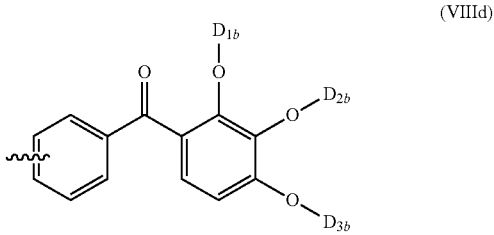
(VIIId)

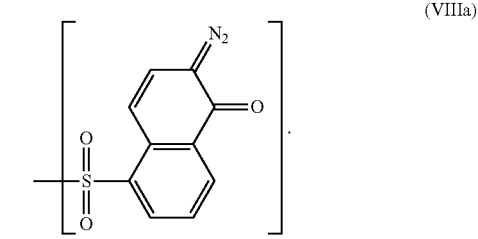
(VIIIa)

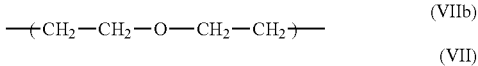
(VIIb)

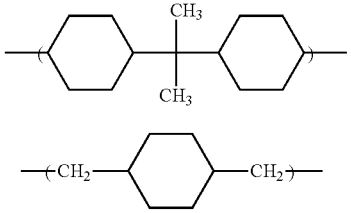
(VII)

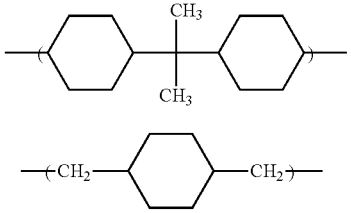
(VIIa)

In one aspect of the inventive composition, it is comprised of the polymer component, as described above, which comprises repeat units of structures (I), (III), (IV) and (VI), wherein the PAC component is attached to repeat unit VI, as the moiety PACb, and no additional free PAC component is present in the composition. Additionally, in this aspect of the invention, the PACb moiety is one of structure (VIII), as described above, wherein D$_1$, D$_2$, and D$_3$ are individually selected from H or a moiety having structure (VIIIa), and further wherein at least one of D$_1$, D$_2$, or D$_3$, wherein at least one of D$_1$, D$_2$ or D$_3$ is a moiety of structure (VIIIa) is a moiety having structure (VIIIa). Further, in this embodiment. The more specific embodiment of this particular PACb, as previously described, are also applicable to this more specific embodiment of the composition. For instance, when Xd an alkylene moiety, an alkyleneoxy moiety wherein the alkylene end of this moiety is attached to the acetal oxygen moiety of the repeat unit of structure (VI), and the oxy end of the alkyleneoxy moiety is attached to the PACb moiety, and a moiety comprising an acetal selected from the group consisting of an alkyleneacetal moiety (-alkyleneO—CH(CH$_3$)—O—), alkyleneoxyalkyleneacetal moiety (-alkylene-O-alkyleneO—CH(CH$_3$)—O—), and an alkylene(oligooxyalkylene)acetal, (-alkylene(-O-alkylene)$_x$-O—CH(CH$_3$)—O—), wherein x is 2 to 6, and further wherein, in each of said acetal comprising moiety, the alkylene end of this moiety is attached to the acetal oxygen moiety of the repeat unit of structure (VI), and the acetal portion of said moiety comprising an acetal is attached to the PACb moiety.

In another aspect of this embodiment the mole % ranges for the different repeat in the polymer component are as follows: For the repeat unit of structure (I), from about 70 mole % to about 98 mole %; for the repeat unit of structure (VI) it is present up to about 10 mole %, for the repeat unit of structures (IV) and repeat unit of structure (III), these two form a linking point between two polymer chains of the polymer components, which is present from about 1 mole % to about 4 mole % of the polymer components repeat units. In one particular aspect of this embodiment Xa is an alkyleneoxyalkylene moiety having structure (VIIb).

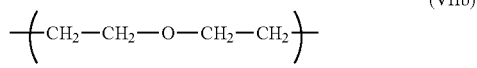

(VIIb)

In another particular aspect of this embodiment Xa is an alkylene moiety having structure (VII).

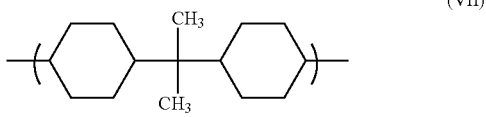

(VII)

In another particular aspect of this embodiment Xa is an alkylene moiety having structure (VIIa).

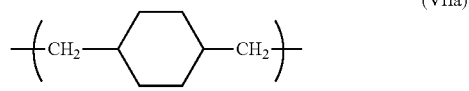

(VIIa)

In another particular aspect of this embodiment, wherein Xd is an alkyleneacetal moiety (-alkyleneO—CH(CH$_3$)—O—), the alkylene portion of the alkyleneacetal moiety, is selected from the group consisting of ethylene, propylene, a moiety having structure (VII) and a moiety having structure (VIIa).

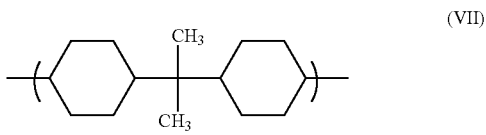

(VII)

(VIIa)

In another particular aspect of this embodiment, wherein Xd is an alkyleneacetal moiety (-alkyleneO—CH(CH$_3$)—O—), the alkylene portion of the alkyleneacetal moiety, is a moiety having structure (VII).

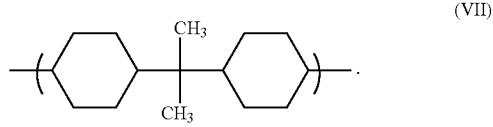

(VII)

In another particular aspect of this embodiment, wherein Xd is an alkyleneacetal moiety (-alkyleneO—CH(CH$_3$)—O—), the alkylene portion of the alkyleneacetal moiety, is a moiety having structure (VIIa)

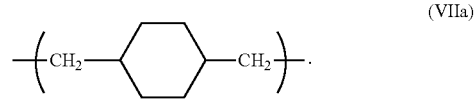

(VIIa)

In another particular aspect of this embodiment, Xd is an alkyleneoxyalkyleneacetal moiety (-alkylene-O-alkyleneO—CH(CH$_3$)—O—).

In another particular aspect of this embodiment, the alkyleneoxyalkyleneacetal moiety (-alkylene-O-alkyleneO—CH(CH$_3$)—O—), is a moiety wherein the alkylene portions are selected independently from a C-2 to C-8 alkylene moiety.

In another particular aspect of this embodiment, the alkyleneoxyalkyleneacetal moiety (-alkylene-O-alkyleneO—CH(CH$_3$)—O—), is a moiety wherein the alkylene portions are selected independently from a C-2 to C-4 alkylene moiety.

In another particular aspect of this embodiment, the alkyleneoxyalkyleneacetal moiety (-alkylene-O-alkyleneO—CH(CH$_3$)—O—), is a moiety having structure (VIIc) wherein ac is an integer from 2 to 4.

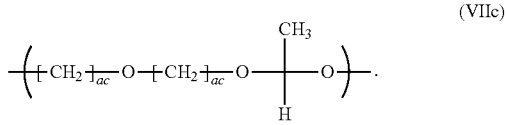

(VIIc)

In another particular aspect of this embodiment, the alkyleneoxyalkyleneacetal moiety (-alkylene-O-alkyleneO—CH(CH$_3$)—O—), is a moiety having structure (VIIc).

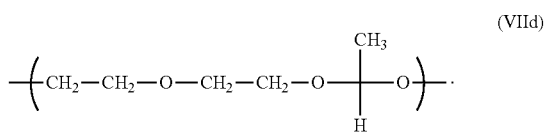

(VIId)

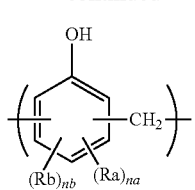
(I)

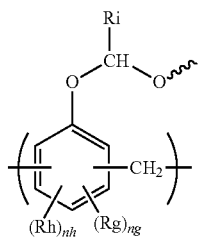
(III)

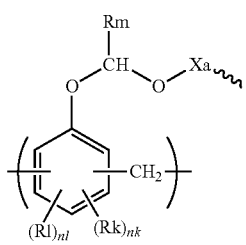
(IV)

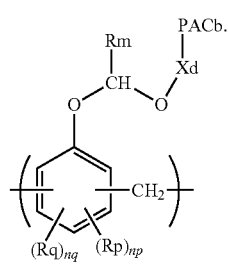
(VI)

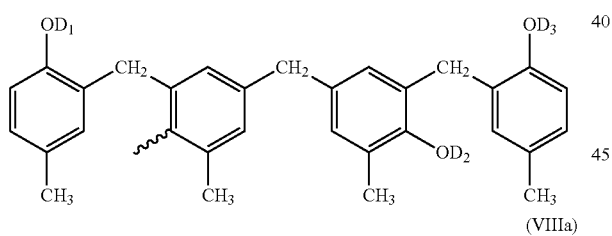
(VIII)

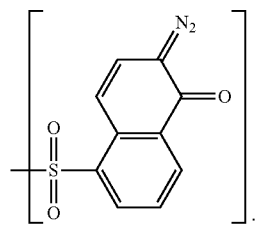
(VIIIa)

In another aspect of the inventive composition it is an embodiment, which is comprised of the polymer component, as described above, which comprises repeat units of structures (I), (III) and (VI), as described above, wherein in this specific aspect of the composition, the PAC component is only a free PAC. Further in this embodiment the free PAC, is one, as described above, having structure (X) wherein at least one of $D_{1e}$, $D_{2e}$, or $D_{3e}$ is a moiety having structure (VIIIa). In this more specific embodiment of composition, the further, more specific embodiment of the polymer component (I), (III), (IV) and (VI), and the free PACb, which has structure (X), wherein $D_{1e}$, $D_{2e}$, $D_{3e}$, and $D_{4e}$ are individually selected from H or a moiety having structure (VIIIa), and further wherein at least one of $D_{1e}$, $D_{2e}$, $D_{3e}$, or $D_{4e}$ is a moiety having structure (VIIIa). More specific embodiments, of this free PAC (X), having a moiety of structure (VIIIa), as described above, are also applicable to this more specific embodiment of the composition. In another aspect of this embodiment the mole % ranges for the different repeat in the polymer component are as follows: For repeat unit of structure (I), from about 70 mole % to about 98 mole %; for repeat unit of structure (IV) and repeat unit of structure (III), wherein these two form a linking point between two polymer chains of the polymer components, which is present from about 1 mole % to about 4 mole % of the polymer component's repeat units. In another aspect of this embodiment, the free PAC, described above, comprises from about 2 wt. % to about 10 wt. % of the solid components in the inventive composition.

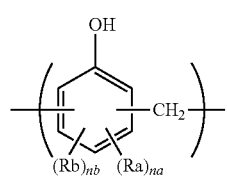
(I)

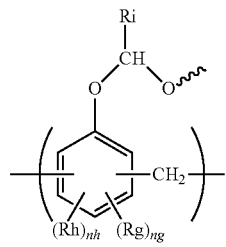
(III)

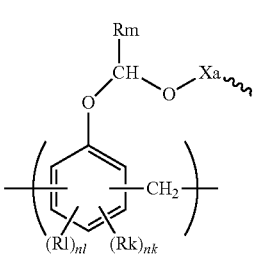
(IV)

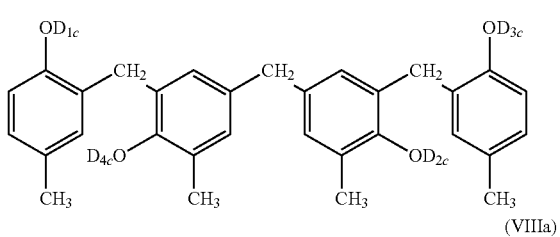
(X)

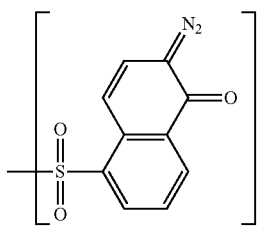
(VIIIa)

Heterocyclic Thiol Component

In another embodiment of any of the above inventive composition, said heterocyclic thiol component is present, and is selected from mono or di thiol derivatives of an unsaturated heterocyclic compound comprising nitrogen, sulfur or a combination of these two atoms, as the hetero atoms in the heterocyclic compound. In another aspect of this embodiment said mono or di thiol derivative is a derivative of a triazole, diazole, imidazole and thiadiazole heterocycles. In another aspect of this embodiment said mono or di thiol derivative is a derivative of a triazine heterocycle. In another aspect of this embodiment said mono or di thiol derivative, is selected from the group consisting of ones having structure (XIa), (XIb), (XIc), (XId), and (XIe).

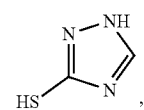 (XIa)

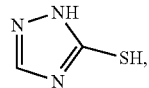 (XIb)

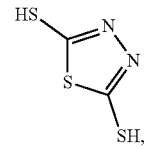 (XIc)

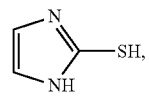 (XId)

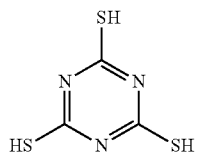 (XIe)

Base Component

In another embodiment of any of the above inventive composition, said base component is selected from an amine compound or a mixture of amine compounds having a boiling point above 100° C., at atmospheric pressure, and a $pK_a$ of at least 1.

In another embodiment of any of the above inventive composition, wherein said base component is either selected from the group consisting of compounds having structures (XIIa), (XIIb), (XIIc) (XIId), (XIIe), (XIIf), (XIIg), (XIIh), (XIIi) and (XIIj), or a mixture of compounds from this group; wherein $R_{b1}$ is C-1 to C-20 saturated alkyl chain or a C-2 to C-20 unsaturated alkyl chain; $R_{b2}$, $R_{b3}$, $R_{b4}$, $R_{b5}$, $R_{b6}$, $R_{b7}$, $R_{b8}$, $R_{b9}$, $R_{b10}$, $R_{b11}$, $R_{b12}$, and $R_{b13}$, are independently selected from the group consisting of H, and a C-1 to C-20 alkyl.

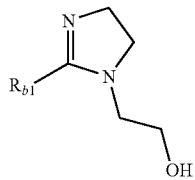 (XIIa)

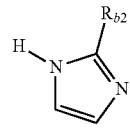 (XIIb)

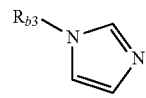 (XIIc)

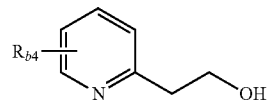 (XIId)

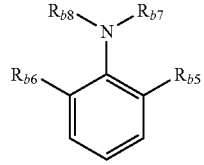 (XIIe)

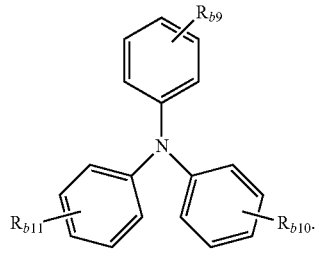 (XIIf)

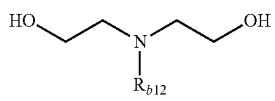 (XIIe)

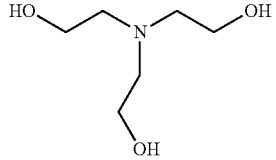 (XIIf)

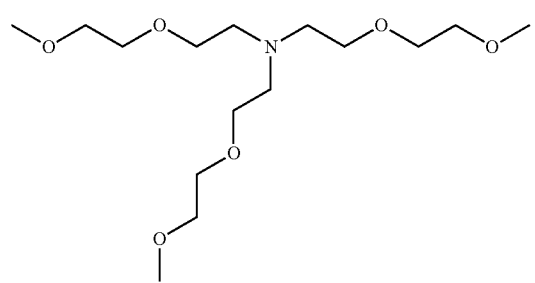 (XIIg)

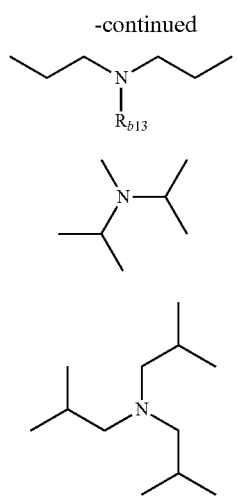

(XIIh)

(XIIi)

(XIIj)

Solvent Component

In the above described inventive composition said solvent component is an organic solvent. Examples of suitable organic solvents include, without limitation, butyl acetate, amyl acetate, cyclohexyl acetate, 3-methoxybutyl acetate, methyl ethyl ketone, methyl amyl ketone, cyclohexanone, cyclopentanone, ethyl-3-ethoxy propanoate, methyl-3-ethoxy propanoate, methyl-3-methoxy propanoate, methyl acetoacetate, ethyl acetoacetate, diacetone alcohol, methyl pivalate, ethyl pivalate, propylene glycol monomethyl ether, propylene glycol monoethyl ether, propylene glycol monomethyl ether propanoate, propylene glycol monoethyl ether propanoate, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethyl sulfoxide, gamma-butyrolactone, propylene glycol methyl ether acetate, propylene glycol ethyl ether acetate, propylene glycol propyl ether acetate, methyl lactate, ethyl lactate, propyl lactate, tetramethylene sulfone, propylene glycol dimethyl ether, dipropylene glycol dimethyl ether, ethylene glycol dimethyl ether or diethylene glycol dimethyl ether, gamma butyrolactone. These solvents may be used singly or in a mixture of two or more.

In one embodiment, the solvent component is PGMEA (1-Methoxy-2-propanyl acetate).

Other optional components, which have compatibility with and can be added to the inventive photoresist composition disclosed and claimed herein according to need, include auxiliary resins, plasticizers, surface leveling agents and stabilizers to improve the properties of the resist layer, and the like. Surface leveling agents may include surfactants. There is no particular restriction with regard to the surfactant, and the examples of it include a polyoxyethylene alkyl ether such as polyoxyethylene lauryl ether, polyoxyethylene stearyl ether, polyoxyethylene cetyl ether, and polyoxyethylene olein ether; a polyoxyethylene alkylaryl ether such as polyoxyethylene octylphenol ether and polyoxyethylene nonylphenol ether; a polyoxyethylene polyoxypropylene block copolymer; a sorbitane fatty acid ester such as sorbitane monolaurate, sorbitane monovalmitate, and sorbitane monostearate; a nonionic surfactant of a polyoxyethylene sorbitane fatty acid ester such as polyoxyethylene sorbitane monolaurate, polyoxyethylene sorbitane monopalmitate, polyoxyethylene sorbitane monostearate, polyethylene sorbitane trioleate, and polyoxyethylene sorbitane tristearate; a fluorinated surfactant such as F-Top EF301, EF303, and EF352 (manufactured by Jemco Inc.), Megafac F171, F172, F173, R08, R30, R90, and R94 (manufactured by Dainippon Ink & Chemicals, Inc.), Florad FC-430, FC-431, FC-4430, and FC-4432 (manufactured by Sumitomo 3M Ltd.), Asahi Guard AG710, Surflon S-381, S-382, S-386, SC101, SC102, SC103, SC104, SC105, SC106, Surfinol E1004, KH-10, KH-20, KH-30, and KH-40 (manufactured by Asahi Glass Co., Ltd.); an organosiloxane polymer such as KP-341, X-70-092, and X-70-093 (manufactured by Shin-Etsu Chemical Co., Ltd.); and an acrylic acid or a methacrylic acid polymer such as Polyflow No. 75 and No. 95 (manufactured by Kyoeisha Chemical Co. Ltd.).

Another aspect of this invention is a process of coating the composition of any one of the above described inventive compositions on a substrate.

Another aspect of this invention is process for imaging a resist comprising the steps;
  i) coating the composition of the invention on a substrate to form a resist film;
  ii) selectively exposing said resist film to UV light using a mask to form a selectively exposed resist film;
  iii) developing said selectively exposed film to form a positively imaged resist film over said substrate.

Another aspect of this invention is a process for imaging a resist comprising the steps;
  ia) coating the composition of the invention on a substrate to form a resist film;
  iia) selectively exposing said resist film to UV light using a mask to form a selectively exposed resist film;
  iiia) baking said selectively exposed resist film to form a baked selectively exposed resist film;
  iva) developing said selectively exposed and baked resist film to form a positively imaged resist film over said substrate.

Another aspect of this invention is the use of the composition according to the invention as a resist composition.

Another aspect of this invention is the use of the composition according to the invention for preparing a resist him, which is preferably a thin him resist or a thick him resist.

Another aspect of this invention is the use of the composition according to the invention for coating a substrate.

EXAMPLES

Reference will now be made to more specific embodiments of the present disclosure and experimental results that provide support for such embodiments. However, Applicants note that the disclosure below is for illustrative purposes only and is not intended to limit the scope of the claimed subject matter in any way.

Materials

SPN-560-F is a m-cresol/formaldehyde Novolak, sold under the name Alnovol SPN-560 Fast 44% PGMEA, supplied by Allnex USA Inc. The average molecular weight of this Novolak is MW=8,430 and Mn=1,520. The dissolution rate of the Novolak is 1,200 Å/s in AZ 300MIF developer.

CKS-670, is a bisphenol-A/m-cresol-formaldehyde Novolak sold under the name CKS-670 (C), by Aica Kogyo Company, Limited. The molecular weight of this Novolak is MW=9,034 and Mn=2,195. The dissolution rate of this Novolak is 9000 Å/s in AZ 300MIF developer.

NK-280 is a DNQ-PAC sold under this name by TOYO GOSEI., LTD.

It is a mixture of materials having general formula (X) wherein $D_{1c}$, $D_{2c}$, $D_{3c}$ and $D_{4c}$ are individually selected from H or a moiety having structure (VIIIa), where at least one of $D_{1c}$, $D_{2c}$, $D_{3c}$, or $D_{4c}$ is a moiety having structure (VIIIa) and on average about 2.8 of the phenolic positions $D_{1c}$, $D_{2c}$, $D_{3c}$ and $D_{4c}$ groups are esterified with (VIIIa) structure.

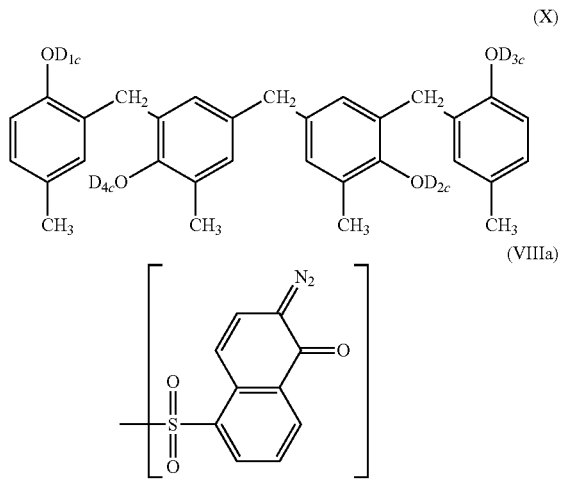

NIT PAG, N-hydroxynaphthalimide triflate is sold under the name (NIT PAG, 100%, Tech, pdr), sold by Heraeus PM NA Daychem LLC.

MTA: additive, (1H-1,2,4-triazole-3-thiol) purchased from Sigma Aldrich

TEA: (Triethylamine) purchased from Sigma Aldrich.

PGMEA (1-Methoxy-2-propanyl acetate), the solvent used for photoresist formulation examples was obtained from Sigma-Aldrich a subsidiary of Merck KGaA (Darmstadt, Germany).

APS-430 is a surfactant: from Shinetsu, (Tokyo, Japan).

R-2011 is a surfactant: from DIC Corp (Dusseldorf, Germany).

EMD Performance Materials Corp, a subsidiary of Merck KGaA (Darmstadt, Germany)

AZ® 300MIF developer was obtained from EMD Performance Materials Corp, a subsidiary of Merck KGaA (Darmstadt, Germany) (a.k.a. 2.38% Tetramethylammonium hydroxide (TMAH)).

PD-126A is a m-cresol/formaldehyde sold under the name Durite™ Resin D_HEXION PD-126A by HEXION (Columbus, Ohio).

PD-427AF a m-cresol/formaldehyde sold under the name Durite™ Resin D_HEXION PD-427AF by HEXION (Columbus, Ohio).

APS-437 is a surfactant: from Shinetsu, (Tokyo, Japan).

CL-23 Novolak is a Novolak polymer (50% m-cresol/20% p-cresol/30% 2,5-xylenols, formaldehyde, Mw=4,000, DR=15.75 nm/S) sold under the name, CL23F10G, by ASAHI YUKIZAI CORPORATION (Tokyo, Japan).

4,4'-(1-(4-(2-(4-hydroxyphenyl)propan-2-yl)phenyl)ethane-1,1-diyl)diphenol (TPPA) and 2,5-diisopropylaniline (DIPA) were obtained from Sigma-Aldrich a subsidiary of Merck KGaA (Darmstadt, Germany).

All other chemicals, unless otherwise indicated, were obtained from Sigma-Aldrich, a subsidiary of Merck KGaA (Darmstadt, Germany).

Molecular weights of polymers were measured with Gel Permeation Chromatography (GPC).

Photoresist Preparation and Processing Thick Resist Formulations

The components of the Thick Film Formulation Examples described combined together in the proportion as described in these examples by dissolving them in PGMEA, followed by a filtration through a 0.2-micron PTFE (polytetrafluoroethylene) filter. The sample size, for a typical resist formulation tested, these contained from about 50 mL to about 100 mL of PGMEA.

An ASML i-line stepper PAS 5500, was used to expose the resist films of the examples provided at 0.48 numerical aperture. The Nikon FX-6010 stepper was also used in one example as described. In some instance, the photoresist is then subjected to a post exposure second baking or heat treatment, before development.

The exposed positive-acting photoresist-coated substrates are developed to remove the exposed areas, normally by immersion, puddle or spray development with an alkaline developing solution. The resist coatings of the examples were puddle developed using AZ® 300MIF developer, which is a standard aqueous tetramethylammonium hydroxide solution. The substrates are allowed to remain in the developer until all, or substantially all, of the photoresist coating has dissolved from the exposed areas. The wafers were then rinsed thoroughly with DI water.

The resist pattern profile cross sections were examined by means of scanning electron microscopy. A Hitachi S-4700 or Hitatchi SU8030 SEM were used to evaluate resist profiles.

Thick Film Resist Examples

Polymer Synthesis Examples

Thick Film Resist Polymer Synthesis Example 1
(Novolak Resin with Polymer Backbones Linked Through a Linking Group Derived from a Divinyl Ether and Functionalized with a DNO Moiety)

A 500-mL round bottom flask, equipped with adequate mechanical agitation, heating and a reflux condenser, was charged with a 150.4 g of a 47.4 wt. % solution of m-cresol/formaldehyde Novolak (SPN-560-F) in PGMEA, 3.359 g of DNQ (NK-280), to which was added 41.2 g of PGMEA and 5.88 g of 1,4-Cyclohexanedimethanol divinyl ether (DVE) (0.03 moles). This resulted wt. % total solid for each solid component of 88.786 wt. % Novolak, 7.018 wt. % DVE and 4.196 wt. % NK-280. The reflux condenser was sealed at the top to prevent any loss of material through evaporation. This mixture was allowed to dissolve to form a clear reaction solution at room temperature with stirring. After dissolution of the solid component, this clear reaction solution was heated slowly to 55° C. with stirring and was held at that temperature for ~ 16-18 hours. The resultant solution 195.83 gm contained 40.89 wt. % solids, (the average molecular weight of the resulting polymer is Mw=33,816, Mn=1,771) and it was used to formulate Thick Resist Formulation 1.

Thick Film Resist Polymer Synthesis Example 2
Novolak Resin with Polymer Backbones Linked Through a Linking Group Derived from a Divinyl Ether and Functionalized with a DNO Moiety A 500-mL round bottom flask, equipped with adequate mechanical agitation, heating and a reflux condenser was charged with a 185.46 g of solution 47.4 wt. % solids of m-cresol/formaldehyde Novolak (SPN-560-F) in PGMEA, to which was added 4.12 g of DNQ (NK-280), 46.6 g of PGMEA and 7.24 g of 1,4-Cyclohexanedimethanol divinyl ether (DVE) (0.037 moles). This resulted in a wt. % total solid for each solid component of 88.55 wt. % Novolak, 7.292 wt. % DVE and 4.15 wt. % NK-280. The reflux condenser was sealed at the top to prevent any loss of material through evaporation. This mixture was allowed to dissolve to a form a clear reaction solution with stirring at room temperature. After dissolution of the solid component, this clear reaction solution with stirring was heated slowly to 55° C. and was held at that temperature for ~ 16-18 hours. The resultant solution, 242 g, contained 41 wt. % solids (the average molecular weight of the resulting polymer is Mw=14,871, Mn=1,627), and was used to formulate Thick Resist Formulation 2.

Thick Film Resist Polymer Synthesis Example 3
Novolak Resin with Polymer Backbones Linked Through a Linking Group Derived from a Divinyl Ether)

A 500-mL round bottom flask, equipped with adequate mechanical agitation, heating and a reflux condenser was charged with a 150.4 g of a 47.4 wt. % solution in PGMEA of m-cresol/formaldehyde Novolak (SPN-560-F) in PGMEA, 3.359 g of DNQ (NK-280), 41.2 g of PGMEA and 5.88 g of 1,4-Cyclohexanedimethanol divinyl ether (DVE) (0.03 moles). This resulted in a wt. % total solid for each solid component of 88.786 wt. % Novolak, 7.018 wt. % DVE and 4.196 wt. % NK-280. The reflux condenser was sealed at the top to prevent any loss of material through evaporation. This mixture was allowed to dissolve to a form a clear reaction solution with stirring at room temperature. After dissolution of the solid component, this clear reaction solution with stirring was heated slowly to 55° C. and was held at that temperature for ~ 16-18 hours. The resultant solution, 195.83 g, contained 40.89 wt. % solids (the average molecular weight of the resulting polymer is Mw=33,816, Mn=1,771) and was used to formulate Thick Resist Formulation 3.

Thick Film Resist Polymer Synthesis Example 4

A 500-mL round bottom flask, equipped with adequate mechanical agitation, heating and a reflux condenser was charged with 152.84 g a of 36 wt. % solids of a bisphenol-A/m-cresol-formaldehyde Novolak (CKS-670) (55.02 g of solids; 0.1528 mole), and 10.835 g 1,4-Cyclohexanedimethanol divinyl ether (DVE) (0.0553 moles). The molar ratio of DVE to the total moles of CKS-670 Novolak and DVE is 0.2657 which corresponds to wt. ratio of DVE over total wt. of CKS-670 Novolak and DVE of 0.1645. The CKS-670 solution was first heated to 126° C. then DVE was added over 15 minutes. The reaction was allowed to continue for additional 12 hours at 125° C. then cooled to room temperature. The final reaction solution (163.65 g) was diluted from 40.226 wt. % solids to 35 wt. % solids with PGMEA. This solution provided 5.82 μm-5.99 μm coated films, spun coated at 2,000 rpm on Si wafers, soft baked at 110° C. for 120 seconds on a hot plate in contact. The dissolution rate of the coating was measured using AZ® 300 MIF puddle developer for 6 minutes. The polymer dissolution rate is 42.7 Å/S.

Thick Film Resist Polymer Synthesis Example 5

A 500-mL round bottom flask, equipped with adequate mechanical agitation, heating and a reflux condenser was charged with 180 g solution at 36% solids 65.0 g of a bisphenol-A/m-cresol-formaldehyde Novolak (CKS-670) (65.0 g, 0.00719 moles) and 7.78 g DVE (0.0397 moles). The molar ratio of DVE to the total moles of CKS-670 Novolak and DVE is 0.1069, which corresponds to wt. ratio of DVE over total wt. of CKS-670 Novolak and DVE of 0.1069. The CKS-670 solution was first heated to 126° C. then DVE was added over 15 minutes. The reaction was allowed to continue for additional 27 hours at 125° C. then cooled to R.T. The final reaction solution (180.85 g) is at 40.24 wt. % solids. This solution produced 9.06 μm coated films, spun coated at 1,600 rpm on Si wafers, soft baked at 110° C. for 120 seconds on a hot plate in contact. The dissolution rate of the coating was measured using AZ® 300 MIF puddle developer for 133 seconds, in which the total film was completely developed, measuring 681 Å/S dissolution rate.

Thick Resist Formulation Examples

Thick Resist Formulation Examples

Thick Film Resist Formulation Example 1

The resist formulation was prepared by dissolving NIT PAG; (N-hydroxynaphthalimide triflate), MTA additive (1H-1,2,4-triazole-3-thiol), a base; TEA (triethylamine), and a surfactant (APS-437) in the solution from, Thick Film Resist Polymer Synthesis Example 1, and diluting the sample to the appropriate viscosity with PGMEA solvent to 35.16 wt. % in solvent. The resultant wt. % of the total solids for each component were as follows: Polymer (99.24 wt. %); NIT (0.603 wt. %); TEA (0.027 wt. % solids); MTA (0.0486 wt. %); APS-437 (0.082 wt. %).

Thick Film Resist Formulation Example 2

The resist formulation was prepared by dissolving in the same manner as Thick Film resist formulation 1, except that the solution from, Thick Film Resist Polymer Synthesis Example 2 was employed, and the wt. % of solids in PGMEA of the resist was 39.42 wt. % in solvent, and that the resultant wt. % of the total solids for each component were as follows: Polymer (99.245 wt. %); NIT (0.608 wt. %); TEA (0.0289 wt. %); MTA (0.0477 wt. %); APS-437 (0.0696 wt. %).

Thick Film Resist Formulation Example 3

The resist formulation was prepared by dissolving in the same manner as Thick Film resist formulation 1, except that the solution of Thick Film Resist Polymer Synthesis Example 3 was employed, diluted with PGMEA to 35.95 wt. % in solvent, and that the following components in wt. % of the total solids were added as follows: Polymer (93.27 wt. %); NK-280 (5.9885 wt. %) NIT (0.600 wt. %); DIPA (0.0385 wt. %); APS-437 (0.052 wt. %).

Thick Film Resist Comparative Example 1

The standard DNQ Novolak resist formulation was prepared by dissolving 27.58 g of (CL-23) Novolak, 6.055 g of NK-280, 1.365 g of 4,4'-(1-(4-(2-(4-hydroxyphenyl)propan-2-yl)phenyl)ethane-1,1-diyl)diphenol (TPPA), 0.0175 g of surfactant (APS-437) in 65 g of PGMEA giving a solution which was 35.0 wt. % in PGMEA. This resulted in a wt. % of total solids for each component as follows: Polymer (78.8 wt. %); NK-280 (17.3 wt. %) TPPA (3.9 wt. %); APS-437 (0.050 wt. %).

Resist Processing of Thick Resists

The resist solution is spin coated on a 6" diameter Cu wafer at an appropriate spin speed (1,000-2,000 rpm) to produce the desired film thickness. The coated resist is soft baked on a contact hot plate at 110° C. for 120 seconds. The resist is then exposed to a masked pattern using i-line exposure (365 nm) on ASML 0.48 NA stepper. A post exposure bake (PEB) is applied for 60 seconds at 90° C. then the wafer is developed for 2×60 seconds puddle (a total of 120 seconds) using standard AZ®-300MIF developer.

Figure 4:
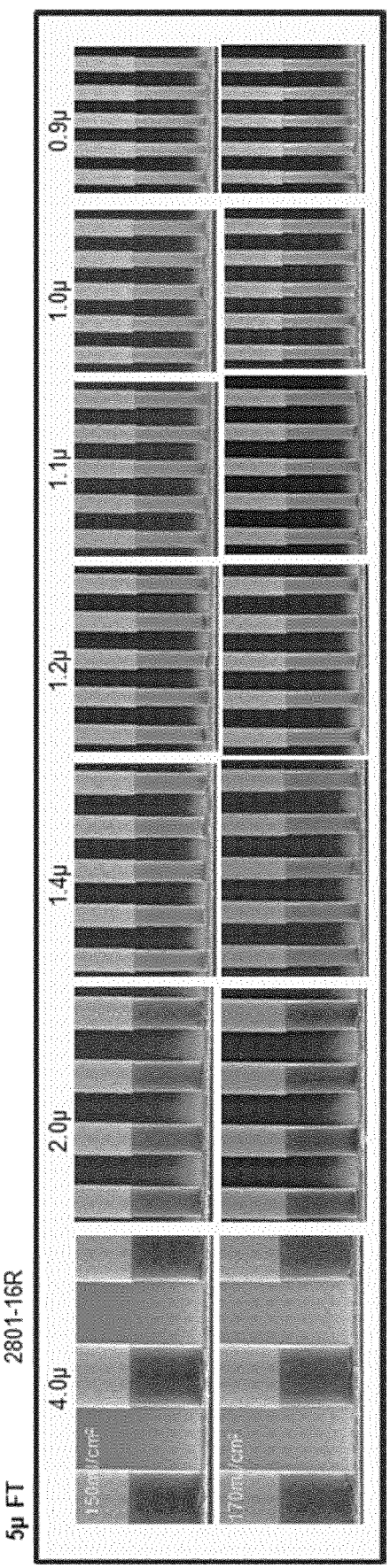
FIG. 4 SEM images obtained with Thick Film Resist Formulation 1
Figure 5:
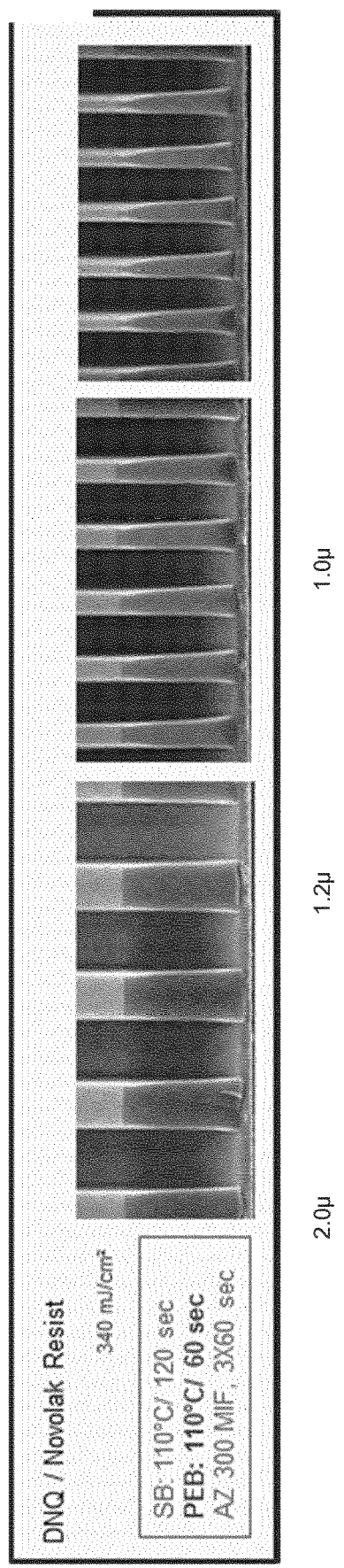
FIG. 5 SEM images obtained with Thick Film Resist Comparative Example 1

Thick Film Resist Formulations 1 and 2 in with both the DVE and the DNQ moiety linked to the polymer (a.k.a both acetal branching point and an acetal linked DNQ moiety are present on the polymer, were present) formulated respectively with Thick Film Polymer 1 or Thick Film Polymer 2, showed high aspect ratio patterns, greater than 5:1 were produced with vertical sidewall profiles on Cu substrates at 5p thick resist films, resolving 4.0 μm 0.9 μm equal line/spaces. This is in marked contrast to Comparative Thick Resist 1, a standard Novolak thick resist formulation in which showed pronounced sloping in the profiles Additionally, Thick film Formulations 1 and 2 showed resolution down to 0.9 micron at a dose of 150 mJ/cm², while Comparative Thick Resist 1, a standard Novolak formulation require 340 mJ/cm and even at this more than twice that for our inventive samples was able to image only very sloped features down to 1 μm. FIG. 4 shows SEM images obtained with Thick Film Resist Formulation 1. FIG. 5 shows SEM images obtained with Thick Film Resist Comparative Example 1.

Thick Film Resist Formulations 3 in which only the DVE is linked to the polymer (a.k.a. only an acetal linking point is present) the polymer and the DNQ was added as a free component during formulation also showed high aspect ratio patterns, greater than 5:1 were produced with vertical sidewall profiles on Cu substrates at 5 μm thick resist films, resolving 4.0 μm to 0.9 μm equal line/spaces. However, in these formulations although the straight wall profiles were obtained some slight T-topping was observed at the smaller resolutions. This said, this formulation still demonstrated the beneficial straight wall characteristic and a much lower resolution dose maintaining straight wall profiles than the standard DNQ/Novolak Resist (Thick film Resist Comparative Example 1).

Thin Resist Formulations Suitable for Display Device Manufacturing

Equipment Used for Thin Film Resist Formulations

An ASMF i-line stepper PAS 5500 and Ultratech g, h-line stepper, were used to expose the resist films of the examples provided at 0.48 (i-line) and 0.30 (g, h-line) numerical aperture, respectively. In some instance, the photoresist was then subjected to a post exposure second baking or heat treatment, before development.

Photoresists were spin coated on an HMDS primed Si wafers and baked on a hot plate and then exposed with the g, h-line or i-line stepper. The exposed resist-coated substrates were then developed to remove the exposed areas using AZ® 300MIF developer. Finally, the wafers were then rinsed with DI water.

The resist pattern profile cross sections were examined by a Hitachi S-4700 or SU8030 Scanning Electron Microscope Thin Film Polymer Synthesis Examples Polymer Synthesis Examples Polymer Synthesis Example 1

A 2 L round-bottom flask was charged with 500 g of m-cresol/formaldehyde Novolak resin (SPN560-F, 47.2 wt. % in PGMEA) and further 225.4 g of PGMEA was added thereto, and the mixture was stirred to form a clear solution. Then, 28.3 g of ethyl vinyl ether was added to the solution with stirring. After mixing, 77 mg of p-toluenesulfonic acid monohydrate was added. The reaction was conducted at room temperature for 4 hours in a closed system. The reaction was stopped by adding 1.44 g of 10 wt. % tris[2-(2-methoxyethoxy)ethyl]amine solution in PGMEA The resulting solution was one comprising about 35 wt. % of ethoxy ethyl-protected Novolak resin. The resulting ethoxyethyl-protected Novolak resin, had a number average molecular weight ($M_n$) of 1,496 g/mol and a weight average molecular weight ($M_w$) of 8,651 g/mol. A photoresist formulation was prepared by directly using the product as prepared.

Polymer Synthesis Example 2

A 250-mL round-bottom flask was charged with 23.6 g of m-cresol/formaldehyde Novolak resin (PD-427AF from HEXION) and 51.72 g of PGMEA was added thereto, and the mixture was stirred until a clear solution was formed. Then, 4.25 g of ethyl vinyl ether was added to the solution with stirring. After mixing, 11.4 mg of p-toluenesulfonic acid monohydrate was added. The reaction was stirred at room temperature for 4 hours in a closed system. The reaction was stopped by adding a solution of 25.7 mg of tris[2-(2-methoxyethoxy)ethyl]amine in 0.21 g of PGMEA all at once. The resulting solution was one comprising about 35 wt. % of ethoxyethyl-protected Novolak resin. The resulting, ethoxyethyl-protected Novolak resin, had a number average molecular weight ($M_n$) of 1,584 g/mol and a weight average molecular weight ($M_w$) of 4,773 g/mol. A photoresist formulation was prepared by directly using the product as prepared.

Polymer Synthesis Example 3

A 250-mL round-bottom flask was charged with 50.0 g of m-cresol/formaldehyde Novolak resin (SPN560-F, 47.2 wt. % in PGMEA) and further 23.07 g of PGMEA was added thereto, and the mixture was stirred to form a clear solution. Then, 2.83 g of ethyl vinyl ether and 0.21 g of diethylene glycol (DEG) were added to the solution with stirring. After mixing, 9.2 mg of p-toluenesulfonic acid monohydrate was added. The reaction was stirred at room temperature for overnight in a closed system. The reaction was stopped by adding 0.17 g of 10 wt. % tris[2-(2-methoxyethoxy)ethyl]amine solution in PGMEA (1.1 equivalent to p-toluenesulfonic acid monohydrate) all at once. The resulting solution was one comprising about 34.97% by weight of ethoxyethyl-protected Novolak resin. The resulting ethoxyethyl-protected Novolak resin polymer with polymer backbones linked through a linking group derived from diethylene glycol had a number average molecular weight ($M_n$) of 2,107 g/mol and a weight average molecular weight ($M_w$) of 11,710 g/mol. A photoresist formulation was prepared by directly using the product as prepared.

Polymer Synthesis Example 4

A 250-mL round-bottom flask was charged with 50.0 g of m-cresol/formaldehyde Novolak resin (SPN560-F, 47.2 wt. % in PGMEA) and further 25.71 g of PGMEA was added thereto, and the mixture was stirred to form a clear solution. Then, 4.25 g of ethyl vinyl ether and 0.21 g of diethylene glycol (DEG) were added to the solution with stirring. After mixing, 11.8 mg of p-toluenesulfonic acid monohydrate was added. The reaction was stirred at room temperature for overnight in a closed system. The reaction was stopped by adding 0.22 g of 10.0 wt. % tris[2-(2-methoxyethoxy)ethyl]amine solution in PGMEA (1.1 equivalent to p-toluenesulfonic acid monohydrate) all at once. The resulting solution was one comprising about 34.96% by weight of ethoxyethyl-protected Novolak resin. The resulting ethoxyethyl-protected Novolak resin polymer with polymer backbones linked through a linking group derived from diethylene glycol (DEG) had a number average molecular weight ($M_n$) of 2,137 g/mol and a weight average molecular weight ($M_w$) of 12,331 g/mol. A photoresist formulation was prepared by directly using the product as prepared.

Polymer Synthesis Example 5

A 250-mL round-bottom flask was charged with 50.0 g of m-cresol/formaldehyde Novolak resin (SPN560-F, 47.2 wt. % in PGMEA) and further 26.10 g of PGMEA was added thereto, and the mixture was stirred to form a clear solution. Then, 4.25 g of ethyl vinyl ether and 0.42 g of diethylene glycol were added to the solution with stirring. After mixing, 12.2 mg of p-toluenesulfonic acid monohydrate was added. The reaction was stirred at room temperature for overnight in a closed system. The reaction was stopped by adding a solution of 26.3 mg of tris[2-(2-methoxyethoxy)ethyl]amine in 0.27 g of PGMEA The resulting solution was one comprising about 34.97% by weight of ethoxyethyl-protected Novolak resin. The resulting ethoxyethyl-protected Novolak resin polymers with polymer backbones linked through a linking group derived from diethylene glycol had a number average molecular weight ($M_n$) of 1,693 g/mol and a weight average molecular weight ($M_w$) of 13,802 g/mol. A photoresist formulation was prepared by directly using the product as prepared.

Polymer Synthesis Example 6

A 250 mL round-bottom flask was charged with 50.0 g of m-cresol/formaldehyde Novolak resin (SPN560-F, 47.2 wt. % in PGMEA) and further 26.49 g of PGMEA was added thereto, and the mixture was stirred to form a clear solution. Then, 4.25 g of ethyl vinyl ether and 0.63 g of diethylene glycol (DEG) were added to the solution with stirring. After mixing, 13.4 mg of p-toluenesulfonic acid monohydrate was added. The reaction was stirred at room temperature for overnight in a closed system. The reaction was stopped by adding a solution of 26.6 mg of TMEEA (tris[2-(2-methoxyethoxy)ethyl]amine) dissolved in 0.25 g of PGMEA The resulting solution was one comprising about 34.97% by weight of ethoxyethyl-protected Novolak resin. The resulting ethoxyethyl-protected Novolak resin polymers with polymer backbones linked through a linking group derived from diethylene glycol had a number average molecular weight ($M_n$) of 1,693 g/mol and a weight average molecular weight ($M_w$) of 13,802 g/mol. A photoresist formulation was prepared by directly using the product as prepared.

Polymer Synthesis Example 7

A 250-mL round-bottom flask was charged with 50.0 g of Novolak resin (SPN560-F, 47.2 wt. % in PGMEA) and further 26.87 g of PGMEA was added thereto, and the mixture was stirred to form a clear solution. Then, 4.25 g of ethyl vinyl ether and 0.834 g of diethylene glycol were added to the solution with stirring. After mixing, 11.9 mg of p-toluenesulfonic acid monohydrate was added. The reaction was stirred at room temperature for overnight in a closed system. The reaction was stopped by adding 0.22 g of 10 wt. % TMEEA (tris[2-(2-methoxyethoxy)ethyl]amine) solution in PGMEA all at once. The resulting solution was one comprising about 34.96% by weight of ethoxyethyl-protected Novolak resin. The resulting ethoxyethyl-protected Novolak resin polymer with polymer backbones linked through a linking group derived from diethylene glycol had a number average molecular weight ($M_n$) of 2,161 g/mol and a weight average molecular weight ($M_w$) of 12,990 g/mol. A photoresist formulation was prepared by directly using the product as prepared.

Polymer Synthesis Example 8

A 250-mL round-bottom flask was charged with 50.0 g of m-cresol/formaldehyde Novolak resin (SPN560-F, 47.2 wt. % in PGMEA) and further 24.435 g of PGMEA was added thereto, and the mixture was stirred to form a clear solution. Then, 2.83 g of ethyl vinyl ether and 0.945 g of 4,4'-isopropylidenedicyclohexanol (DEG) were added to the solution with stirring. After mixing, 8.0 mg of p-toluenesulfonic acid monohydrate was added. The reaction was stirred at room temperature for overnight in a closed system. The reaction was stopped by adding 0.15 g of 10 wt. % tris[2-(2-methoxyethoxy)ethyl]amine solution in PGMEA The resulting solution was one comprising about 35 wt. % of ethoxyethyl-protected Novolak resin. The resulting resin polymer with a polymer backbone linked through a linking group derived from 4,4'-isopropylidenedicyclohexanol had a number average molecular weight ($M_n$) of 2,060 g/mol and a weight average molecular weight ($M_w$) of 11,589 g/mol. A photoresist formulation was prepared by directly using the product as prepared.

Polymer Synthesis Example 9

A 250 mL round-bottom flask was charged with 50.0 g of m-cresol/formaldehyde Novolak resin (SPN560-F, 47.2 wt. % in PGMEA), 1.18 g of 3,3'-Bis(2-hydroxy-5-methylbenzyl)-4,4'-dihydroxy-5,5'-dimethyldiphenylmethane ester with 6-diazo-5,6-dihydro-5-oxo-1-naphthalenesylfonic acid (NK-280 from Toyo Gosei) and 26.58 g of PGMEA; and then the mixture was stirred to form a clear solution. Then, 3.54 g of ethyl vinyl ether and 0.21 g of diethylene glycol were added to the solution with stirring. After mixing, 12.9 mg of p-toluenesulfonic acid monohydrate was added. The reaction was stirred at room temperature for overnight in a closed system. The reaction was stopped by adding 0.24 g of 10.0 wt. % tris[2-(2-methoxyethoxy)ethyl]amine solution in PGMEA The resulting solution was one comprising about 34.94% by weight of ethoxy ethyl-protected Novolak resin polymers with polymer backbones linked through a linking group derived from diethylene glycol and functionalized with DNQ NK-280, had a number average molecular weight ($M_n$) of 1,596 g/mol and a weight average molecular weight ($M_w$) of 10,608 g/mol. A photoresist formulation was prepared by directly using the product as prepared.

Polymer Synthesis Example 10

A 2 L round-bottom flask was charged with 750.3 g of Novolak resin (SPN560-F, 47.2 wt. % in PGMEA) and 352.1 g of PGMEA was added thereto, and the mixture was stirred to form a clear solution. Then, 42.5 g of ethyl vinyl ether and 6.26 g of diethylene glycol were added to the solution with stirring. After mixing, 115.0 mg of p-toluenesulfonic acid monohydrate was added. The reaction was stirred at room temperature for overnight in a closed system. The reaction was stopped by adding 2.15 g of 10 wt. % tris[2-(2-methoxyethoxy)ethyl]amine solution in PGMEA. The resulting solution was one comprising about 34.98% by weight of a Novolak resin polymer with polymer backbones linked through a linking group derived from diethylene glycol). The resulting resin has a number average molecular weight ($M_n$) of 1,608 g/mol and a weight average molecular weight ($M_w$) of 11,349 g/mol. A photoresist formulation was prepared by directly using the product as prepared.

Polymer Synthesis Example 11

A 2 L round-bottom flask was charged with 360.5 g of m-cresol/formaldehyde Novolak resin (PD-126A from HEXION) and 789.9 g of PGMEA was added thereto, and the mixture was stirred to form a clear solution. Then, 64.9 g of ethyl vinyl ether was added to the solution with stirring. After mixing, 176.2 mg of p-toluenesulfonic acid monohydrate was added. The reaction was stirred at room temperature for overnight in a closed system. The reaction was stopped by adding 3.3 g of 10.0 wt. % tris[2-(2-methoxyethoxy)ethyl]amine solution in PGMEA. The resulting solution was one comprising about 34.9% by weight of ethoxyethyl-protected Novolak resin. The resulting resin has a number average molecular weight ($M_n$) of 980 g/mol and a weight average molecular weight ($M_w$) of 2,257 g/mol. A photoresist formulation was prepared by directly using the product as prepared.

FORMULATION EXAMPLES

Thin Film Formulation Example 1

A Chemically amplified resist (CAR) composition was made by dissolving 35% Ethoxyethyl ether protected Novolak resin (Polymer Synthesis Example 1), 2.34 g, 2,3,4-trihydroxy benzophenone-2,1,5-diazonaphthoquinonesulfonate 0.414 g, 4-isoprolylthio-N-(1,8-naphthalimide) trifluoromethane sulfonate 0.0278 g, Trioctylamine 0.0023 g in PGMEA 12.21 g.

The CAR composition was spin coated on a silicon substrate, baked at 90° C./90 sec and exposed with ASML i-line stepper with mask, developed with AZ® 300MIF developer for 60 sec and obtained 0.55 μm LS(1:1) resist pattern at 200 mJ/cm².

Thin Film Formulation Example 2

A CAR composition was made by dissolving 35% Ethoxyethyl ether protected Novolak resin (Polymer Synthesis Example 1), 2.34 g, 30% NK-280 in PGMEA 1.83 g, 1% N-hydroxy-4-isoprolylthio-naphthalimide triflate in PGMEA 3.7 g, 1% Trioctylamine in PGMEA 0.31 g and PGMEA 5.21 g.

The CAR composition was spin coated on a silicon substrate, baked at 90° C./90 sec and exposed with ASML i-line stepper with mask, developed with AZ® 300MIF developer for 60 sec and obtained 0.60 μm LS (1:1) resist pattern at 200 mJ/cm².

Thin Film Formulation Example 3

A CAR composition was made by dissolving 35% DEG linked—Ethoxyethyl ether protected Novolak resin (Polymer Synthesis Example 3) in PGMEA 6.7 g, 30% 2,3,4-trihydroxy benzophenone-2,1,5-diazonaphthoquinonesulfonate 1.38 g, 1% N-hydroxy-4-isoprolylthio-naphthalimide triflate in PGMEA 2.77 g, 1% Trioctylamine in PGMEA 0.234 g and PGMEA 3.91 g.

The CAR composition was spin coated on a silicon substrate, baked at 90° C./90 sec and exposed with ASML i-line stepper with mask, developed with AZ® 300MIF developer for 60 sec and obtained 0.70 μmLS (1:1) resist pattern at 60 mJ/cm.

Thin Film Formulation Example 4

A CAR composition was made by dissolving 35% DEG linked—Ethoxyethyl ether protected Novolak resin linked by diethylene glycol (Polymer Synthesis Example 5) in PGMEA 6.7 g, 30% 2,3,4-trihydroxy benzophenone-2,1,5-diazonaphthoquinonesulfonate 1.38 g, 1% N-hydroxy-4-isoprolylthio-naphthalimide triflate in PGMEA 2.77 g, 1% Trioctylamine in PGMEA 0.234 g and PGMEA 3.91 g.

The CAR composition was spin coated on a silicon substrate, baked at 90° C./90 sec and exposed with ASML i-line stepper with mask, developed with AZ® 300MIF developer for 60 sec and obtained 0.60 μmLS (1:1) resist pattern at 200 mJ/cm.

Thin Film Formulation Example 5

A CAR composition was made by dissolving 35% DEG linked—Ethoxyethyl ether protected Novolak resin (Polymer Synthesis Example 6) in PGMEA 6.7 g, 30% 2,3,4-trihydroxy benzophenone-2,1,5-diazonaphthoquinonesulfonate 1.38 g, 1% N-hydroxy-4-isoprolylthio-naphthalimide triflate in PGMEA 2.77 g, 1% Trioctylamine in PGMEA 0.234 g and PGMEA 3.91 g.

The CAR composition was spin coated on a silicon substrate, baked at 90° C./90 sec and exposed with ASML i-line stepper with mask, developed with AZ® 300MIF developer for 60 sec and obtained 0.55 μmLS (1:1) resist pattern at 120 mJ/cm.

Thin Film Formulation Example 6

A CAR composition was made by dissolving 35% DCH linked—Ethoxyethyl ether protected Novolak resin (Polymer Synthesis Example 8) in PGMEA 6.7 g, 30% 2,3,4-trihydroxy benzophenone-2,1,5-diazonaphthoquinonesulfonate 1.38 g, 1% N-hydroxy-4-isoprolylthio-naphthalimide triflate in PGMEA 2.77 g, 1% Trioctylamine in PGMEA 0.234 g and PGMEA 3.91 g. The CAR composition was spin coated on a silicon substrate, baked at 90° C./90 sec and exposed with ASML i-line stepper with mask, developed with AZ® 300MIF developer for 60 sec and obtained 0.55 μmLS (1:1) resist pattern at 120 mJ/cm.

Thin Film Formulation Example 7

A CAR composition was made by dissolving 35% DEG linked—Ethoxyethyl ether protected Novolak resin Polymer Synthesis Example 7) in PGMEA 6.7 g, 30% 2,3,4-trihydroxy benzophenone-2,1,5-diazonaphthoquinonesulfonate 1.38 g, 1% N-hydroxy-4-isoprolylthio-naphthalimide triflate in PGMEA 2.77 g, 1% Trioctylamine in PGMEA 0.234 g and PGMEA 3.91 g.

The CAR composition was spin coated on a silicon substrate, baked at 90° C./90 sec and exposed with ASML

Thin Film Formulation Example 8

A CAR composition was made by dissolving 35% DEG linked—Ethoxyethyl ether protected Novolak resin (Polymer Synthesis Example 7) in PGMEA 6.7 g, 30% 2,3,4-trihydroxy benzophenone-2,1,5-diazonaphthoquinone-sulfonate 1.38 g, 1% N-hydroxy-4-isoprolylthio-naphthalimide triflate in PGMEA 2.77 g, 1% Trioctylamine in PGMEA 0.234 g and PGMEA 3.91 g.

The CAR composition was spin coated on a silicon substrate, baked at 90° C./90 sec and exposed with ASML i-line stepper with mask, developed with AZ® 300MIF developer for 60 sec and obtained 0.55 μmLS (1:1) resist pattern at 200 mJ/cm².

Thin Film Formulation Example 9

A CAR composition was made by dissolving 35% Ethoxyethyl ether protected Novolak resin (Polymer Synthesis Example 1) in PGMEA 6.9 g, 30% 2,3,4-trihydroxy benzophenone-2,1,5-diazonaphthoquinonesulfonate 1.38 g, 1% Irgacure 108 in PGMEA 2.77 g, 1% Trioctylamine in PGMEA 0.235 g and PGMEA 3.91 g.

The CAR composition was spin coated on a silicon substrate, baked at 90° C./90 sec and exposed with ASML i-line stepper with mask, developed with AZ® 300MIF developer for 60 sec and obtained 0.55 μmLS (1:1) resist pattern at 100 mJ/cm.

Thin Film Formulation Example 10

A CAR composition was made by dissolving 35% Ethoxyethyl ether protected Novolak resin linked by diethylene glycol (Polymer Synthesis Example 3) in PGMEA 6.9 g, 30% 2,3,4-trihydroxy benzophenone-2,1,5-diazonaphthoquinonesulfonate 1.38 g, 1% Irgacure 108 in PGMEA 2.77 g, 1% Trioctylamine in PGMEA 0.235 g and PGMEA 3.91 g.

The CAR composition was spin coated on a silicon substrate, baked at 90° C./90 sec and exposed with ASML i-line stepper with mask, developed with AZ® 300MIF developer for 60 sec and obtained 0.55 μmLS (1:1) resist pattern at 60 mJ/cm².

Thin Film Formulation Example 11

A CAR composition was made by dissolving 35% Ethoxyethyl ether protected Novolak resin (Polymer Synthesis Example 11) in PGMEA 6.9 g, 30% 2,3,4-trihydroxy benzophenone-2,1,5-diazonaphthoquinonesulfonate 1.38 g, 1% N-hydroxy-4-isoprolylthio-naphthalimide triflate in PGMEA 2.77 g, 1% Trioctylamine in PGMEA 0.235 g and PGMEA 3.91 g.

The CAR composition was spin coated on a silicon substrate, baked at 90° C./90 sec and exposed with ASML i-line stepper with mask, developed with AZ® 300MIF developer for 60 sec and obtained 0.55 μmLS (1:1) resist pattern at 80 mJ/cm².

Thin Film Formulation Example 12

A CAR composition was made by dissolving 35% Ethoxyethyl ether protected Novolak resin (Polymer Synthesis Example 1) in PGMEA 6.3 g, 30% 2,3,4-trihydroxy benzophenone-2,1,5-diazonaphthoquinonesulfonate 0.92 g, 30% NK-280 in PGMEA 0.92 g, 1% N-hydroxy-4-isoprolylthio-naphthalimide triflate in PGMEA 4.14 g, 1% Trioctylamine in PGMEA 0.23 g and PGMEA 2.51 g.

The CAR composition was spin coated on a silicon substrate, baked at 90° C./90 sec and exposed with ASML i-line stepper with mask, developed with AZ® 300MIF developer for 60 sec and obtained 0.55 μmLS (1:1) resist pattern at 200 mJ/cm.

Thin Film Formulation Example 13

A CAR composition was made by dissolving 35% Ethoxyethyl ether protected Novolak resin (Polymer Synthesis Example 1) in PGMEA 6.67 g, 30% 2,3,4-trihydroxy benzophenone-2,1,5-diazonaphthoquinonesulfonate 0.92 g, 30% NK-280 in PGMEA 0.46 g, 1% N-hydroxy-4-isoprolylthio-naphthalimide triflate in PGMEA 4.14 g, 1% Trioctylamine in PGMEA 0.23 g and PGMEA 2.58 g.

The CAR composition was spin coated on a silicon substrate, baked at 90° C./90 sec and exposed with ASML i-line stepper with mask, developed with AZ® 300MIF developer for 60 sec and obtained 0.55 μmLS (1:1) resist pattern at 120 mJ/cm.

Thin Film Formulation Example 14

A CAR composition was made by dissolving 35% Ethoxyethyl ether protected Novolak resin (Polymer Synthesis Example 3) linked by diethylene glycol in PGMEA 6.67 g, 30% 2,3,4-trihydroxy benzophenone-2,1,5-diazonaphthoquinonesulfonate 0.92 g, 30% NK-280 in PGMEA 0.46 g, 1% N-hydroxy-4-isoprolylthio-naphthalimide triflate (113T) in PGMEA 4.14 g, 1% Trioctylamine in PGMEA 0.23 g and PGMEA 2.58 g.

The CAR composition was spin coated on a silicon substrate, baked at 90° C./90 sec and exposed with ASML i-line stepper with mask, developed with AZ® 300MIF developer for 60 sec and obtained 0.55 μmLS (1:1) resist pattern at 100 mJ/cm.

Thin Film Formulation Example 15

A CAR composition was made by dissolving 35% Ethoxyethyl ether protected Novolak resin (Polymer Synthesis Example 1) in PGMEA 6.31 g, 30% 2,3,4-trihydroxy benzophenone-2,1,5-diazonaphthoquinonesulfonate 1.84 g, 1% N-hydroxy-4-isoprolylthio-naphthalimide triflate in PGMEA 2.78 g, 1% Trioctylamine in PGMEA 0.23 g and PGMEA 3.84 g.

The CAR composition was spin coated on a silicon substrate, baked at 90° C./90 sec and exposed with ASML i-line stepper with mask, developed with AZ® 300MIF developer for 60 sec and obtained 0.55 μmLS (1:1) resist pattern at 200 mJ/cm².

Thin Film Formulation Example 16

A CAR composition was made by dissolving 35% Ethoxyethyl ether protected Novolak resin lined by diethyleneglycol & grafted with NK-280 (Polymer Synthesis Example 9) in PGMEA 8.04 g, 30% 2,3,4-trihydroxy benzophenone-2,1,5-diazonaphthoquinonesulfonate 1.65 g, 1% N-hydroxy-4-isoprolylthio-naphthalimide triflate in PGMEA 3.33 g, 1% Trioctylamine in PGMEA 0.28 g and PGMEA 4.68 g.

The CAR composition was spin coated on a silicon substrate, baked at 90° C./90 sec and exposed with ASML i-line stepper with mask, developed with AZ® 300MIF developer for 60 sec and obtained 0.55 μmLS (1:1) resist pattern at 160 mJ/cm².

Thin Film Formulation Example 17

A CAR composition was made by dissolving 35% Ethoxyethyl ether protected Novolak resin linked by diethyleneglycol & grafted with NK-280 (Polymer Synthesis Example 9) in PGMEA 8.03 g, 30% 2,3,4-trihydroxy benzophenone-2,1,5-diazonaphthoquinonesulfonate 1.65 g, 1% N-hydroxy-4-isoprolylthio-naphthalimide triflate in PGMEA 3.32 g, 1% Tris[2-(2-methoxyethoxy)ethyl]amine in PGMEA 0.26 g and PGMEA 4.71 g.

The CAR composition was spin coated on a silicon substrate, baked at 90° C./90 sec and exposed with ASML i-line stepper with mask, developed with AZ® 300MIF developer for 60 sec and obtained 0.55 μmLS (1:1) resist pattern at 120 mJ/cm².

Thin Film Formulation Example 18

A CAR composition was made by dissolving 35% ethoxyethyl ether protected Novolak resin linked by diethylene glycol (Polymer Synthesis Example 10) in PGMEA 8.01 g, 10% 2,3,4-trihydroxy benzophenone-2,1,5-diazonaphthoquinonesulfonate in PGMEA 4.95 g, 5% Irgacure 103 in PGMEA 0.92 g, 1% Trioctylamine in PGMEA 0.47 g, 5% Monazoline C in PGMEA 0.18 g, 10% Megaface R-2011 in PGMEA 0.90 g and PGMEA 2.58 g.

The CAR composition was spin coated on a HMDS-unprimed silicon substrate, baked at 90° C./90 sec and exposed by Ultratech g,h-line stepper with mask, developed with AZ® 300MIF developer for 60 sec and obtained 0.70 μm LS (1:1) resist pattern at 140 mJ/cm².

Thin Film Formulation Example 19

A CAR composition was made by dissolving 35% ethoxyethyl ether protected Novolak resin linked by diethylene glycol (Polymer Synthesis Example 10) in PGMEA 3.16 g, 35% ethoxyethyl ether protected Novolak resin (Polymer Synthesis Example 11) in PGMEA 6.33 g, 20% 2,3,4-trihydroxy benzophenone-2,1,5-diazonaphthoquinonesulfonate in PGMEA 2.93 g, 5% Irgacure 103 in PGMEA 1.09 g, 1% Trioctylamine in PGMEA 0.55 g, 5% Monazoline C in PGMEA 0.18 g, 10% Megaface R-2011 in PGMEA 0.09 g and PGMEA 3.68 g.

The CAR composition was spin coated on a HMDS-unprimed silicon substrate, baked at 90° C./90 sec and exposed by Ultratech g, h-line stepper with mask, developed with AZ® 300MIF developer for 60 sec and obtained 0.70 μm LS (1:1) resist pattern at 60 mJ/cm². Thin Film Formulation Example 20

A CAR composition was made by dissolving 35% ethoxyethyl ether protected Novolak resin linked by diethylene glycol (Polymer Synthesis Example 10) in PGMEA 1.56 g, 35% ethoxyethyl ether protected Novolak resin (Polymer Synthesis Example 11) in PGMEA 7.93 g, 20% 2,3,4-trihydroxy benzophenone-2,1,5-diazonaphthoquinonesulfonate in PGMEA 2.93 g, 5% Irgacure 103 in PGMEA 1.09 g, 1% Boc-L-alanine methyl ester in PGMEA 0.32 g, 5% Monazoline C in PGMEA 0.18 g, 10% Megaface R-2011 in PGMEA 0.09 g and PGMEA 3.91 g.

The CAR composition was spin coated on a HMDS-unprimed silicon substrate, baked at 90° C./90 sec and exposed by Ultratech g,h-line stepper with mask, developed with AZ® 300MIF developer for 60 sec and obtained 0.70 μm LS (1:1) resist pattern at 45 mJ/cm.

Thin Film Formulation Example 21

A CAR composition was made by dissolving 35% ethoxyethyl ether protected Novolak resin (Polymer Synthesis Example 11) in PGMEA 112.07 g, 2,3,4-trihydroxy benzophenone-2,1,5-diazonaphthoquinonesulfonate 6.91 g, 5% Irgacure 103 in PGMEA 12.85 g, 1% Trioctylamine (TOA) in PGMEA 6.52 g, 5% Monazoline C in PGMEA 1.28 g, 10% Megaface R-2011 in PGMEA 1.06 g and PGMEA 39.31 g.

The CAR composition was spin coated on a HMDS-unprimed silicon substrate, baked at 90° C./90 sec and exposed by Ultratech g,h-line stepper with mask, developed with AZ® 300MIF developer for 60 sec and obtained 0.70 μm LS (1:1) resist pattern at 35 mJ/cm².

Thin Film Formulation Example 22

A CAR composition was made by dissolving 35% ethoxyethyl ether protected Novolak resin (Polymer Synthesis Example 11) in PGMEA 112.07 g, 2,3,4-trihydroxy benzophenone-2,1,5-diazonaphthoquinonesulfonate 6.91 g, 5% Irgacure 103 in PGMEA 12.85 g, 1% Trioctylamine in PGMEA 6.52 g, 5% Monazoline C in PGMEA 0.85 g, 10% Megaface R-2011 in PGMEA 1.06 g and PGMEA 39.74 g.

The CAR composition was spin coated on a HMDS-unprimed silicon substrate, baked at 90° C./90 sec and exposed by Ultratech g,h-line stepper with mask, developed with AZ® 300MIF developer for 60 sec and obtained 0.70 μm LS (1:1) resist pattern at 30 mJ/cm².

Thin Film Formulation Comparative Example 1

A CAR composition was made by mixing 35% Ethoxyethyl ether protected Novolak in PGMEA (Polymer Synthesis Example 1) 8.48 g, 1% 4-isoprolylthio-N-(1,8-naphthalimide) trifluoromethane sulfonate in PGMEA 3 g, 1% Trioctylamine in PGMEA 0.257 g and PGMEA 3.37 g.

The CAR composition was spin coated on a silicon substrate, baked at 90° C./90 sec and exposed with ASML i-line stepper with mask and developed with AZ® 300MIF developer for 60 sec. 2 μm Line/Space 1:1 pattern was obtained at 140 mJ/cm, however all patterns showed severe T-topping and they were not usable.

Thin Film Formulation Comparative Example 2

A composition was made by mixing 47.5% Novolak resin (SPN 560-F) in PGMEA 5.0 g, 30% 2,3,4-trihydroxy benzophenone-2,1,5-diazonaphthoquinonesulfonate in PGMEA 1.39 g and PGMEA 8.60 g.

The Novolak and DNQ composition was spin coated on a silicon substrate, baked at 90° C./90 sec and exposed with ASML i-line stepper with mask and developed with AZ® 300MIF developer for 60 sec, but the film was dissolved in developer and no pattern was obtained.

Thin Film Formulation Comparative Example 3

A CAR composition was made by dissolving 35% Ethoxy ethyl ether protected (a.k.a. protected by reaction with ethyl vinyl ether) Novolak resin in PGMEA (Polymer Synthesis Example 1), 30% 2,3,4-trihydroxy benzophenone-2,1,5-diazonaphthoquinonesulfonate in PGMEA 1.39 g and PGMEA 6.82 g. The CAR composition was spin coated on a silicon substrate, baked at 90° C./90 sec and exposed with ASML i-line stepper with mask, developed with AZ® 300MIF developer for 60 sec, however, the sensitivity was poor, and the resist did not open even at 200 mJ/cm$^2$.

As shown in the Thin Film Formulation examples 1-22, CAR formulation has high resolution and high sensitivity without Post Exposure Bake (PEB). And this can be achieved by CAR formulations comprise of acetal protected Novolak resin, DNQ, photoacid generator and base. Comparative Example 1 shows CAR comprising of Ethoxy ethyl ether protected Novolak resin, photoacid generator and base. The formulation gave image without Post Exposure bake (PEB), but all pattern showed severe T-top and unusable for manufacturing devices.

Comparative Example 2 demonstrates that a resist comprising of Novolak resin and DNQ. Film completely dissolved after development and no pattern was obtained.

Comparative Example 3 shows CAR comprising of Ethoxy ethyl vinyl ether protected Novolak resin and DNQ. The formulation gave image without PEB, but no pattern was obtained at 200 mJ/cm and below.

We claim:

1. A composition comprising a polymer component, a photoacid generator component (PAG), a photoactive diazonaphthoquinone compound (PAC) component, a base component, a solvent component, and an optional heterocyclic thiol component, wherein;

said polymer component is selected from the group consisting of Polymer Component C, Polymer Component D, Polymer Component E, and Polymer Component H, Polymer Component C comprising repeat units having structures (I), (II), and (VI), where structure (VI) is an acetal, comprising a moiety functionalized with a PAC moiety, protecting a repeat unit comprising a Novolak phenolic hydroxy moiety;

wherein Ra, Rc and Rp are independently a C-1 to C-4 alkyl; Rb, Rd, and Rq are independently a —X-Phenol, wherein X is —O—, —C(CH$_3$)$_2$—, —(C=O)— or —SO$_2$—, and na, nc, and np, independently, are 0 to 3; nb, nd, and nq, independently are 0 or 1, and the sum of na and nc and nd, the sum of nc and nb, the sum of np and nq, respectively, do not exceed 3;

Re, Rf, and Rr are independently selected from a C-1 to C-4 alkyl, PACb is a PAC component in the repeat unit having structure (VI) attached through a linking group Xd, wherein Xd is selected from the group consisting of, a direct valence bond, an alkylene moiety, an alkyleneoxy moiety, wherein the alkylene end is attached to the acetal oxygen moiety of the repeat unit of structure (VI), and the oxy end of the alkyleneoxy moiety is attached to the PACb moiety, and a moiety comprising an acetal selected from the group consisting of the following;

an alkyleneacetal moiety (-alkylene-O—CH(CH$_3$)—O—), an alkyleneoxyalkyleneacetal moiety (-alkylene-O-alkylene-O—CH(CH$_3$)—O—), and an alkylene(oligooxyalkylene)acetal, (-alkylene(-O-alkylene)$_x$-O—CH(CH$_3$)—O—), wherein x is 2 to 6, and further wherein, in each of said acetal comprising moiety, the alkylene end of this moiety is attached to the acetal oxygen moiety of the repeat unit of structure (VI), and the acetal portion of said moiety comprising an acetal is attached to the PACb moiety;

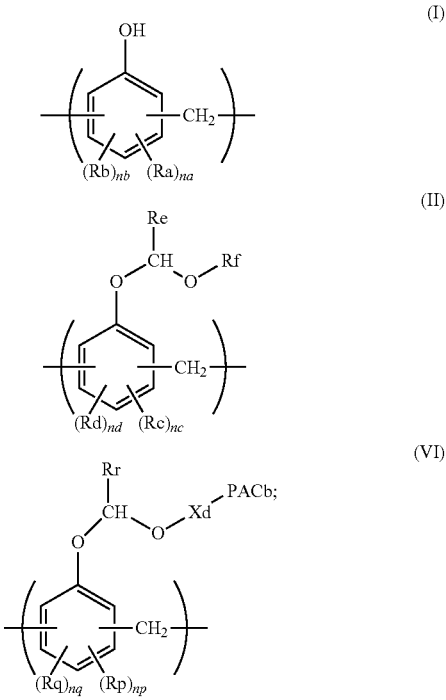

Polymer Component D comprising repeat units having structures (I), (III), (IV) and (VI), where structure (VI) is an acetal, comprising a moiety functionalized with a PAC moiety, protecting a repeat unit comprising a Novolak phenolic hydroxy moiety;

wherein the repeat units having structures (III) and (IV) are attached together through the positions designated by 〜〜〜, forming a di-functional acetal comprising moiety, forming a linking point in said polymer component between two different polymer chains in said polymer component, and further;

Ra, Rg, Rk and Rp are independently a C-1 to C-4 alkyl; Rb, Rh, Rl and Rq are independently a —X-Phenol, wherein X is —O—, —C(CH$_3$)$_2$—, —(C=O)— or —SO$_2$—, and na, ng, nk and np independently, are 0 to 3; nb, nh, nl and nq, independently are 0 or 1, and the sum of na and nb, the sum of nh and ng, the sum of nl and nk, and the sum of np and nq respectively, do not exceed 3;

Ri, Rm, and Rr are independently selected from a C-1 to C-4 alkyl,

Xa is an alkylene, an -alkyleneoxyalkylene- moiety, or an -alkylene(-O-alkylene)$_{x'}$- moiety wherein x' is 2 to 6; and further wherein;

PACb is a PAC component in the repeat unit having structure (VI) attached through a linking group Xd, wherein Xd is selected from the group consisting of, a direct valence bond, an alkylene moiety, an alkyleneoxy moiety, wherein the alkylene end is attached to the acetal oxygen moiety of the repeat unit of structure (VI), and the oxy end of the alkyleneoxy moiety is attached to the PACb moiety, and a moiety comprising an acetal selected from the group consisting of the following;

an alkyleneacetal moiety (-alkylene-O—CH(CH$_3$)—O—), an alkyleneoxyalkyleneacetal moiety (-alkylene-O-alkylene-O—CH(CH$_3$)—O—), and an alkylene(oligooxyalkylene)acetal, (-alkylene(-O-alkylene)$_x$-O—CH(CH$_3$)—O—), wherein x is 2 to 6, and further wherein, in each of said acetal comprising moiety, the alkylene end of this moiety is attached to the acetal oxygen moiety of the repeat unit of structure (VI), and the acetal portion of said moiety comprising an acetal is attached to the PACb moiety;

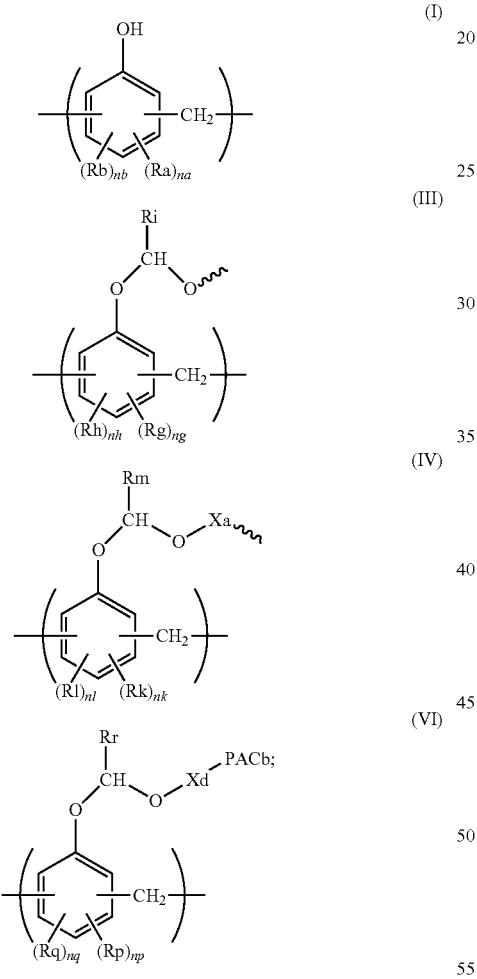

Polymer Component E comprising repeat units of structures (I), (III), (V) and (VI), where structure (VI) is an acetal, comprising a moiety functionalized with a PAC moiety, protecting a repeat unit comprising a Novolak phenolic hydroxy moiety;

wherein the repeat units having structures (III) and (V) are attached together through the positions designated by ∿∿∿, forming a di-functional acetal comprising moiety, forming a linking point in said polymer component between two different polymer chains in said polymer component, Ra, Rg, Rn and Rp are independently a C-1 to C-4 alkyl; Rb, Rh, Ro and Rq are independently a —X-Phenol, wherein X is —O—, —C(CH$_3$)$_2$—, —(C═O)— or —SO$_2$—, and na, ng, nn and np independently, are 0 to 3; nb, nh, no and nq, independently are 0 or 1, and the sum of na and nb, the sum of ng and nh, the sum of nn and no, and the sum of np and nq respectively, do not exceed 3;

Ri, Rr and Rm2 independently are selected from a C-1 to C-4 alkyl

Xb is —O—, —C(CH$_3$)$_2$—, —(C═O)— or —SO$_2$—;

Xc is an alkylene, an -alkyleneoxyalkylene- moiety, or an -alkylene(-O-alkylene)$_{x'}$- moiety wherein x' is 2 to 6; and further wherein repeat unit of structures (III) and (V) are attached together through the positions designated by ∿∿∿, forming a di-functional acetal comprising moiety, forming a linking point in said polymer component between two different polymer chains in said polymer component;

PACb is a PAC component in the repeat unit having structure (VI) attached through a linking group Xd, wherein Xd is selected from the group consisting of the following;

a direct valence bond, an alkylene moiety, an alkyleneoxy moiety, wherein the alkylene end is attached to the acetal oxygen moiety of the repeat unit of structure (VI), and the oxy end of the alkyleneoxy moiety is attached to the PACb moiety, and a moiety comprising an acetal selected from the group consisting of the following;

an alkyleneacetal moiety (-alkylene-O—CH(CH$_3$)—O—), an alkyleneoxyalkyleneacetal moiety (-alkylene-O-alkylene-O—CH(CH$_3$)—O—), and an alkylene(oligooxyalkylene)acetal, (-alkylene(-O-alkylene)$_x$-O—CH(CH$_3$)—O—), wherein x is 2 to 6, and further wherein, in each of said acetal comprising moiety, the alkylene end of this moiety is attached to the acetal oxygen moiety of the repeat unit of structure (VI), and the acetal portion of said moiety comprising an acetal is attached to the PACb moiety;

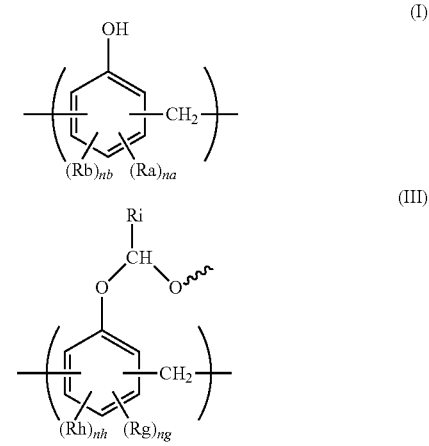

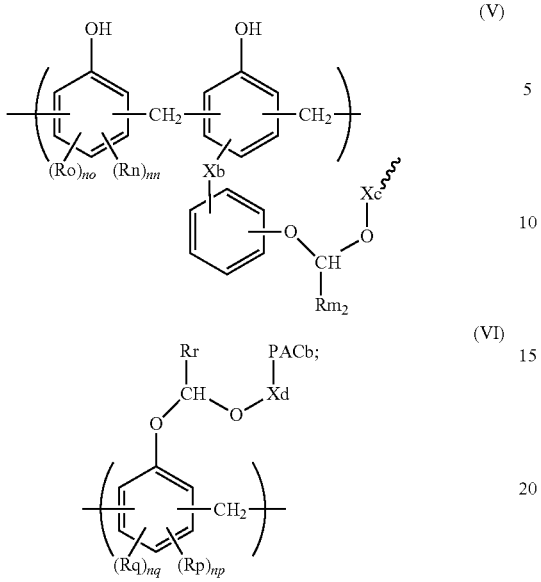

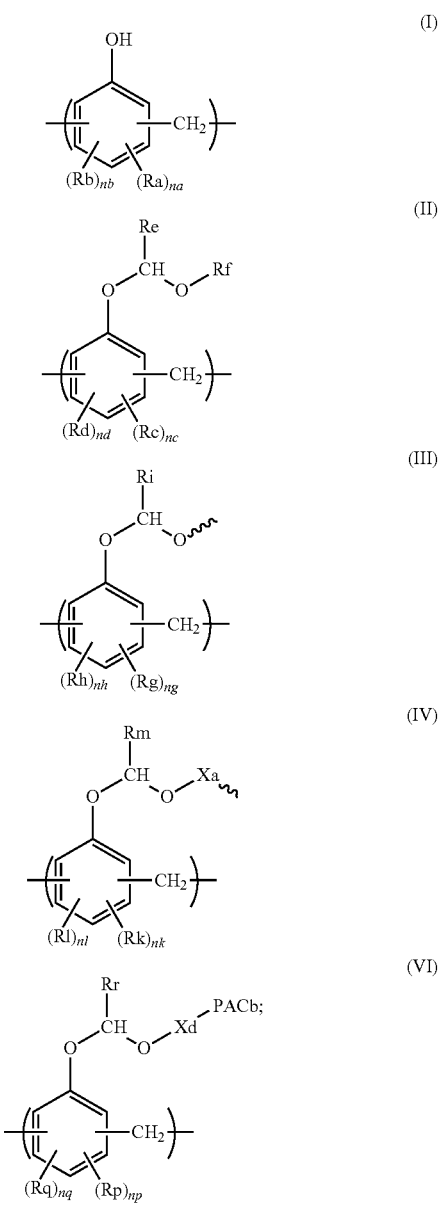

Polymer Component H comprising the repeat unit of structure (I), Structure (II), Structure (III), Structure (IV) and structure (VI) where structure (VI) is an acetal, comprising a moiety functionalized with a PAC moiety, protecting a repeat unit comprising a Novolak phenolic hydroxy moiety;

wherein the repeat units having structures (III) and (IV) are attached together through the positions designated by ⌇⌇⌇, forming a di-functional acetal comprising moiety, forming a linking point in said polymer component between two different polymer chains in said polymer component, and further;

Re and Rf are independently selected from a C-1 to C-4 alkyl

Ra, Rc, Rg, Rk and Rp are independently a C-1 to C-4 alkyl; Rb, Rd, Rh, Rl and Rq are independently a —X-Phenol, wherein X is —O—, —C(CH$_3$)$_2$—, —(C═O)— or —SO$_2$—, and na, nc, ng, nk and np independently, are 0 to 3; nb, nd, nh, nl and nq, independently are 0 or 1, and the sum of na and nb, the sum of nh and ng, the sum of nl and nk, and the sum of np and nq respectively, do not exceed 3;

Ri, Rm, and Rr are independently selected from a C-1 to C-4 alkyl,

Xa is an alkylene, an -alkyleneoxyalkylene- moiety, or an -alkylene(-O-alkylene)$_{x'}$- moiety wherein x' is 2 to 6; and further wherein;

PACb is a PAC component in the repeat unit having structure (VI) attached through a linking group Xd, wherein Xd is selected from the group consisting of, a direct valence bond,
an alkylene moiety,
an alkyleneoxy moiety, wherein the alkylene end is attached to the acetal oxygen moiety of the repeat unit of structure (VI), and the oxy end of the alkyleneoxy moiety is attached to the PACb moiety, and
a moiety comprising an acetal selected from the group consisting of the following;
an alkyleneacetal moiety (-alkylene-O—CH(CH$_3$)—O—),
an alkyleneoxyalkyleneacetal moiety (-alkylene-O-alkylene-O—CH(CH$_3$)—O—), and
an alkylene(oligooxyalkylene)acetal, (-alkylene(-O-alkylene)$_x$-O—CH(CH$_3$)—O—),
wherein x is 2 to 6, and further wherein, in each of said acetal comprising moiety,
the alkylene end of this moiety is attached to the acetal oxygen moiety of the repeat unit of structure (VI), and the acetal portion of said moiety comprising an acetal is attached to the PACb moiety;

and further wherein, said photoactive diazonaphthoquinone compound (PAC) component, is either said acetal comprising moiety functionalized with a PAC moiety protecting a repeat unit comprising a Novolak phenolic hydroxy moiety of structure (VI) present in said polymer component Polymer Component C Polymer Component D Polymer Component E Polymer Component H as sole PAC component, or is in combination with a free PAC component.

2. The composition of claim 1, wherein said polymer component is Polymer Component C.

3. The composition of claim 1, wherein said polymer component is Polymer Component D.

4. The composition of claim 1, wherein in Polymer Component C; the repeat unit having structure (I) is present from about 60 mole % to about 98 mole %; the repeat unit having structure (II) is present up to about 40 mole %; and further wherein, the repeat unit having structure (II) and repeat unit having structure (VI) do not exceed about 45 mole % of the repeat units in said polymer component.

5. The composition of claim 1, wherein in Polymer Component D the repeat unit having structure (I) is present from about 60 mole % to about 98 mole %, and further wherein, the linking point between two polymer chains of the polymer components, formed by the repeat units of structure (III) and structure (IV) is present up to about 25 mole % of the polymer component's repeat units and further wherein the repeat unit having structure (VI) is present up to about 20 mole %.

6. The composition of claim 1, wherein in Polymer Component E the repeat unit having structure (I) is present from about 60 mole % to about 98 mole %, and further wherein, the linking point between two polymer chains of the polymer components, formed by the repeat units of structure (III) and structure (V) is present up to about 25 mole % of the polymer component's repeat units and further wherein the repeat unit having structure (VI) is present up to about 20 mole %.

7. The composition of claim 1, wherein in Polymer Component C repeat unit of structure (VI) is present up to about 20 mole % of the repeat units in said polymer.

8. The composition of claim 1, wherein said polymer component is Polymer Component E.

9. The composition of claim 1, wherein, wherein said heterocyclic thiol component is present and is selected from mono or di thiol derivatives of an unsaturated heterocyclic compound comprising nitrogen, sulfur or a combination of these two atoms, as the heteroatoms in the heterocyclic compound.

10. The composition of claim 1, wherein said base component is selected from an amine compound or a mixture of amine compounds having a boiling point above 100° C., at atmospheric pressure, and a $pK_a$ of at least 1.

11. A process for imaging a resist comprising the steps;
i) coating the composition of claim 1 on a substrate to form a resist film;
ii) selectively exposing said resist film to UV light using a mask to form a selectively exposed resist film;
iii) developing said selectively exposed film to form a positively imaged resist film over said substrate.

12. A process for imaging a resist comprising the steps;
ia) coating the composition of claim 1 on a substrate to form a resist film;
iia) selectively exposing said resist film to UV light using a mask to form a selectively exposed resist film;
iiia) baking said selectively exposed resist film to form a baked selectively exposed resist film;
iva) developing said selectively exposed and baked resist film to form a positively imaged resist film over said substrate.

13. The composition of claim 1 wherein in Polymer Component D the repeat unit of structure (VI) is present up to about 20 mole % of the repeat units in said polymer.

14. The composition of claim 1 wherein in Polymer Component E the repeat unit of structure (VI) is present up to about 20 mole % of the repeat units in said polymer.

15. The composition of claim 1, wherein said polymer component is Polymer Component H.

16. The composition of claim 1, wherein in Polymer Component H where the repeat unit of structure (II), is present up to about up to 40 mole %.

17. The composition of claim 15, wherein the repeat unit having structure (I) is present from about 60 mole % to about 98 mole %, and further wherein, the linking point between two polymer chains of the polymer components, formed by the repeat units of structure (III) and structure (IV) is present up to about 25 mole % of the polymer component's repeat units and further wherein the repeat unit having structure (VI) is present up to about 20 mole %.

* * * * *